US011682581B2

(12) United States Patent
Thong et al.

(10) Patent No.: US 11,682,581 B2
(45) Date of Patent: Jun. 20, 2023

(54) MEMORY DEVICE INCLUDING SELF-ALIGNED CONDUCTIVE CONTACTS

(71) Applicant: Micron Technology, Inc., Boise, ID (US)

(72) Inventors: Kar Wui Thong, Boise, ID (US); Harsh Narendrakumar Jain, Boise, ID (US); John Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/127,823

(22) Filed: Dec. 18, 2020

(65) Prior Publication Data

US 2022/0199467 A1 Jun. 23, 2022

(51) Int. Cl.

| | |
|---|---|
| ***H01L 21/768*** | (2006.01) |
| ***H01L 23/522*** | (2006.01) |
| ***H01L 23/528*** | (2006.01) |
| ***H01L 23/535*** | (2006.01) |
| ***H10B 43/27*** | (2023.01) |
| ***H10B 41/27*** | (2023.01) |
| ***H01L 27/11582*** | (2017.01) |
| ***H01L 27/11556*** | (2017.01) |

(52) U.S. Cl.

CPC .. *H01L 21/76897* (2013.01); *H01L 21/76805* (2013.01); *H01L 21/76831* (2013.01); *H01L 21/76895* (2013.01); *H01L 23/5226* (2013.01); *H01L 23/5283* (2013.01); *H01L 23/535* (2013.01); *H01L 27/11556* (2013.01); *H01L 27/11582* (2013.01)

(58) Field of Classification Search

CPC ......... H01L 21/76897; H01L 21/76805; H01L 21/76831; H01L 21/76895; H01L 23/5226; H01L 23/5283; H01L 23/535; H01L 27/11556; H01L 27/11582

See application file for complete search history.

(56) References Cited

U.S. PATENT DOCUMENTS 9,564,587 B1 * 2/2017 Jo ......................... H01L 27/249
9,741,733 B2 * 8/2017 Lim .................. H01L 27/11582

(Continued)

*Primary Examiner* — Shahed Ahmed
*Assistant Examiner* — Vicki B. Booker
(74) *Attorney, Agent, or Firm* — Schwegman Lundberg & Woessner, P.A.

(57) ABSTRACT

Some embodiments include apparatuses and methods of forming the apparatuses. One of the apparatuses includes levels of conductive materials interleaved with levels of dielectric materials; memory cell strings including respective pillars extending through the levels of conductive materials and the levels of dielectric materials; a dielectric structure formed in a slit, the slit extending through the levels of conductive materials and the levels of dielectric materials, the dielectric structure separating the levels of conductive materials and the levels of dielectric materials into a first portion and a second portion; first conductive structures located over and coupled to respective pillars of the first memory cell strings; second conductive structures located over and coupled to respective pillars of the second memory cell strings; and a conductive line contacting the dielectric structure, a conductive structure of the first conductive structures, and a conductive structure of the second conductive structures.

11 Claims, 56 Drawing Sheets

(56) References Cited

U.S. PATENT DOCUMENTS

| | | | | |
|---|---|---|---|---|
| 2010/0133598 | A1* | 6/2010 | Chae | H01L 27/11551 257/314 |
| 2018/0261616 | A1* | 9/2018 | Cho | H01L 27/11578 |
| 2019/0005996 | A1* | 1/2019 | Larsen | G06F 3/0668 |
| 2020/0066752 | A1* | 2/2020 | Lee | G11C 11/419 |

* cited by examiner

100

200

200

200

200

700

700

700

700

700

700

700

700

700

700

700

700

700

700

700

700

700

700

700

700

700

700

700

700

700

700

700

700

700

700

700

700

700

700

700

700

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

3200

MEMORY DEVICE INCLUDING SELF-ALIGNED CONDUCTIVE CONTACTS

TECHNICAL FIELD

Embodiments described herein relate to memory devices including conductive structures coupled between data lines and pillars of memory cell strings of the memory device.

BACKGROUND

Memory devices are widely used in computers and many other electronic items. A memory device usually has numerous memory cells used to store information (e.g., data) and data lines to carry information (in the form of electrical signals) to and from the memory cells. During fabrication of the memory device, the memory cells are often divided into physical blocks. In some conventional processes of forming the memory device, the blocks in the memory device are susceptible to block bending error where the structures of the blocks may bend. The block bending error can cause misalignment between some conductive elements of the memory device. Moderate block bending error can result in poor electrical connections between such conductive elements. Severe block bending error can lead to failures in some electric connections in the memory device.

BRIEF DESCRIPTION OF THE DRAWINGS

FIG. 7A, FIG. 7B, and FIG. 7C through FIG. 31A, FIG. 31B, and FIG. 31C show different views of elements during processes of forming a memory device, according to some embodiments described herein.

FIG. 32A, FIG. 32B, FIG. 32C through FIG. 55A, FIG. 55B, and FIG. 55C show different views of elements during processes of forming another memory device, according to some embodiments described herein.

DETAILED DESCRIPTION

The techniques described herein involve conductive structures and staircase structures of a memory device. The conductive structures include conductive contacts that can be part of conductive paths between data lines (e.g., bit lines) and pillars (memory cell pillars) of the memory device. The staircase structures can be formed to couple to conductive contacts that carry control signals (e.g., word line signals) to control gates (e.g., word lines) of the memory device. The described techniques include processes of forming the memory device, such that physical connections between conductive contacts associated with conductive structures and staircase structures of the memory device can be reliably formed despite potential occurrence of block bending error. Thus, reliability of the memory described device can be maintained or improved. Improved yield may also be achieved. Improvements and benefits of the techniques described herein are further discussed below with reference to FIG. 1 through FIG. 55C.

Figure 1:
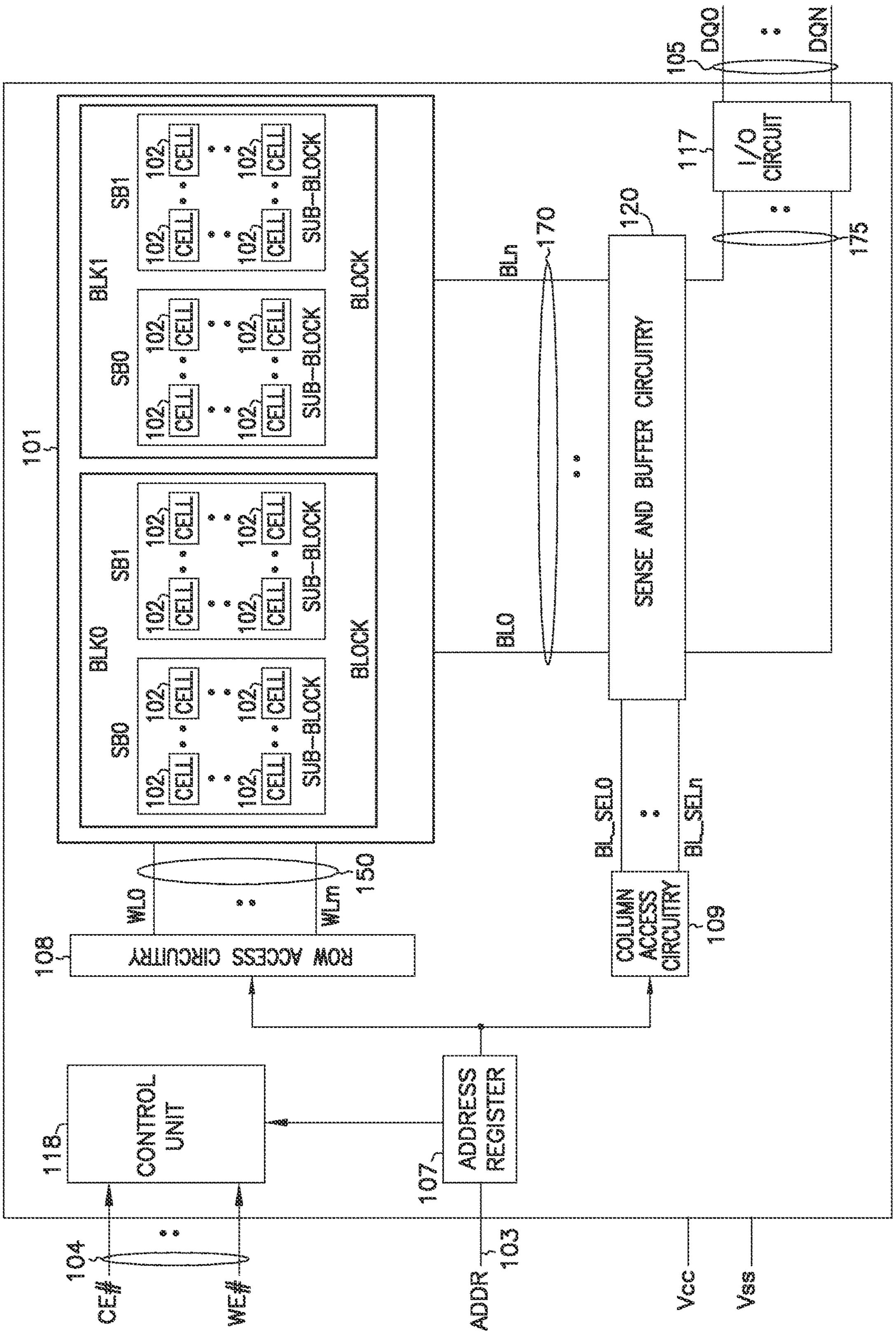
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 and BLK1. Each of blocks BLK0 and BLK1 can include its own sub-blocks, such as sub-blocks SB0 and SB1. In the physical structure of memory device 100, memory cells 102 can be arranged vertically (e.g., stacked over each other) over a substrate (e.g., a semiconductor substrate) of memory device 100. FIG. 1 shows memory device 100 having two blocks BLK0 and BLK1 and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 and BLK1 and data lines 170 to selectively exchange information (e.g., data) with memory cells 102 of blocks BLK0 and BLK1. Blocks BLK0 can have access lines (e.g., word lines) that are electrically separated from access lines (e.g., word lines) of block BLK1. Sub-blocks of the same block can share access lines (e.g., can share word lines) and can be controlled by the same access lines. For example, sub-blocks SB0 and SB1 of block BLK0 can share a group of access lines associated with block BLK0, and sub-blocks SB0 and SB1 of block BLK1 can share another group of access lines associated with block BLK1.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks BLK0 and BLK1 are to be accessed during a memory operation. Memory device 100 can perform a read operation to read (e.g., sense) information (e.g., previously stored information) from memory cells 102 of blocks BLK0 and BLK1, or a write (e.g., programming) operation to store (e.g., program) information in memory cells 102 of blocks BLK0 and BLK1. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 and BLK1.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 and BLK1 and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 and BLK1 (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 and BLK1 and lines (e.g., I/O lines) 105. Signals DQ0 through DQN on lines 105 can represent information read from or stored in memory cells 102 of blocks BLK0 and BLK1. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 55A.

Figure 2:
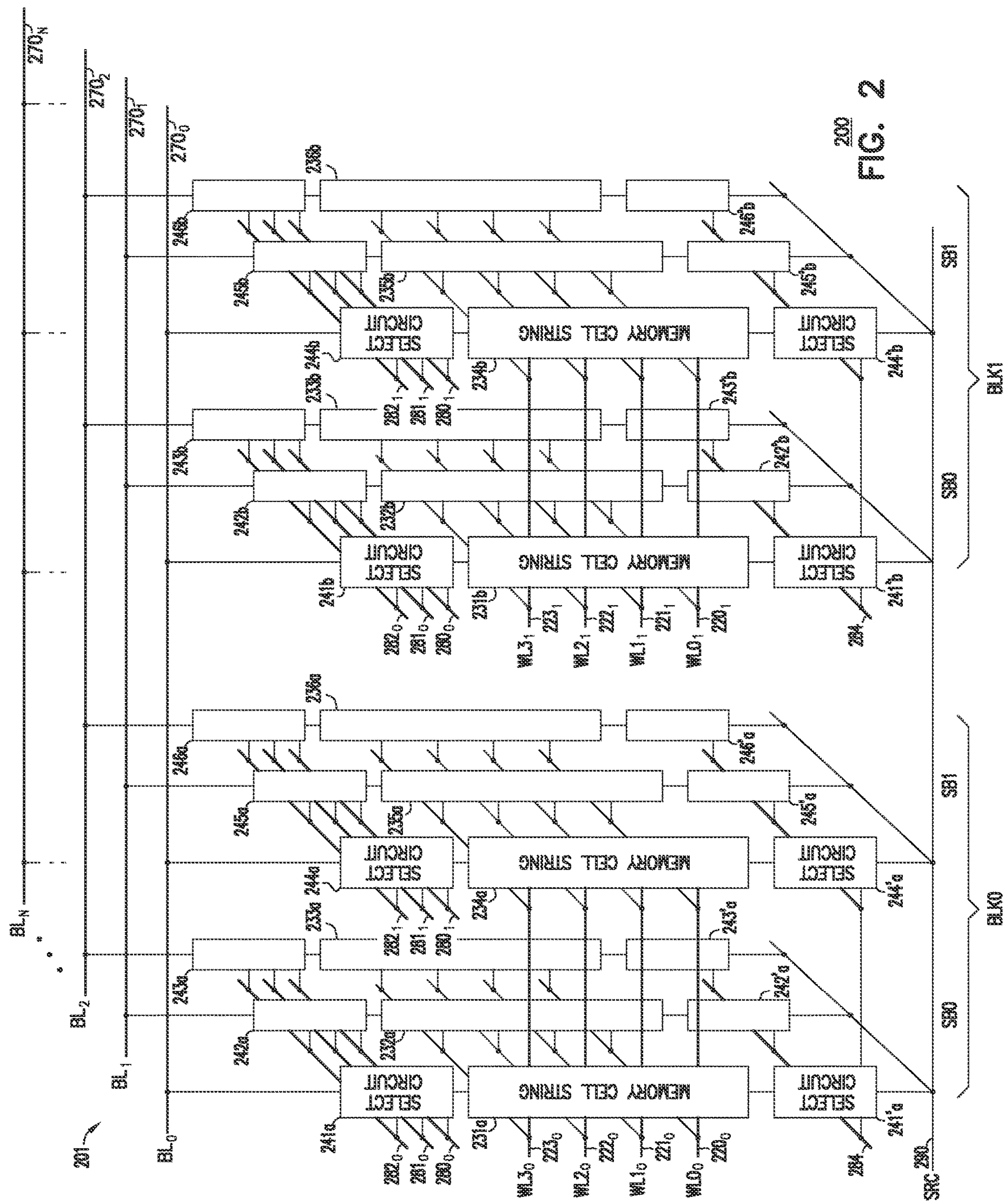
FIG. 2 shows a general schematic diagram of a portion of a memory device including a memory array having memory cell strings and associated select circuits, according to some embodiments described herein.

FIG. 2 shows a general schematic diagram of a portion of a memory device 200 including a memory array 201 having memory cell strings and associated select circuits, according to some embodiments described herein. Memory device 200 can correspond to memory device 100 of FIG. 1. For example, memory array 201 can form part of memory array 101 of FIG. 1.

As shown in FIG. 2, memory device 200 can include blocks (blocks of memory cells) BLK0 and BLK1. Two blocks are shown as an example. Memory device 200 can include many blocks (e.g., up to thousands or more blocks). In the physical structure of memory device 200, the blocks can be arranged (e.g., formed) one block next to another block, such that each block can have a neighboring block. Neighboring blocks are blocks located immediately next to (e.g., adjacent) each other. For example, in the physical structure of memory device 200, blocks BLK0 and BLK1 can be neighboring blocks.

Each of blocks BLK0 and BLK1 of memory device 200 can include (e.g., can be divided into) sub-blocks. For example, each of blocks BLK0 and BLK1 can include sub-blocks SB0 and SB1. Blocks BLK0 and BLK1 can include the same number of sub-blocks. FIG. 2 shows an example where each of blocks BLK0 and BLK1 can include two sub-blocks (e.g., SB0 and SB1). However, each of blocks BLK0 and BLK1 can have more than two blocks (e.g., four sub-blocks SB0, SB1, SB2, and SB3 or more than four sub-blocks).

As shown in FIG. 2, each sub-block (e.g., SB0 or SB1) has its own memory cell strings that can be associated with (e.g., coupled to) respective select circuits. For example, sub-block SB0 of block BLK0 has memory cell strings 231*a*, 232*a*, and 233*a* and associated select circuits (e.g., drain select circuits) 241*a*, 242*a*, and 243*a*, respectively, and select circuits (e.g., source select circuits) 241'*a*, 242'*a*, and 243'*a*, respectively. In another example, sub-block SB1 of block BLK0 has memory cell strings 234*a*, 235*a*, and 236*a* and associated select circuits (e.g., drain select circuits) 244*a*, 245*a*, and 246*a*, respectively, and select circuits (e.g., source select circuits) 244'*a*, 245'*a*, and 246'*a*, respectively.

Similarly, sub-block SB0 of block BLK1 has memory cell strings 231*b*, 232*b*, and 233*b*, and associated select circuits (e.g., drain select circuits) 241*b*, 242*b*, and 243*b*, respectively, and select circuits (e.g., source select circuits) 241'*b*, 242'*b*, and 243'*b*, respectively. Sub-block SB1 of block BLK1 has memory cell strings 234*b*, 235*b*, and 236*b*, and associated select circuits (e.g., drain select circuits) 244*b*, 245*b*, and 246*b*, respectively, and select circuits (e.g., source select circuits) 244'*b*, 245'*b*, and 246'*b*, respectively. The sub-blocks of the blocks (e.g., blocks BLK0 and BLK1) of memory device 200 can have the same number of memory cell strings and associated select circuits.

FIG. 2 shows an example of three memory cell strings and their associated circuits in a sub-block (e.g., in sub-block SB0). The number of memory cell strings and their associated select circuits in each the sub-block of blocks BLK0 and BLK1 can vary. Each of the memory cell strings of memory device 200 can include series-connected memory cells (shown in detail in FIG. 3 and FIG. 4A) and a pillar (e.g., pillar 450 in FIG. 4A) where the series-connected memory cells can be located (e.g., vertically located) along respective portion of the pillar.

As shown in FIG. 2, memory device 200 can include data lines $270_0$ through $270_N$ that carry signals $BL_0$ through $BL_N$, respectively. Each of data lines $270_0$ through $270_N$ can be structured as a conductive line that can includes conductive materials (e.g., conductively doped polycrystalline silicon (doped polysilicon), metals, or other conductive materials).

The memory cell strings of blocks BLK0 and BLK1 can share data lines $270_0$ through $270_N$ to carry information (in the form of signals) read from or to be stored in memory cells of selected memory cells (e.g., selected memory cells in block BLK0 or BLK1) of memory device 200. For example, memory cell strings 231*a*, 234*a* (of block BK0), 231*b* and 234*b* (of block BLK1) can share data line $270_0$. Memory cell strings 232*a*, 235*a* (of block BK0), 232*b* and 235*b* (of block BK1) can share data line $270_1$. Memory cell strings 233*a*, 236 (of block BK0), 233*b* and 236*b* (of block BK1) can share data line $270_2$.

Memory device 200 can include a source (e.g., a source line, a source plate, or a source region) 290 that can carry a signal (e.g., a source line signal) SRC. Source 290 can be structured as a conductive line or a conductive plate (e.g., conductive region) of memory device 200. Source 290 can be common source (e.g., common source plate or common source region) of blocks BLK0 and BLK1. Alternatively, each of blocks BLK0 and BLK1 can have its own source similar to source 290. Source 290 can be coupled to a ground connection of memory device 200.

Memory device 200 can include control gates (e.g., word lines) $220_0$, $221_0$, $222_0$, and $223_0$ in block BLK0 that can be part of access lines of memory device 200 (that can correspond to part of access lines 150 of memory device 100 of FIG. 1). Memory device 200 can include control gates (e.g., word lines) $220_1$, $221_1$, $222_1$, and $223_1$ in block BLK1 that can be part of other access lines of memory device 200 (that can correspond to part of access lines 150 of memory device 100 of FIG. 1). Control gates $220_0$, $221_0$, $222_0$, and $223_0$ can be electrically separated from each other. Control gates $220_1$, $221_1$, $222_1$, and $223_1$ can be electrically separated from each other. Control gates $220_0$, $221_0$, $222_0$, and $223_0$ can be electrically separated from control gates $220_1$, $221_1$, $222_1$, and $223_1$. Thus, blocks BLK0 and BLK1 can be accessed separately (e.g., accessed one at a time). For example, block BLK0 can be accessed at one time using control gates $220_0$, $221_0$, $222_0$, and $223_0$, and block BLK1 can be accessed at another time using control gates $220_1$, $221_1$, $222_1$, and $223_1$ at another time.

Memory device 200 can have the same number of control gates among the blocks (e.g., blocks BLK0 and BLK1) of memory device 200. In the example of FIG. 2, memory device 200 has four control gates in each of blocks BLK0 and BLK1. FIG. 2 shows memory device 200 including four control gates in blocks BLK0 and BLK1 as an example. The number of control gates in the blocks (e.g., blocks BLK0 and BLK1) of memory device 200 can be different from four. For example, each of blocks BLK0 and BLK1 can include hundreds of control gates.

Each of control gates $220_0$, $221_0$, $222_0$, and $223_0$ can be part of a structure (e.g., a level) of a conductive material (e.g., a layer of conductive material) located in a level of memory device 200. Control gates $220_0$, $221_0$, $222_0$, and $223_0$ can carry corresponding signals (e.g., word line signals) WL$0_0$, WL$1_0$, WL$2_0$, and WL$3_0$. Memory device 200 can use signals WL$0_0$, WL$1_0$, WL$2_0$, and WL$3_0$ to selectively control access to memory cells of block BLK0 during an operation (e.g., read, write, or erase operation). For example, during a read operation, memory device 200 can use signals WL$0_0$, WL$1_0$, WL$2_0$, and WL$3_0$ to control access to selected memory cells of block BLK0 to read (e.g., sense) information (e.g., previously stored information) from the memory cells of block BLK0. In another example, during a write operation, memory device 200 can use signals WL$0_0$, WL$1_0$, WL$2_0$, and WL$3_0$ to control access to selected memory cells of block BLK0 to store information in the selected memory cell of block BLK0.

Each of control gates $220_1$, $221_1$, $222_1$, and $223_1$ can be part of a structure (e.g., a level) of a conductive material (e.g., a layer of conductive material) located in a level of memory device 200. Control gates $220_1$, $221_1$, $222_1$, and $223_1$ can carry corresponding signals (e.g., word line signals) WL$0_0$, WL$1_0$, WL$2_0$, and WL$3_0$. Memory device 200 can use signals WL$0_1$, WL$1_1$, WL$2_1$, and WL$3_1$ to selectively control access to memory cells of block BLK0 during an operation (e.g., read, write, or erase operation). For example, during a read operation, memory device 200 can use signals WL$0_1$, WL$1_1$, WL$2_1$, and WL$3_1$ to control access to selected memory cells of block BLK1 to read (e.g., sense) information (e.g., previously stored information) from the memory cells of block BLK1. In another example, during a write operation, memory device 200 can use signals WL$0_1$, WL$1_1$, WL$2_1$, and WL$3_1$ to control access to selected memory cells of block BLK1 to store information in the selected memory cell of block BLK1.

As shown in FIG. 2, in sub-block SB0 of block BLK0, memory device 200 includes select lines (e.g., drain select lines) $280_0$, $281_0$, and $282_0$ that can be shared by select circuits 241*a*, 242*a*, and 243*a*. In sub-block SB1 of block BLK0, memory device 200 includes select lines (e.g., drain select lines) $280_1$, $281_1$, and $282_1$ that can be shared by select circuits 244*a*, 245*a*, and 246*a*. Block BLK0 can include a select line (e.g., source select line) 284 that can be shared by select circuits 241'*a*, 242'*a*, 243'*a*, 244'*a*, 245'*a*, and 246'*a*.

In sub-block SB0 of block BLK1, memory device 200 includes select lines (e.g., drain select lines) $280_0$, $281_0$, and $282_0$ that can be shared by select circuits 241*b*, 242*b*, and 243*b*. Select lines $280_0$, $281_0$, and $282_0$ of block BLK0 are electrically separated from select lines $280_0$, $281_0$, and $282_0$ of block BLK1. In sub-block SB1 of block BLK1, memory device 200 includes select lines (e.g., drain select lines) $280_1$, $281_1$, and $282_1$ that can be shared by select circuits 244*b*. 245*b*, and 246*b*. Select lines $280_1$, $281_1$, and $282_1$ of block BLK1 are electrically separated from select lines $280_1$, $281_1$, and $282_1$ of block BLK0. Block BLK1 can include a select line (e.g., source select line) 284 that can be shared by select circuits 241'*b*. 242'*b*, 243'*b*, 244'*b*, 245'*b*, and 246'*b*.

FIG. 2 shows an example where memory device 200 includes three drain select lines (e.g., select lines $\mathbf{280}_0$, $\mathbf{281}_0$, and $\mathbf{282}_0$) associated with a drain select circuit (e.g., select circuits 241*a*, 242*a*, or 243*a*) in a sub-block (e.g., sub-block SB0 of block BLK0). However, memory device 200 can include fewer or more than three drain select lines associated with a drain select circuit.

FIG. 2 shows an example where memory device 200 includes one source select line (e.g., select line 284) associated with a source select circuit (e.g., select circuits 241'*a*, 242'*a*, or 243'*a*) in a sub-block (e.g., sub-block SB0 of block BLK0). However, memory device 200 can include more than one source select line associated with a source select circuit.

Each of the drain select circuits of memory device 200 can include multiple drain select gates connected in series (e.g., three transistors connected in series, shown in FIG. 3) between a respective data line and a respective memory cell string. The drain select gates can be controlled (e.g., turned on or turned off) by respective drain select lines based on voltages provided to the signals on the respective drain select lines.

Each of the source select circuits of memory device 200 can include a select gate (shown in FIG. 3) coupled between source 290 and a respective memory cell string. The source select gate can be controlled (e.g., turned on or turned off) by the source select line based on a voltage provided to the signals on the source select line.

In FIG. 2, each of the memory cell strings of memory device 200 has memory cells (shown in FIG. 3) arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gates (e.g., transistors) in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can electrically connect (e.g., form a current path from) a selected memory cell string associated with that particular select circuit to a respective data line (e.g., one of data lines $\mathbf{270}_0$ through $\mathbf{270}_N$). When a particular source select circuit is activated, it can electrically connect (e.g., form a current path from) a selected memory cell string associated with that particular select circuit to source 290.

Figure 3:
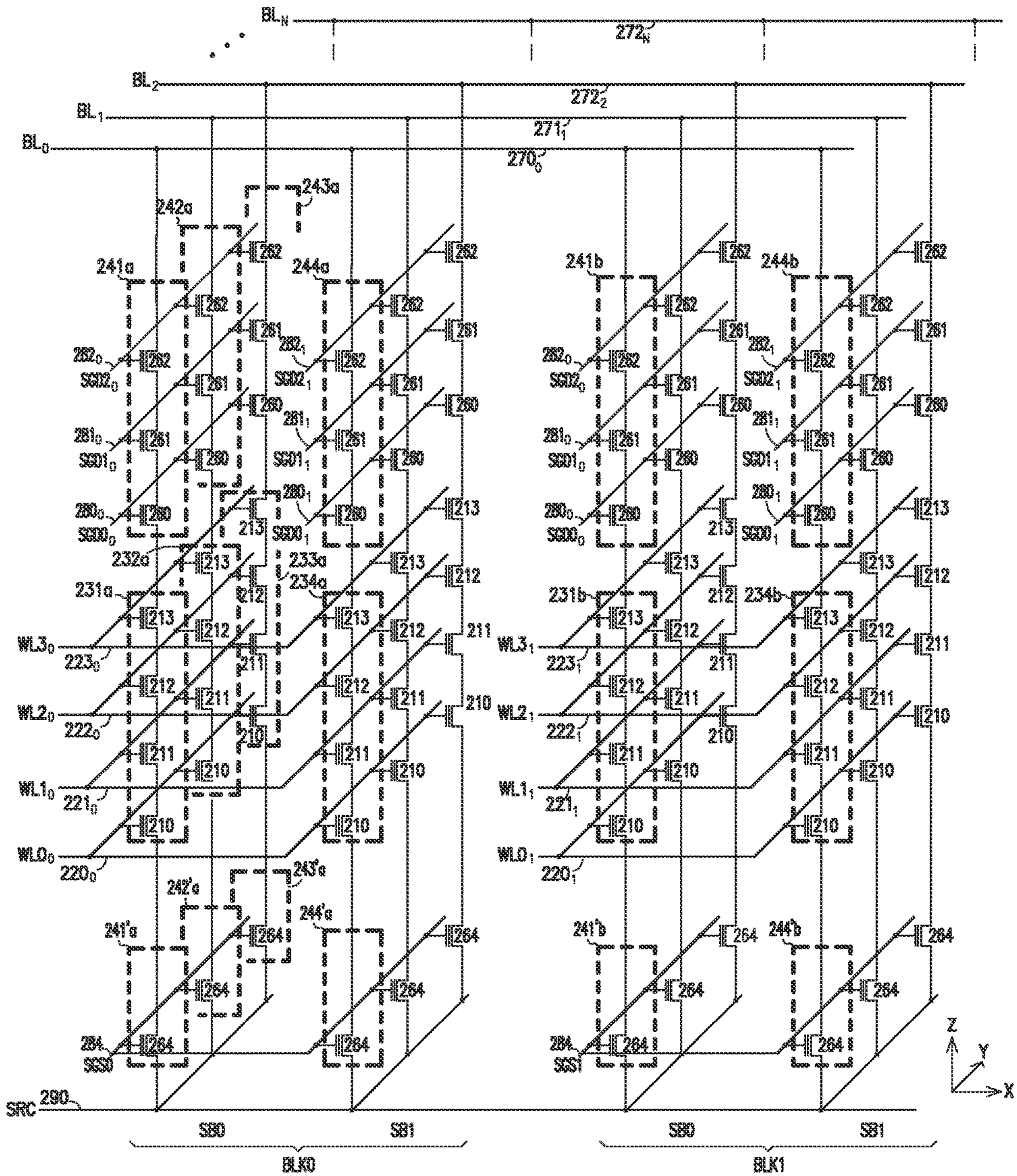
FIG. 3 shows a detailed schematic diagram of the memory device of FIG. 2, according to some embodiments described herein.

FIG. 3 shows a detailed schematic diagram of memory device 200 of FIG. 2, according to some embodiments described herein. For simplicity, only some of the memory cell strings and some of the select circuits of memory device 200 of FIG. 2 are labeled in FIG. 3. Directions X, Y, and Z in FIG. 3 can be relative to the physical directions (e.g., dimensions) of the structure of memory device 200. For example, the Z-direction can be a direction perpendicular to (e.g., vertical direction with respect to) a substrate of memory device 200 (e.g., a substrate 499 shown in FIG. 4A). The Z-direction is perpendicular to the X-direction and Y-direction (e.g., the Z-direction is perpendicular to an X-Y plane of memory device 200).

As shown in FIG. 3, each select line can carry an associated select signal. For example, in sub-block SB0 of block BLK0, select lines (e.g., drain select lines) $\mathbf{280}_0$, $\mathbf{281}_0$, and $\mathbf{282}_0$ can carry associated signals (e.g., drain select-gate signals) SGD$\mathbf{0}_0$, SGD$\mathbf{1}_0$, and SGD$\mathbf{2}_0$, respectively. In sub-block SB1 of block BLK0, select lines (e.g., drain select lines) $\mathbf{280}_1$, $\mathbf{281}_1$, and $\mathbf{282}_1$, and $\mathbf{283}_1$ can carry associated signals SGD$\mathbf{0}_1$, SGD$\mathbf{1}_1$, and SGD$\mathbf{2}_1$, respectively. Sub-blocks SB0 and SB1 of block BLK0 can share select line 284 and associated signal (e.g., source select-gate signal) SGS0 of block BLK0.

In sub-block SB0 of block BLK1, select lines (e.g., drain select lines) $\mathbf{280}_0$, $\mathbf{281}_0$, and $\mathbf{282}_0$ can carry associated signals SGD$\mathbf{0}_0$, SGD$\mathbf{1}_0$, and SGD$\mathbf{2}_0$, respectively. In sub-block SB1 of block BLK1, select lines (e.g., drain select lines) $\mathbf{280}_1$, $\mathbf{281}_1$, and $\mathbf{282}_1$ can carry associated signals SGD$\mathbf{0}_1$, SGD$\mathbf{0}_1$, and SGD$\mathbf{2}_1$, respectively. Sub-blocks SB0 and SB1 of block BLK1 can share select line 284 and associated signal (e.g., source select-gate signal) SGS1 of block BLK1.

As shown in FIG. 3, the drain select lines within a sub-block (e.g., select lines $\mathbf{280}_0$, $\mathbf{281}_0$, and $\mathbf{282}_0$ in sub-block SB0 of block BLK0) can be electrically separated from each other and can be associated with separate drain select-gate signals (e.g., signals SGD$\mathbf{0}_0$, SGD$\mathbf{1}_0$, and SGD$\mathbf{2}_0$). Alternatively, the drain select lines within a sub-block (e.g., select lines $\mathbf{280}_0$, $\mathbf{281}_0$, and $\mathbf{282}_0$ in sub-block SB0 of block BLK0) can be electrically coupled together and can be associated with the same signal drain select-gate signal (e.g., a single SGD signal, not shown).

As shown in FIG. 3, memory device 200 can include memory cells 210, 211, 212, and 213; select gates (e.g., drain select gates or transistors) 260, 261, and 262; and a select gate (e.g., a source select gate) 264 that can be physically arranged in three dimensions (3D), such as X, Y, and Z directions (e.g., dimensions), with respect to the structure (shown in FIG. 4A) of memory device 200.

In FIG. 3, each of the memory cell strings (e.g., memory cell strings 231*a*, 232*a*, 233*a*, 234*a*, 231*b*, and 234*b*) of memory device 200 can include one of memory cells 210, one of memory cells 211, one of memory cells 212, and one of memory cells 213. FIG. 3 shows an example of four memory cells 210, 211, 212, and 213 in each memory cell string. The number of memory cells in each memory cell string can vary.

As shown in FIG. 3, each of select circuits (e.g., drain select circuits) 241*a*, 242*a*, 243*a*, 244*a*, 241*b*, and 244*b* can include three select gates: one of select gates 260, one of select gates 261, and one of select gates 262. FIG. 3 shows an example where memory device 200 includes three drain select gates (e.g., select gates 260, 261, and 262) in each drain select circuit. However, memory device 200 can include fewer or more than three drain select gates in each drain select circuit, depending on the number of drain select lines associated with each drain select circuit. The number of drain select gates (e.g., three in the example of in FIG. 3) in each drain select circuit can be equal to the number of drain select lines (e.g., three in the example of in FIG. 3) associated with each drain select circuit.

Each of select circuits (e.g., source select circuits) 241'*a*, 242'*a*, 243'*a*, 244'*a*, 241'*b*, and 244'*b* can include a select gate 264. FIG. 3 shows an example where memory device 200 includes one source select gate (e.g., select gate 264) in each source select circuit. However, memory device 200 can include more than one source select gates in each source select circuit, depending on the number of source select lines associated with each source select circuit. The number of source select gates (e.g., one in the example of in FIG. 3) in each source select circuit can be equal to the number of source select lines (e.g., one in the example of in FIG. 3) associated with each source select circuit.

Each of select gates 260, 261, 262, and 264 can operate as a transistor. For example, select gate 260 of select circuit 241*a* can operate as a field effect transistor (FET), such as a metal-oxide semiconductor FET (MOSFET). An example of such a MOSFET include an n-channel MOS (NMOS) transistor.

As shown in FIG. 3, a select line shared among particular select circuits can be shared by respective select gates of those particular select circuits. For example, select line $\mathbf{280}_0$ of sub-block SB0 of block BLK0 can be shared by select gates 260 of select circuits 241*a*, 242*a*, and 243*a* of sub-block SB0 of block BLK0. Select line $\mathbf{281}_0$ of sub-block SB0 of block BLK0 can be shared by select gates 261 of select circuits 241*a*, 242*a*, and 243*a* of sub-block SB0 of block BLK0. Select line $\mathbf{282}_0$ of sub-block SB0 of block BLK0 can be shared by select gates 262 of select circuits 241*a*, 242*a*, and 243*a* of sub-block SB0 of block BLK0.

In another example, select line 284 of sub-block SB0 of block BLK0 can be shared by select gates 264 of select circuits 241'*a*, 242'*a*, and 243'*a* of sub-block SB0 of block BLK0.

A select line (e.g., select line $\mathbf{280}_0$ of sub-block SB0 of block BLK0) can carry a signal (e.g., signal SGD$\mathbf{0}_0$) but it does not operate like a switch (e.g., a transistor). A select gate (e.g., select gate 260 of select circuit 241*a* of sub-block SB0 of block BLK0) can receive a signal (e.g., signal SGD$\mathbf{0}_0$) from a respective select line (e.g., select line $\mathbf{280}_0$ of sub-block SB0 of block BLK0) and can operate like a switch (e.g., a transistor).

In the physical structure of memory device 200, a select line (e.g., select line $\mathbf{280}_0$ of sub-block SB0 of block BLK0) can be a structure (e.g., a level) of a conductive material (e.g., a layer (e.g., a piece) of conductive material) located in a single level of memory device 200. The conductive material can include metal, doped polysilicon, or other conductive materials.

In the physical structure of memory device 200, a select gate (e.g., select gate 260 of select circuit 241*a* of sub-block SB0 of block BLK0) can include (can be formed from) a portion of the conductive material of a respective select line (e.g., select line $\mathbf{280}_0$ of sub-block SB0 of block BLK0), a portion of a channel material (e.g., polysilicon channel), and a portion of a dielectric material (e.g., similar to a gate oxide of a transistor (e.g., FET)) between the portion of the conductive material and the portion of the channel material.

Figure 4A:
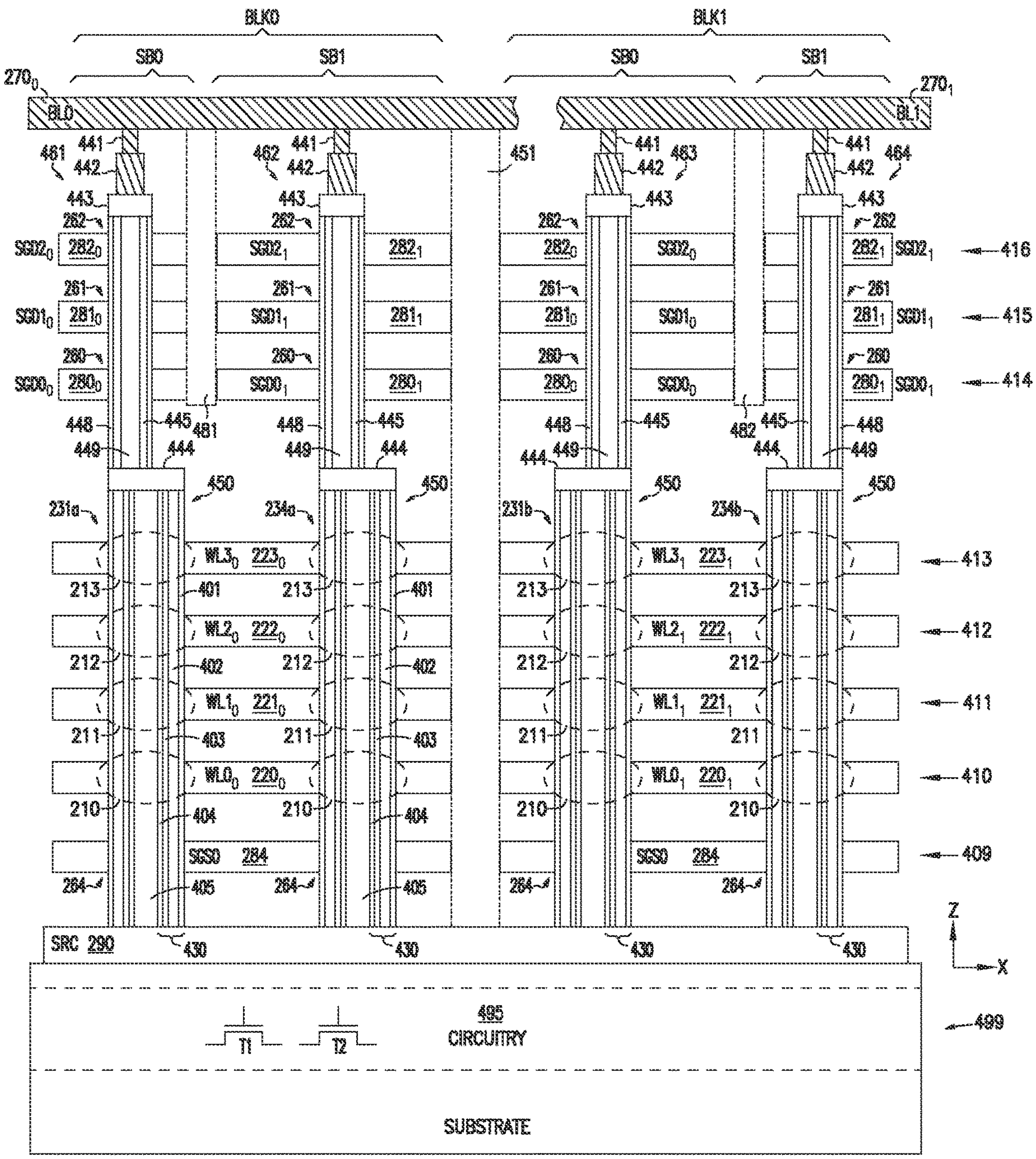
FIG. 4A shows a side view (e.g., cross-section) of a structure of a portion of the memory device of FIG. 3 including the conductive structures in two blocks of memory cells and a dielectric structure between the two blocks, according to some embodiments described herein.

FIG. 4A shows a side view (e.g., cross-section) of a structure of a portion of memory device 200 of FIG. 3 including the conductive structures 461, 462, 463, and 464 in blocks BLK0 and BLK1, and a dielectric structure 451 between blocks BLK0 and BLK1, according to some embodiments described herein. The structure of memory device 200 in FIG. 4A corresponds to part of the schematic diagram of memory device 200 shown in FIG. 3. For simplicity, some elements memory device 200 of FIG. 3 are omitted from the structure of the portion of memory device 200 shown in FIG. 4A.

For simplicity, cross-section lines (e.g., hatch lines) are omitted from some or all the elements shown in the drawings described herein. Some elements of memory device 200 (and other memory devices described herein) may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 4A, memory device 200 can include a substrate 499 over which memory cells 210, 211, 212, and 213 of memory cell strings 231*a*, 234*a*, 231*b*, and 234*b* of respective sub-blocks SB0 and SB1 of blocks BLK0 and BLK1 can be formed (e.g., formed vertically in z-direction with respect to source 290 and substrate 499).

Figure 4B:
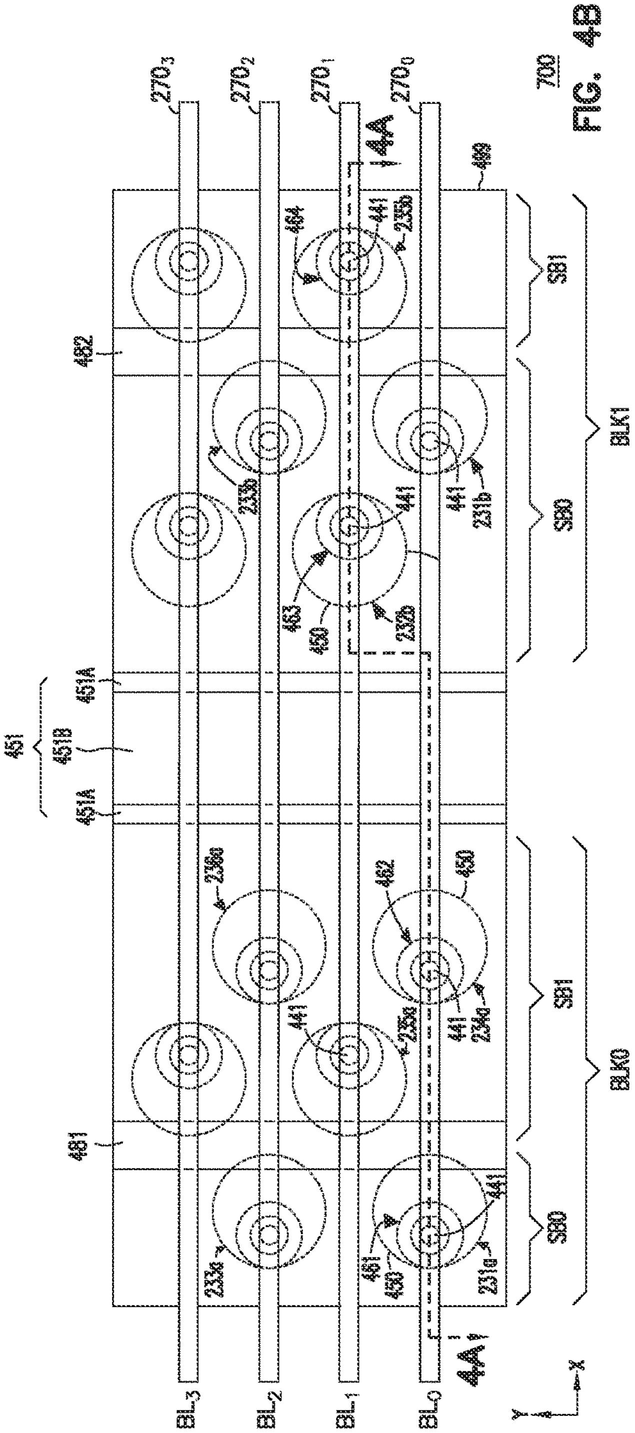
FIG. 4B shows a top view of a portion of the memory device of FIG. 4A including relative locations of data lines, conductive structures, and memory cell pillars, according to some embodiments described herein.

As shown in FIG. 4A, dielectric structure 451 can electrically separate block BLK0 from block BLK1. Dielectric structure 451 can have a depth (e.g., height) in the Z-direction. The depth of dielectric structure 451 can be a distance (e.g., vertical distance) between and source 290 and a data line (e.g., data line $\mathbf{270}_0$ or $\mathbf{270}_1$). FIG. 4B shows more details from a top view of dielectric structure 451, which can be formed in (or can include) a slit (not labeled) and materials 451A and 451B formed in (e.g., filled in) the slit. Material 451A can include a dielectric material (e.g., silicon dioxide). Material 451B can include polysilicon.

As shown in FIG. 4A, memory device 200 can include different levels 409 through 416 with respect to a Z-direction. Levels 409 through 416 are internal device levels between substrate 499 and data line $\mathbf{270}_0$.

Substrate 499 of memory device 200 can include monocrystalline (also referred to as single-crystal) semiconductor material. For example, substrate 499 can include monocrystalline silicon (also referred to as single-crystal silicon). The monocrystalline semiconductor material of substrate 499 can include impurities, such that substrate 499 can have a specific conductivity type (e.g., n-type or p-type).

As shown in FIG. 4A, memory device 200 can include circuitry 495 located in (e.g., formed in) substrate 499. At least a portion of circuitry 495 (e.g., the entire circuitry 495 or only a portion of circuitry 495) can be located in a portion of substrate 499 that is under (e.g., directly under) memory cell strings 231*a*, 234*a*, 231*b*, and 234*b*. Circuitry 495 can include circuit elements (e.g., transistors T1 and T2 and other transistors (not shown)) coupled to other circuit elements outside substrate 499. For example, data lines $\mathbf{270}_0$ (FIG. 4A) and control gates $\mathbf{220}_0$, $\mathbf{221}_0$, $\mathbf{222}_0$, $\mathbf{223}_0$ of block BLK0 and control gates $\mathbf{220}_1$, $\mathbf{221}_1$, $\mathbf{222}_1$, and $\mathbf{223}_1$ of block BLK1 can be coupled to circuit elements of memory device 200. Circuitry 495 can include decoder circuits, driver circuits, buffers, sense amplifiers, charge pumps, and other circuitry of memory device 200. Transistors T1 and T2 (and other transistors, not shown) of circuitry 495 can be part of (e.g., can represent) such decoder circuits, driver circuits, buffers, sense amplifiers, charge pumps, and other circuitry of memory device 200.

Source 290 can include a conductive material (or materials (e.g., different levels of materials)) and can have a length extending in the X-direction. FIG. 4A shows an example where source 290 can be formed over a portion of substrate 499 (e.g., by depositing a conductive material over substrate 499). Alternatively, source 290 can be formed in or formed on a portion of substrate 499 (e.g., by doping a portion of substrate 499).

As shown in FIG. 4A, select lines (e.g., drain select lines) $\mathbf{280}_0$, $\mathbf{281}_0$, and $\mathbf{282}_0$ of each of blocks BLK0 and BLK1 can be located in respective levels 414, 415, and 416. Select lines (e.g., drain select lines) $\mathbf{280}_1$, $\mathbf{281}_1$, and $\mathbf{282}_1$ of each of blocks BLK0 and BLK1 can also be located in respective levels 414, 415, and 416.

Select line (e.g., source select line) 284 of each of blocks BLK0 and BLK1 can be located in the same level (e.g., level 409) between substrate 499 and memory cell strings 231*a*, 234*a*, 231*b*, and 234*b*.

As shown in FIG. 4A, memory cells 210, 211, 212, and 213 of memory cell strings 231*a*, 234*a*, 231*b*, and 234*b* can be located in levels 410, 411, 412, and 413, respectively. Control gates $\mathbf{220}_0$, $\mathbf{221}_0$, $\mathbf{222}_0$, and $\mathbf{223}_0$ (associated with memory cells 210, 211, 212, and 213, respectively) of block BLK0 can be located in levels 410, 411, 412, and 413, respectively, that are the same levels at which memory cells 210, 211, 212, and 213 are located. Control gates $\mathbf{220}_1$, $\mathbf{221}_1$, $\mathbf{222}_1$, and $\mathbf{223}_1$ (associated with memory cells 210, 211, 212, and 213, respectively) of block BLK1 can be located in levels 410, 411, 412, and 413, respectively, that are the same levels at which control gates $\mathbf{220}_0$, $\mathbf{221}_0$, $\mathbf{222}_0$, and $\mathbf{223}_0$ of block BLK0 can be located.

Memory device 200 can also include dielectric materials (not labeled in FIG. 4A) interleaved with other elements in different levels (e.g., levels interleaved with levels 409 through 416) of memory device 200. For example, memory device 200 can include dielectric materials (e.g., silicon dioxide) located between levels 415 and 416 and interleaved with (located in the spaces between) select lines $\mathbf{280}_0$, $\mathbf{281}_0$, and $\mathbf{282}_0$, and $\mathbf{283}_0$ of blocks BLK0 and BLK1. In another example, memory device 200 can include other dielectric materials (e.g., silicon dioxide) located between levels 409 and 414 and interleaved with (located in the spaces between) control gates $\mathbf{220}_0$, $\mathbf{221}_0$, $\mathbf{222}_0$, and $\mathbf{223}_0$ of block BLK0, and control gates $\mathbf{220}_1$, $\mathbf{221}_1$, $\mathbf{222}_1$, and $\mathbf{223}_1$ of block BLK1.

Example materials for control gates $\mathbf{220}_0$, $\mathbf{221}_0$, $\mathbf{222}_0$, $\mathbf{223}_0$, $\mathbf{220}_1$, $\mathbf{221}_1$, $\mathbf{222}_1$, and $\mathbf{223}_1$ include a single conductive material (e.g., single metal (e.g., tungsten)) or a combination of conductive materials (e.g., a combination (e.g., a multi-layer) of aluminum oxide, titanium nitride, and tungsten).

Select lines $\mathbf{280}_0$, $\mathbf{281}_0$, $\mathbf{282}_0$, $\mathbf{283}_0$, $\mathbf{280}_1$, $\mathbf{281}_1$, $\mathbf{282}_1$, $\mathbf{283}_1$, and 284 can have the same material (or materials) as control gates $\mathbf{220}_0$, $\mathbf{221}_0$, $\mathbf{222}_0$, $\mathbf{223}_0$, $\mathbf{220}_1$, $\mathbf{221}_1$, $\mathbf{222}_1$, and $\mathbf{223}_1$.

As shown in FIG. 4A, memory device 200 can include pillars (memory cell pillars) 450 in respective sub-blocks SB0 and SB1 of blocks BLK0 and BLK1. Each of pillars 450 can be part of a respective memory cell string. Each of pillars 450 can have length extending outwardly (e.g., extending vertically in the direction of the Z-direction).

As shown in FIG. 4A, memory cells 210, 211, 212, and 213 and control gates $\mathbf{220}_0$, $\mathbf{221}_0$, $\mathbf{222}_0$, $\mathbf{223}_0$, $\mathbf{220}_1$, $\mathbf{221}_1$, $\mathbf{222}_1$, and $\mathbf{223}_1$ can be located (e.g., vertically located) along respective portions (e.g., segments) of pillars 450 in the Z-direction.

Memory device 200 can include a structure 430 and a structure 405 that can be part of a respective pillar of pillars 450 and extending continuously along a length of the respective pillar. Structure 405 can include dielectric material (e.g., silicon dioxide). Structure 430 is adjacent portions of respective access lines (control gates $\mathbf{220}_0$, $\mathbf{221}_0$, $\mathbf{222}_0$, and $\mathbf{223}_0$, or control gates $\mathbf{220}_1$, $\mathbf{221}_1$, $\mathbf{222}_1$, and $\mathbf{223}_1$). Structure 430 can include portions 401, 402, 403, and 404. Parts of structure 430 along a particular pillar can form part of each of memory cells of the memory cell string adjacent that particular pillar. Thus, each of memory cells 210, 211, 212, and 213 of a memory cell string can include part of structure 430 (part of each of portions 401, 402, 403, and 404) located directly between one of the access lines (one of control gates $\mathbf{220}_0$, $\mathbf{221}_0$, $\mathbf{222}_0$, and $\mathbf{223}_0$, $\mathbf{220}_1$, $\mathbf{221}_1$, $\mathbf{222}_1$, and $\mathbf{223}_1$) and a respective pillar.

Structure 430 can be electrically coupled to source 290. Structure 430 can include a conductive structure (e.g., portion 404) that can be part of a conductive path (e.g., pillar channel structure) to conduct current between data line $\mathbf{270}_0$ and source 290. Structure 430 can be part of a TANOS (TaN, $Al_2O_3$, $Si_3N_4$, $SiO_2$, Si) structure. For example, portion 401 (e.g., interpoly dielectric portion) can include a charge blocking material or materials (e.g., a dielectric material such as TaN and $Al_2O_3$) that are capable of blocking a tunneling of a charge. Portion 402 can include a charge storage element (e.g., charge storage material or materials, such as $Si_3N_4$) that can provide a charge storage function (e.g., trap charge) to represent a value of information stored in memory cells 210, 211, 212, or 213. Portion 403 can include a dielectric, such as a tunnel dielectric material or materials (e.g., $SiO_2$) that are capable of allowing tunneling of a charge (e.g., electrons). Portion 404 can include polysilicon (e.g., doped or undoped polysilicon) and can be a channel structure (e.g., pillar channel) that can conduct current during operation of memory device 200. As an example, portion 403 can allow tunneling of electrons from portion 404 to portion 402 during a write operation and tunneling of electrons from portion 402 to portion 404 during an erase operation of memory device 200. Moreover, portion 403 can allow tunneling of holes from portion 404 to portion 402, compensating the trapped electron recombination during an erase operation of memory device 200. In an alternative arrangement of memory device 200, structure 430 can be part of a SONOS (Si, $SiO_2$, $Si_3N_4$, $SiO_2$, Si) structure. In another alternative arrangement, structure 430 can be part of a floating gate structure (e.g., portion 402 can be polysilicon and each of portions 401 and 403 can be dielectric (e.g., $SiO_2$)). FIG. 4A shows an example of structure 430 having a particular shape (e.g., the shape shown in FIG. 4A). However, structure 430 can have a different shape as long as it can be part of a conductive path between a respective data line (e.g., data line $\mathbf{270}_0$ or $\mathbf{270}_1$) and source 290.

As shown in FIG. 4A and FIG. 4B, memory device 200 can include structures (e.g., drain select gate circuits) 461 and 462 in block BLK0 and conductive structures (e.g., drain select gate circuits) 463 and 464 in block BLK1. Conductive structures 461 and 462 can be part of select circuits 241*a* (FIG. 3) and select circuits 244*a* (FIG. 2), respectively, of block BLK0. Conductive structures 461 and 462 can be formed over and coupled (e.g., electrically coupled to) to pillars 450 of memory cell strings 231*a* and 234*a*, respectively. Memory device 200 can include a dielectric structure (e.g., sub-block divider) 481 to electrically separate select lines $\mathbf{280}_0$, $\mathbf{281}_0$, and $\mathbf{282}_0$ of sub-block SB0 of block BLK0 from select lines $\mathbf{280}_1$, $\mathbf{281}_1$, and $\mathbf{282}_1$ of sub-block SB1 of block BLK0.

Conductive structures 463 and 464 can be part of select circuits 231*b* and select circuits 234*b*, respectively, of block BLK1. Conductive structures 463 and 464 can be formed over and coupled to (e.g., electrically coupled to) pillars 450 of memory cell strings 231*b* and 234*b*, respectively. Memory device 200 can include a dielectric structure (e.g., sub-block divider) 482 to electrically separate select lines $\mathbf{280}_0$, $\mathbf{281}_0$, and $\mathbf{282}_0$ of sub-block SB0 of block BLK1 from select lines $\mathbf{280}_1$, $\mathbf{281}_1$, and $\mathbf{282}_1$ of sub-block SB1 of block BLK1.

As shown in FIG. 4A, each of conductive structures 461, 462, 463, and 464 can include conductive contact 441, conductive contact 442, conductive contact (e.g., conductive plug) 443, conductive contact (e.g., pillar contact) 444, a conductive region (e.g., conductive path) 445, and dielectric regions 448 and 449. Conductive contacts 441, 442, 443, and 444 can include the same material or different materials. Conductive contacts 441 and 442 can include a material (e.g., tungsten or other metals) different from the materials (e.g., conductively doped polysilicon or conductive materials) of one or both of conductive contacts 443 and 444.

Conductive region 445 can include doped or undoped polysilicon. Dielectric regions 448 and 449 can include silicon dioxide. Conductive region 445 can form part of a channel region of each of select gates (e.g., select transistors) 260, 261, and 262 of a respective structure among conductive structures 461, 462, 463, and 464. Dielectric region 448 can be a gate oxide region of select gates (e.g., select transistors) 260, 261, and 262 of a respective structure among conductive structures 461, 462, 463, and 464. Dielectric region 448 can electrically separate conductive region 445 from select lines (e.g., select lines $280_0$, $281_0$, and $282_0$) of a respective structure among conductive structures 461, 462, 463, and 464.

As shown in FIG. 4A, a select line (e.g., $280_0$) can be a structure (e.g., a level) of a conductive material (e.g., a layer (e.g., a piece) of conductive material or materials) located in a single level of memory device 200. As described above, a select line can carry a signal (e.g., signal $SGD0_0$) but it does not operate like a switch (e.g., a transistor). A select gate (e.g., 260) can include a portion of a respective select line (e.g., a portion of the piece of the conductive material that forms the respective select line) and additional structures to perform a function (e.g., function of a transistor).

For example, in FIG. 4A, select gate 260 of sub-block SB0 of block BLK0 can include a portion of select line $280_0$ sub-block SB0 of block BLK0 and a portion of conductive structure 461 (e.g., a portion of conductive region 445) adjacent select line $280_0$ of sub-block SB0 of block BLK0. In another example, select gate 261 of sub-block SB0 of block BLK0 can include a portion of select line $281_0$ sub-block SB0 of block BLK0 and a portion of conductive structure 461 (e.g., a portion of conductive region 445) adjacent select line $281_0$ of sub-block SB0 of block BLK0. In another example, select gate 262 of sub-block SB0 of block BLK0 can include a portion of select line $282_0$ sub-block SB0 of block BLK0 and a portion of conductive structure 461 (e.g., a portion of conductive region 445) adjacent select line $282_0$ of sub-block SB0 of block BLK0.

Conductive structure 461 and structure 430 of memory cell string 231*a* can form part of a conductive path (e.g., current path) between data line $270_0$ and source 290 through memory cell string 231*a* during an operation (e.g., read or write operation) of memory device 200. The conductive path can include a combination of conductive contacts 441 and 442, conductive contact (e.g., conductive plug) 443, conductive contact (e.g., pillar contact) 444, and portion (e.g., pillar channel) 404. Conductive structure 462 and structure 430 of memory cell string 234*a* can form part of a conductive path (e.g., current path) between data line $270_0$ and source 290 through memory cell string 234*a* during another operation (e.g., read or write operation) of memory device 200. Conductive structure 463 and structure 430 of memory cell string 231*b* can form part of a conductive path (e.g., current path) between data line $270_0$ and source 290 through memory cell string 231*b* during another operation (e.g., read or write operation) of memory device 200. Conductive structure 464 and structure 430 of memory cell string 234*b* can form part of a conductive path (e.g., current path) between data line $270_0$ and source 290 through memory cell string 234*b* during another operation (e.g., read or write operation) of memory device 200.

FIG. 4B shows a top view of memory device 200 of FIG. 4A including relative locations of data lines $270_0$, $270_1$, $270_2$, and $270_3$, conductive structures 461, 462, 463, and 464, and pillars 450. Line 4A-4A in FIG. 4B shows a location of the side view (e.g., cross-section) of memory device 200 as shown and described above with reference to FIG. 4A. For simplicity, only a portion (including memory cell strings 231*a* and 233*a*) of sub-block SB0 of block BLK0 in FIG. 2 is shown in FIG. 4B. Only a portion (including memory cell string 235*b*) of sub-block SB1 of block BLK1 of FIG. 2 is shown in FIG. 4B. Some of the elements of memory device 200 of FIG. 4B are not shown in FIG. 2 through FIG. 4A including data line $270_3$ (and associated signal $BL_3$) and memory cell strings and select gate structures (not labeled) coupled to data line $270_3$.

For simplicity, only a few pillars 450 of respective memory cell strings are labeled in FIG. 4B. As shown in FIG. 4B, each of conductive structures 461, 462, 463, and 464 can be located at a location that is offset from the center of pillar 450 of a respective memory cell string. For example, conductive structure 462 can be located at a location that is offset from pillar 450 of memory cell string 234*a*. In another example, conductive structure 463 can be located at a location that is offset from pillar 450 of memory cell string 232*b*.

As shown in FIG. 4B, data lines $270_0$, $270_1$, $270_2$, and $270_3$ can be located over (in the Z-direction) and extend across (in the X-direction) the blocks (e.g., blocks BLK0 and BLK1) of memory device 200. Each of data lines $270_0$, $270_1$, $270_2$, and $270_3$ can contact (e.g., can be directly coupled to) dielectric structure 451, contact (e.g., can be directly coupled or electrically coupled to) at least one conductive contact 441 in block BLK0, and contact (e.g., can be directly coupled to or electrically coupled to) at least one conductive contact 441 in block BLK1. For example, data lines $270_0$ can contact (e.g., directly coupled to) dielectric structure 451, contact (e.g., directly coupled or electrically coupled to) conductive contacts 441 of conductive structures 461 and 462 in block BLK0, and contact (e.g., directly coupled or electrically coupled to) conductive contact 441 of a conductive structure (not labeled) located over memory cell string 231*b*. In another example, data lines $270_1$ can contact (e.g., directly coupled to) dielectric structure 451, contact (e.g., directly coupled or electrically coupled to) conductive contacts 441 of conductive structures 463 and 464 in block BLK1, and contact (e.g., directly coupled or electrically coupled to) conductive contact 441 of a conductive structure (not labeled) located over memory cell string 235*a*.

Figure 4C:
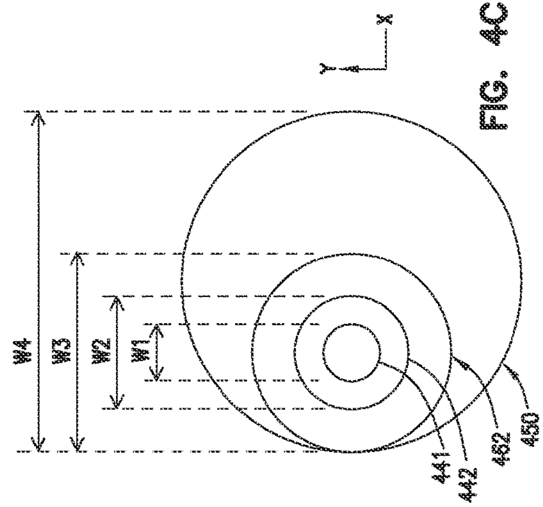
FIG. 4C shows relationships among widths (e.g., diameters) of conductive contacts of conductive structure and pillars of the memory device of FIG. 4A and FIG. 4B, according to some embodiments described herein.

FIG. 4C shows relationships among widths (e.g., diameters) W1, W2, W3, and W4 of respective conductive contacts 441 and 442, conductive structure 462, and pillar 450 of memory device 200 of FIG. 4A and FIG. 4B. As shown in FIG. 4C, widths W1, W2, W3, and W4 can be measured in the X-direction. Width W1 is less than width W2. Width W2 is less than width W3. Width W3 is less than width W4. Other conductive contacts of other conductive structures (e.g., conductive structure 461, 463, and 464 in FIG. 4B) can have similar width as the conductive contacts of conductive structure 462.

Figure 5:
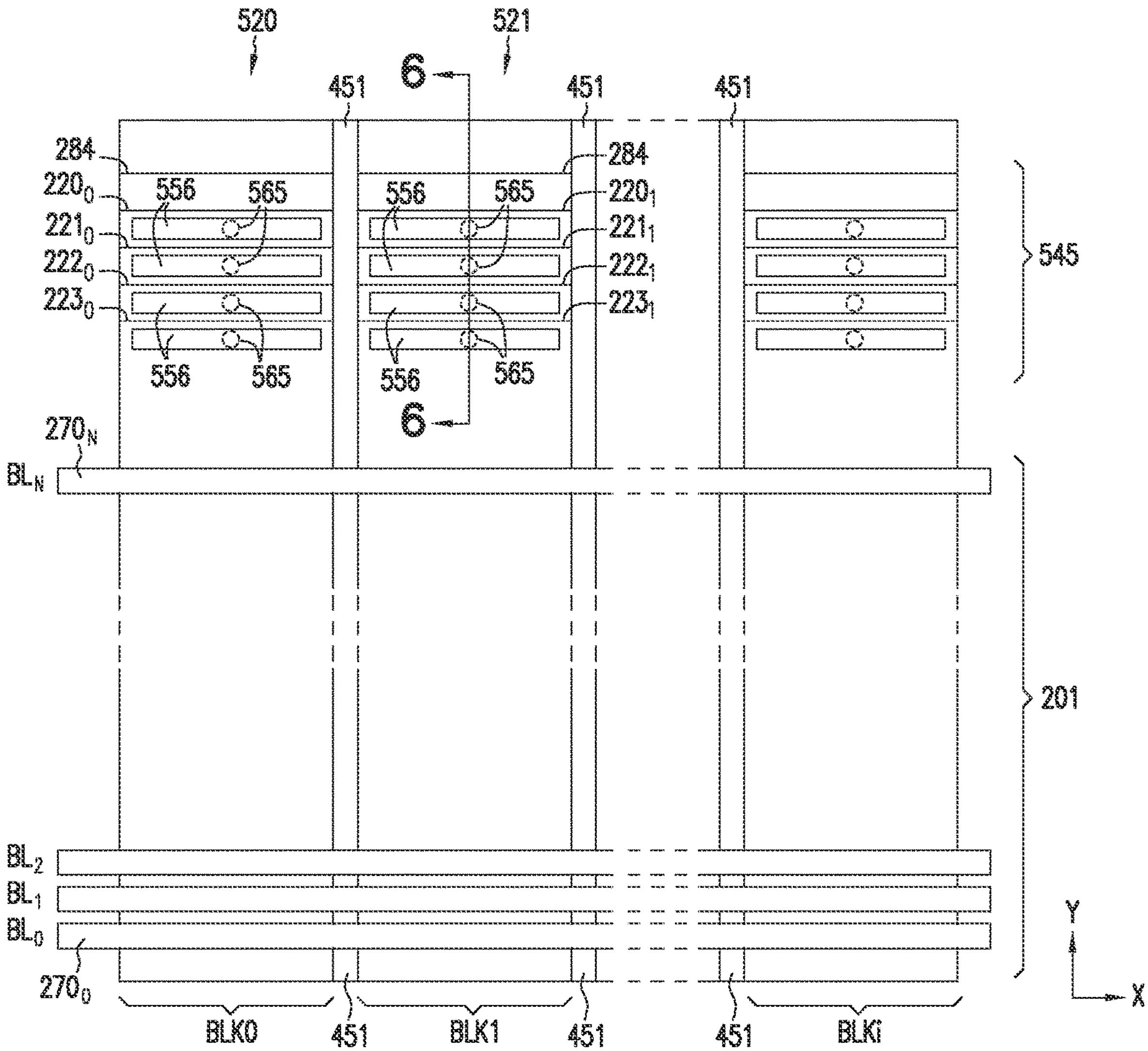
FIG. 5 shows a top view of the memory device of FIG. 4A including a memory array, a staircase region, and dielectric structures between the blocks of the memory device of FIG. 4A, according to some embodiments of described herein.

FIG. 5 shows a top view in the X-Y direction of memory device 200 of FIG. 4A including memory array 201, staircase region 545, dielectric structures 451, and blocks BLK0 and BLK1 through BLKi, according to some embodiments described herein. For simplicity, FIG. 5 omits some of the elements of memory device 200 of FIG. 4A and FIG. 4B. Further, FIG. 5 omits labels for similar or the same elements among the blocks (e.g., block BLK0. BLK1, and BLKi) and the description of such elements is not repeated.

As shown in FIG. 5, blocks BLK0 and BLK1 through BLKi of memory device 200 can be located side-by-side in the X-direction. Blocks BLK0 and BLK1 of FIG. 5 are also shown in the X-Z direction in FIG. 4A.

As shown in FIG. 5, each structure 451 can have a length in the Y-direction, a width in the X-direction, and a depth (e.g., height) in the Z-direction (shown in FIG. 4A). Data lines $270_0$ through $270_N$ can have lengths extending in the X-direction across (in the X-direction) and over (in the Z-direction) blocks BLK0 through BLKi.

Memory device 200 can include a staircase region 545 located next to memory array 201. Staircase region 545 can include staircase structure 520 of block BLK0, staircase structure 521 of block BLK1, and other staircase structures of other blocks of memory device 200. Staircase structures of adjacent blocks (e.g., staircase structures 520 and 521 of blocks BLK0 and BLK1, respectively) can be electrically separated from each other by dielectric structure 451 between the adjacent blocks.

Staircase structure 520 of block BLK0 can be formed from portions (e.g., end portions) of control gates $220_0$, $221_0$, $222_0$, and $223_0$ of block BLK0. As shown in FIG. 5, control gates $220_0$, $221_0$, $222_0$, and $223_0$ can extent in the Y-direction from memory array 201 to staircase region 545 where respective portions (e.g., end portions) of control gates $220_0$, $221_0$, $220_0$, and $223_0$ at staircase region 545 can form staircase structure 520.

Figure 6:
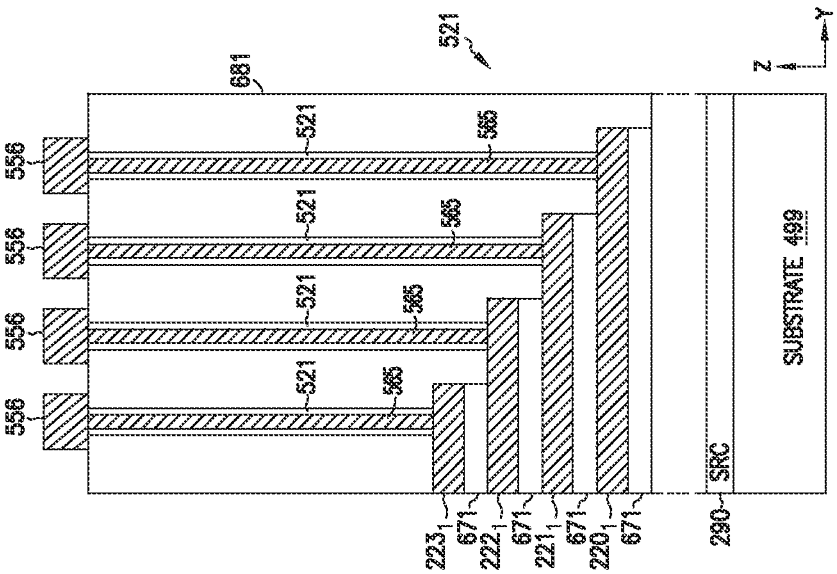
FIG. 6 shows a side view of a staircase structure of one of the blocks of the memory device of FIG. 5, according to some embodiments of described herein.

Staircase structure 521 of block BLK1 can be formed from portions (e.g., end portions) of control gates $220_1$, $221_1$, $222_1$, and $223_1$ of block BLK1. Like control gates $220_0$, $221_0$, $222_0$, and $223_0$ of block BLK0, control gates $220_1$, $221_1$, $222_1$, and $223_1$ of block BLK1 can extend in the Y-direction from memory array 201 to staircase region 545 where respective portions (e.g., end portions) of control gates $220_1$, $221_1$, $222_1$, and $223_1$ at staircase region 545 can form staircase structure 521. FIG. 6 (described below) shows a side view (e.g., cross-section) of staircase structure 521 along line 6-6 of FIG. 5.

As shown in FIG. 5, memory device 200 can include conductive contacts (e.g., word line contacts) 565 (shown in top view) in each of the blocks (e.g., in blocks BLK0 and BLK1). Each of conductive contacts 565 can include a vertical structure (shown in FIG. 6) having length extending in the Z-direction.

Conductive contacts 565 within a block can be electrically coupled to respective control gates at the staircase structure of that block. For example, conductive contacts 565 of block BLK1 can be electrically coupled to respective control gates $220_1$, $221_1$, $222_1$, and $223_1$ at staircase structure 521 of block BLK0.

As shown in FIG. 5, memory device 200 can include conductive lines 556 in respective blocks of memory device 200. Conductive lines 556 of one block (e.g., block BLK0) can be electrically separated from conductive lines of another block (e.g., block BLK1). Conductive lines 556 can have respective lengths extending in the X-direction.

Conductive lines 556 in a block (e.g., block BLK1) can contact (e.g., directly coupled to (e.g., electrically coupled to)) respective conductive contacts 565 in that block (e.g., block BLK1). Conductive lines 556 can be part of conductive routings that can be coupled to peripheral circuitry (e.g., word line drivers in substrate 499 in FIG. 5) of memory device 200. Conductive lines 556 can be structured to provide signals (e.g., word line signals) to respective control gates $220_1$, $221_1$, $222_1$, and $223_1$ (through respective conductive contacts 565). Conductive lines 556 of one block (e.g., block BLK1) can be formed (e.g., patterned) such that they can be electrically separated from other conductive lines 556 (not shown) of another block (e.g., block BLK0).

FIG. 6 shows a side view of staircase structure 521 of block BLK1 of memory device 200 of FIG. 5, according to some embodiments of described herein. As shown in FIG. 6, control gates $220_1$, $221_1$, $222_1$, and $223_1$ can be formed (e.g., patterned), such that they have different lengths in the Y-direction and their respective portions (e.g., end portions) can form staircase structure 521.

Memory device 200 can include dielectric materials 671 that are interleaved with the conductive materials of control gates $220_1$, $221_1$, $222_1$, and $223_1$. Memory device 200 can include a dielectric material 681 formed at staircase structure 521. Conductive contacts 565 can be formed in respective openings (e.g., holes) in dielectric material 681. Conductive contacts 565 can be electrically separated from control gates $220_1$, $221_1$, $222_1$, and $223_1$ by a dielectric material 671.

Some or all of the structure of memory device 200 can be formed using processes associated with the processes described below with reference to FIG. 7A, FIG. 7B, and FIG. 7C through FIG. 31A, FIG. 31B, and FIG. 31C or alternatively FIG. 32, FIG. 32B, and FIG. 32C through FIG. 55A, FIG. 55B, and FIG. 55C.

FIG. 7A through FIG. 31C show different views of elements during processes of forming a memory device 700, according to some embodiments described herein.

Figure 7B:
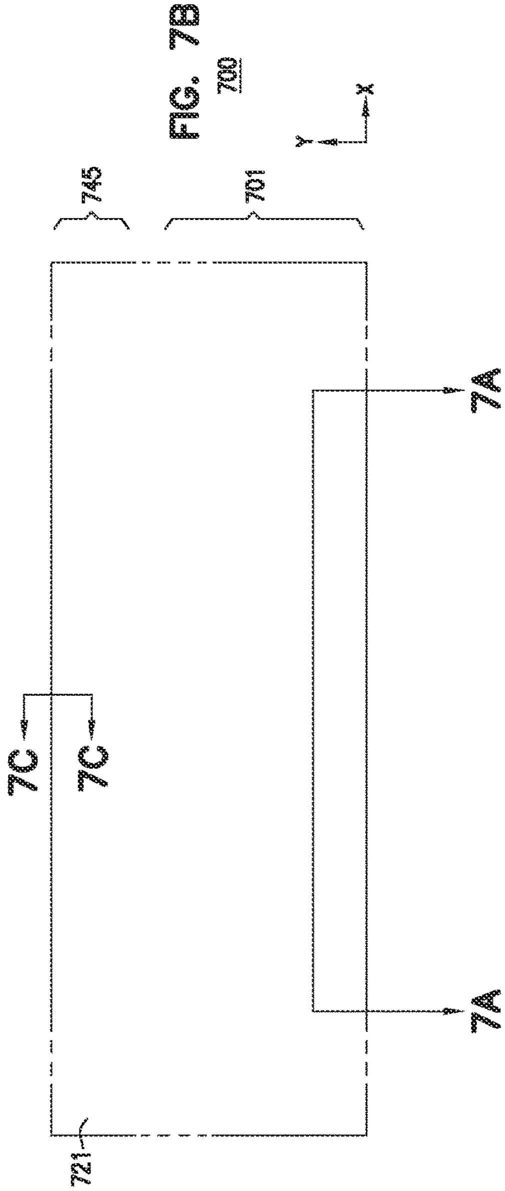
Figure 7C:
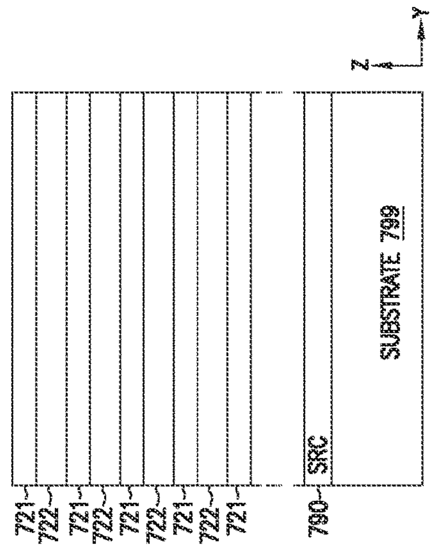
Figure 7A:
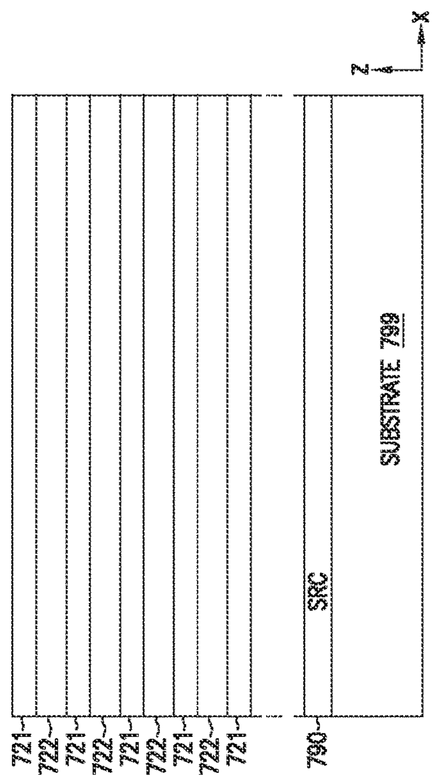

FIG. 7A shows a side view (e.g., cross-section) in the X-direction of device 700 after dielectric materials (levels of dielectric materials) 721 and dielectric materials (levels of dielectric materials) 722 are alternatively formed over a substrate 799. Substrate 799 is similar to (e.g., can correspond to) substrate 499 (FIG. 4) of memory device 200. Dielectric materials 721 and 722 can be sequentially formed one material after another over substrate 799 in an interleaved fashion, such that dielectric materials 721 are interleaved with dielectric materials 722.

FIG. 7B shows a top view of memory device 200 after dielectric materials 721 and 722 are formed. Memory device 700 can include a memory array region 701 where a memory array (e.g., similar to memory array 201 of FIG. 5) of memory device 700 can be formed in subsequent processes. Memory device 700 can include a staircase region 745 where staircase structures (similar to staircase structure 520 or 521 of FIG. 5) of memory device 700 can be formed in subsequent processes. The side view (in the X-Z direction) at memory array region 701 of memory device 700 shown in FIG. 7A is taken along line (e.g., cross-section line) 7A-7A of FIG. 7B. Another side view (in the Y-Z direction) at staircase region 745 of memory device 700 shown in FIG. 7C is taken along line 7C-7C of FIG. 7B.

As shown in FIG. 7A, the process of forming memory device 700 can include forming a material 790 over substrate 799. Material 790 can form part of a source (e.g., associated with signal SRC) that is similar to source 290 of FIG. 4A.

One skilled in the art would readily recognize that the process of forming memory device 700 can include forming additional elements (not shown) in the dashed line portion (between material 790 and one of dielectric materials 721) in FIG. 7A of memory device 200. The additional elements can include select circuits similar to select circuit (e.g., source select circuit) 241'*a*, 244'*a*, 2412'*b*, and 244'*b* and other elements of memory device 200 (FIG. 2, FIG. 3, and FIG. 4A). However, for simplicity and not to obscure the embodiments described herein, description of formation of such additional elements is omitted from the description herein.

Figure 8B:
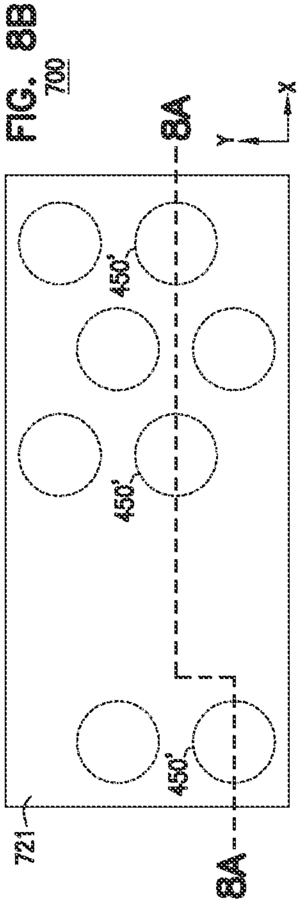
Figure 8C:
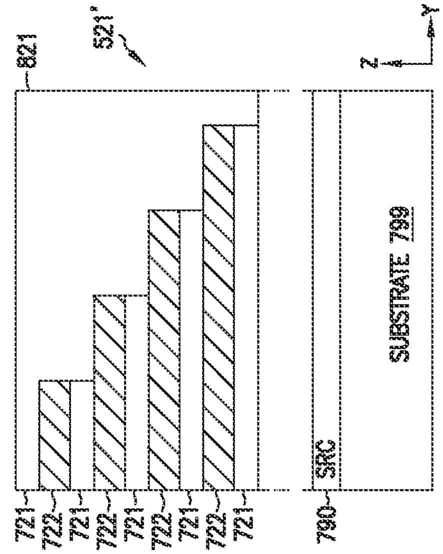
Figure 8A:
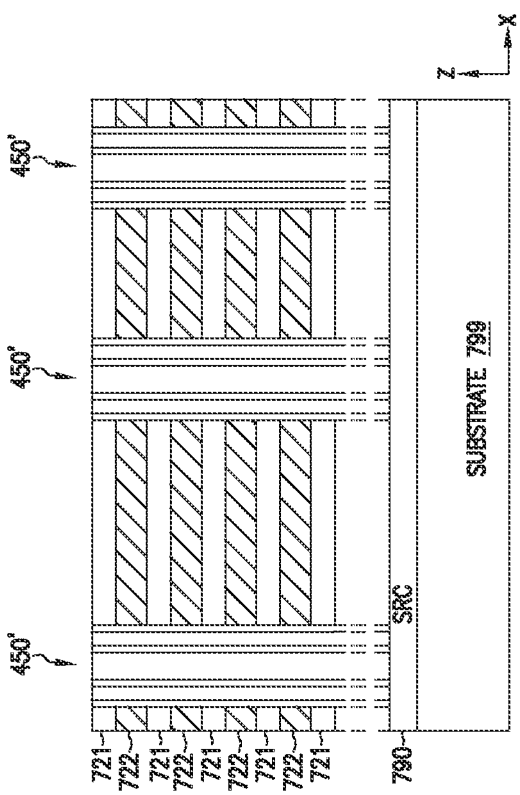

In the following description, different views of memory device 700 in subsequent processes are based on the views of memory device 700 of FIG. 7A, FIG. 7B, and FIG. 7C and follow the same arrangement of the views (e.g., side view and top view) of FIG. 7A, FIG. 7B, and FIG. 7C. For example. FIG. 8A shows a side view of a portion of memory device 700 taken along line (e.g., cross-section line) 8A-8A of FIG. 8B. FIG. 8B shows a top view of a portion of memory device 700 of FIG. 8A, FIG. 8C shows a side view of a portion of memory device 700 at the staircase region 745 (FIG. 7B). For simplicity, the following description omits repeating specific views (e.g., side view and top view) and specific cross-section lines of portion of memory device 700 from one process to the next.

In the description herein, elements given the same numerical labels are similar or the same elements. For example, pillar 450 (FIG. 4) and pillar 450' (FIG. 8A) are similar or the same elements. In another example, conductive contacts 441 and 442 (FIG. 4) and conducive contacts 441' and 442' (FIG. 15A through FIG. 31A) are similar or the same elements. Thus, for simplicity, the detailed description of similar or the same elements may not be repeated.

FIG. 8A, FIG. 8B, and FIG. 8C show different views of memory device 700 after pillars 450' and staircase structure 521' are formed. Pillars 450' are similar to (e.g., can correspond to) pillars 450 of FIG. 4A. Staircase structure 521' is similar to (e.g., can correspond to) staircase structure 521 of FIG. 5. Forming pillars 450' can include forming openings (e.g., holes) through dielectric materials 721 and 722, then forming pillars 450' in the openings. Similar to pillar 450 (FIG. 4A), each pillar 450' of FIG. 8A can include memory cells (e.g., like memory cells 210, 211 212, and 213 in FIG. 4A) of a respective memory cell string.

Forming staircase structure 521' of FIG. 8C can include removing a portion of dielectric materials 721 and 722 at staircase region 745 (labeled in FIG. 7B) to obtain a remaining portion of dielectric materials 721 and 722 that have edges (e.g., vertical edges, not labeled) as shown in FIG. 8C. Portions (e.g., end portions) of dielectric materials 721 and 722 and their respective edges form staircase structure 521'. Then, a dielectric material (e.g., silicon dioxide) 821 can be formed and can be part of staircase structure 521'.

In FIG. 8A, a level (e.g., a layer) of dielectric material 722 (or alternatively, two adjacent levels that include a level of dielectric material 721 and a level of dielectric material 722) can be called a tier of memory device 700. As shown in FIG. 8A, the tiers of memory device 700 can be located (e.g., stacked) one over another in the Z-direction over substrate 799, such that two adjacent tiers can be separated from each other by a respective level (e.g., layer) of dielectric material (e.g., silicon dioxide) 721. FIG. 8A shows an example of a specific number of tiers (e.g., four tiers). However, memory device 700 can include up to (or more than) hundred tiers.

Figure 9B:
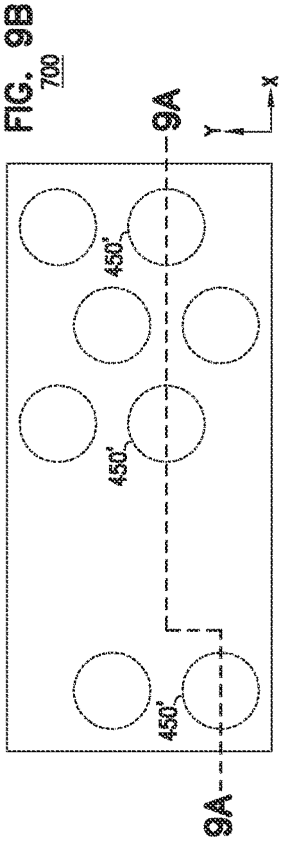
Figure 9A:
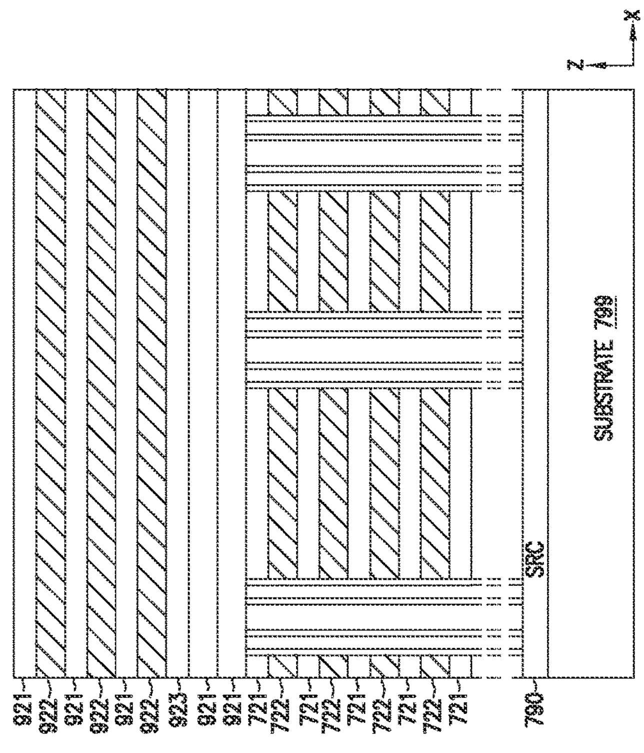
Figure 9C:
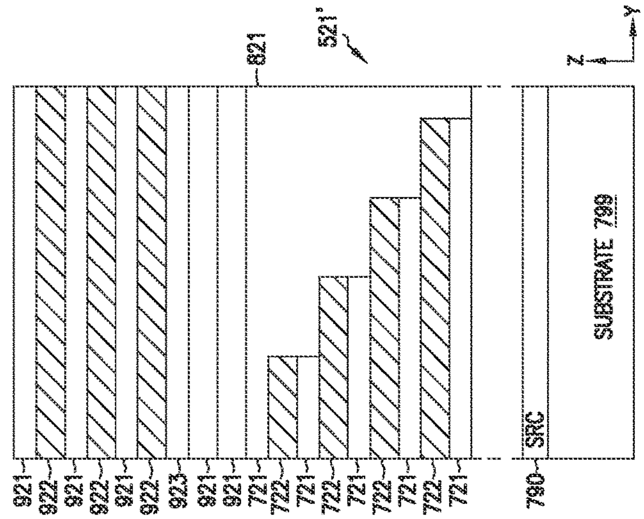

FIG. 9A, FIG. 9B, and FIG. 9C show memory device 700 after dielectric materials (e.g., levels of dielectric materials) 921, dielectric materials (e.g., levels of dielectric materials) 922, and a dielectric material 923 are formed over pillars 450' (labeled in FIG. 8A). Dielectric materials 921 and 922 can be sequentially formed one material after another in an interleaved fashion (e.g., like dielectric materials 721 and 722 of FIG. 7A), such that dielectric materials 921 can be interleaved with dielectric materials 922.

Dielectric materials 921 and 922 can be the same as dielectric materials 721 and 722 (e.g., silicon dioxide and silicon nitride, respectively). Dielectric material 923 can be different from dielectric materials 921 and 922 and can have a different property (e.g., etch property) from that of dielectric materials 921 and 922 and other materials above (in the Z-direction) dielectric material 923. An example material for dielectric material 923 includes carbon nitride. The different properties between dielectric material 923 can allow dielectric material 923 to be a structure (e.g., an etch stop) that can be used as a reference location where a subsequent etch process can stop. The subsequent etch process (in FIG. 25A) can be part of formation for select lines of respective sub-blocks for in a respective block of memory device 700.

In FIG. 9A, levels of dielectric materials 922 can also be called tiers. Thus, after pillar 450' (FIG. 8A) are formed in the tiers in the processes associated with FIG. 8A, additional tiers (formed by the process associated with FIG. 9A) are formed.

Figure 10B:
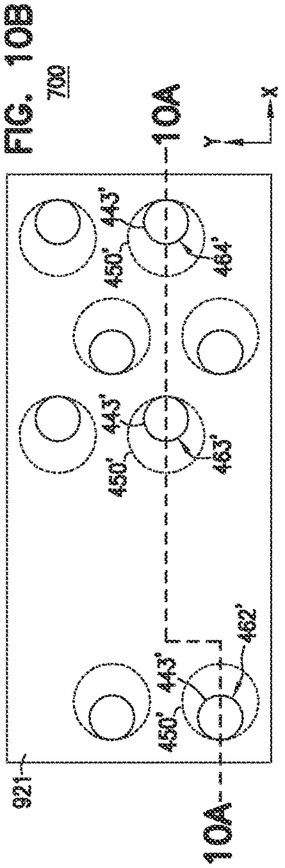
Figure 10A:
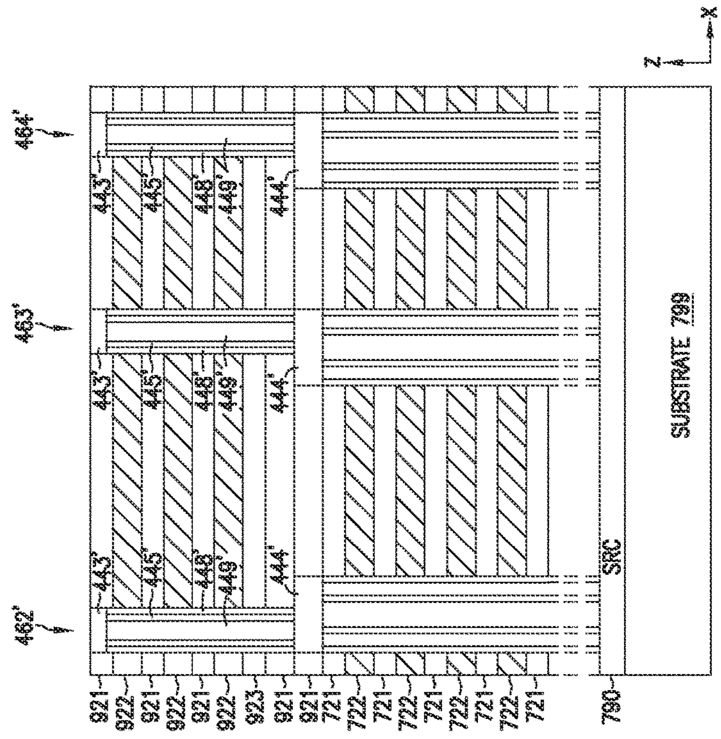
Figure 10C:
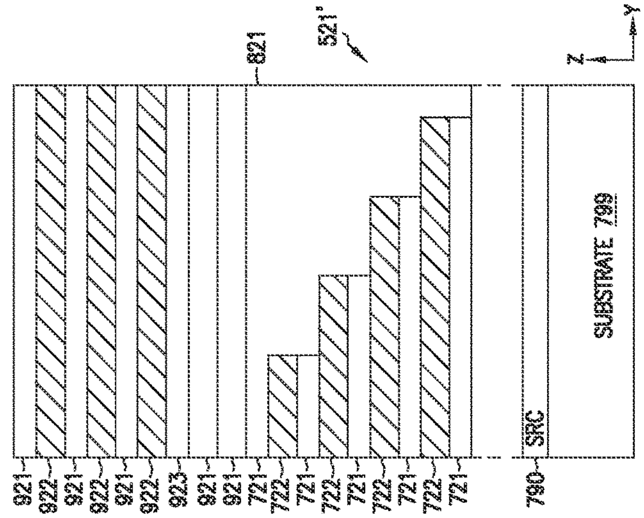

FIG. 10A, FIG. 10B, and FIG. 10C show memory device 700 after part of conductive structures 462', 463', and 464' are formed over respective pillars 450' and through dielectric materials 921 and 922 and dielectric material 923. Conductive structures 462', 463', and 464' are similar to (e.g., can correspond to) conductive structures 462, 463, and 464, respectively, of FIG. 4A. As shown in FIG. 10A, forming conductive structures 462', 463', and 464' can include forming, (in each of conductive structures 462', 463', and 464') a conductive contact (e.g., conductive plug) 443', a conductive contact (e.g., pillar contact) 444', a conductive region (e.g., conductive path) 445', and dielectric regions 448' and 449'. A chemical mechanical polishing (CMP) process can be used after conductive contacts 443' are formed.

Conductive contact 443', conductive contact 444', conductive region 445', and dielectric regions 448' and 449' are similar to (e.g., can correspond to) conductive contact 443, conductive contact 444, conductive region 445, and dielectric regions 448 and 449, respectively, of FIG. 4A.

Figure 11B:
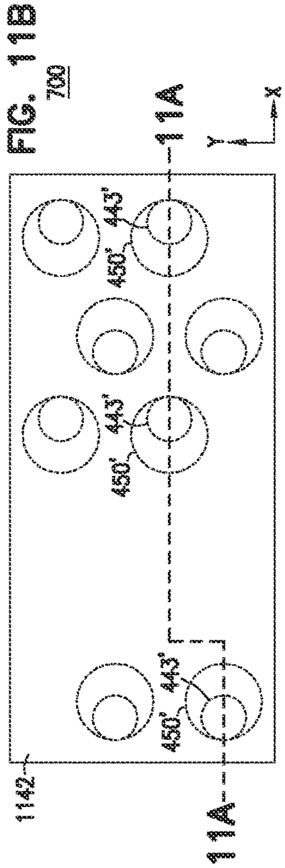
Figure 11A:
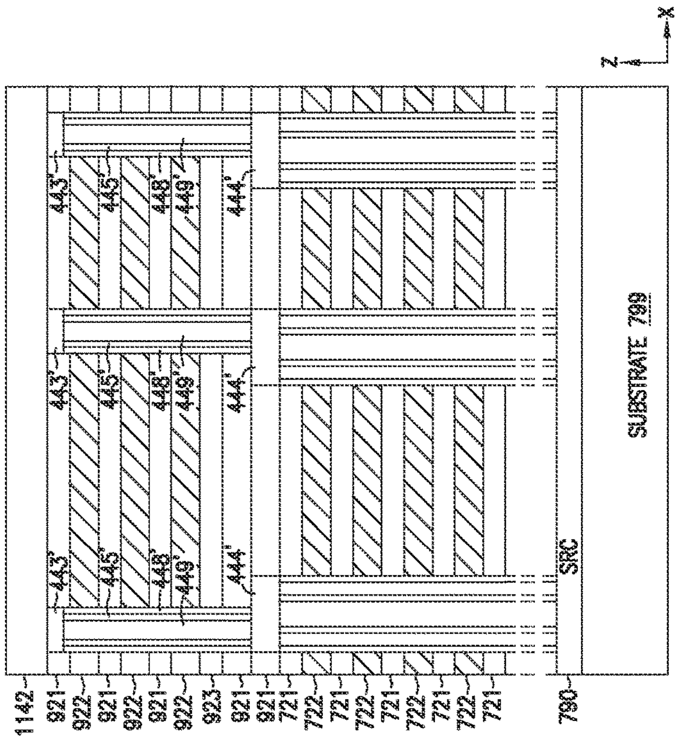
Figure 11C:
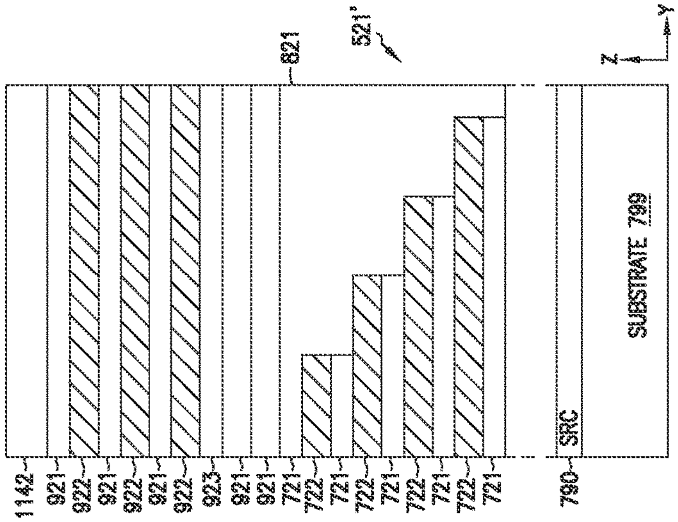

FIG. 11A, FIG. 11B, and FIG. 11C show memory device 700 after a dielectric material (e.g., silicon dioxide) 1142 is formed over other elements of memory device 700.

Figure 12B:
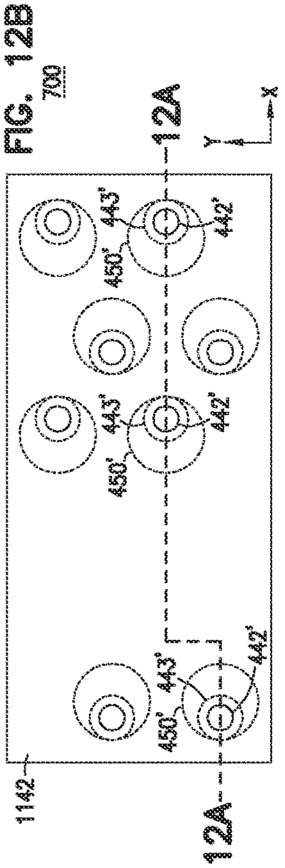
Figure 12C:
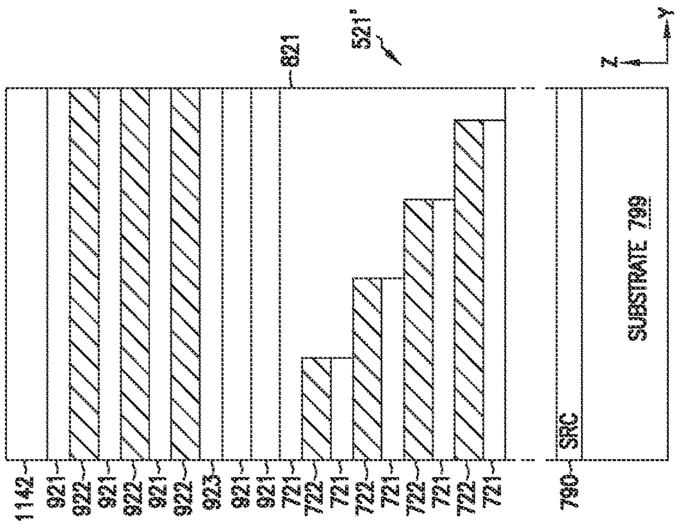
Figure 12A:
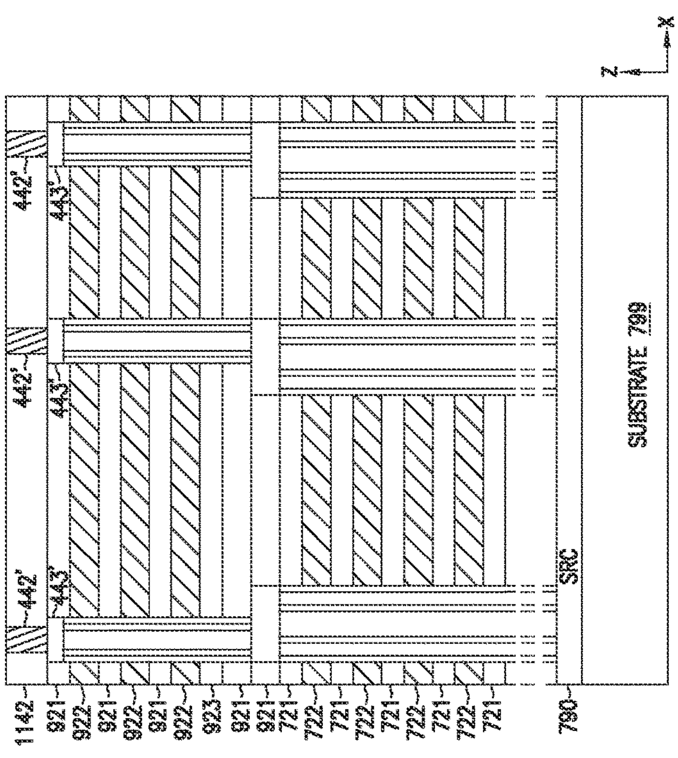

FIG. 12A, FIG. 12B, and FIG. 12C show memory device 700 after conductive contacts 442' are formed over respective conductive contacts 443'. Conductive contacts 442' are similar to (e.g., can correspond to) conductive contacts 442 of FIG. 4A. Forming conductive contacts 442' can include forming openings (e.g., holes) in dielectric material 1142 to expose respective conductive contacts 443' at the openings, then forming (e.g., depositing) conductive materials (e.g., tungsten or other metal) in the openings to form conductive contacts 442'.

Figure 13B:
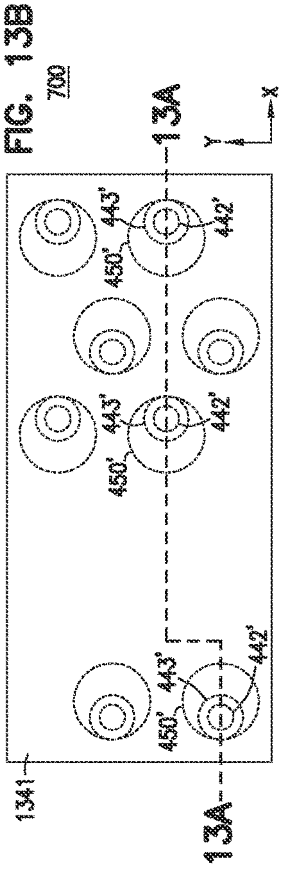
Figure 13A:
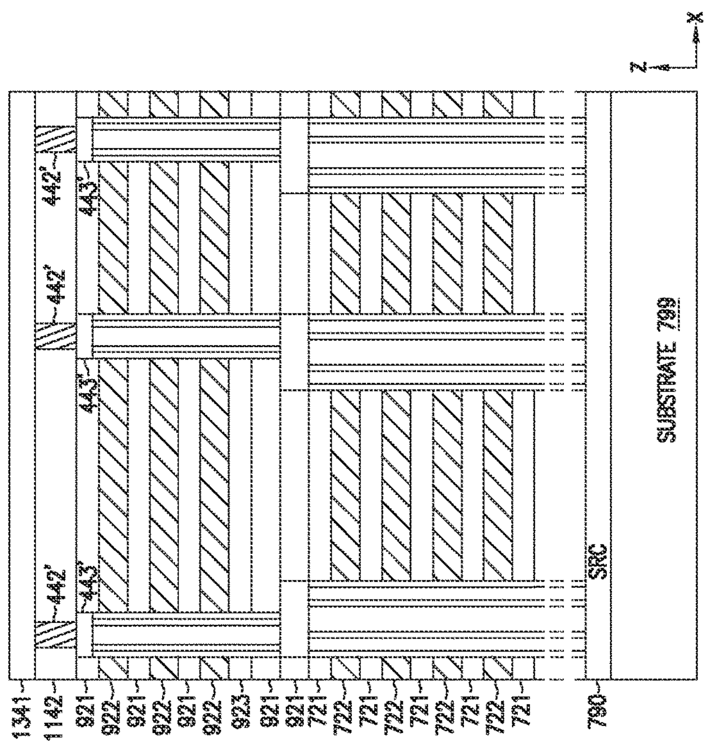
Figure 13C:
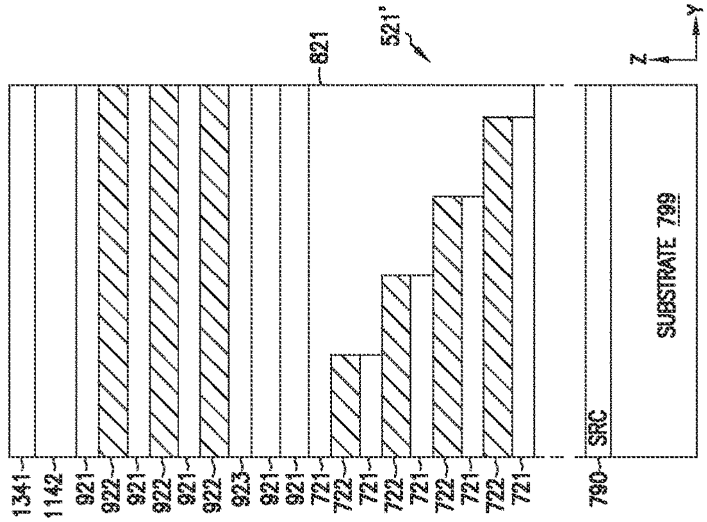

FIG. 13A, FIG. 13B, and FIG. 13C show memory device 700 after a dielectric material (e.g., silicon dioxide) 1341 is formed over other elements of memory device 700. As shown in FIG. 13A, the level of dielectric material 1341 can be formed directly on the level of dielectric material (e.g., silicon dioxide) 1142.

Figure 14B:
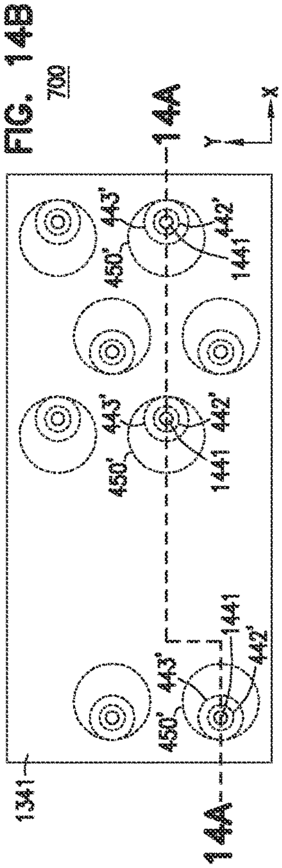
Figure 14A:
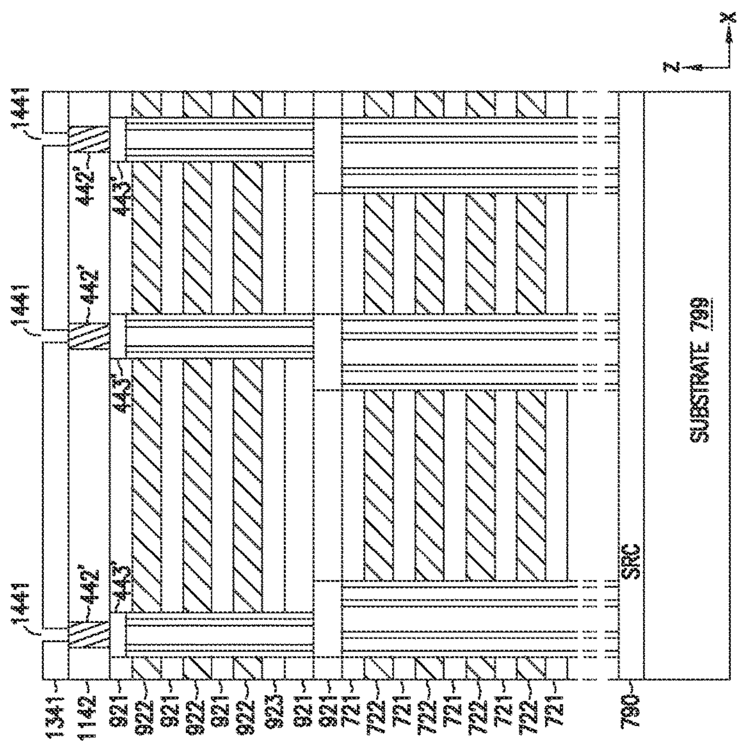
Figure 14C:
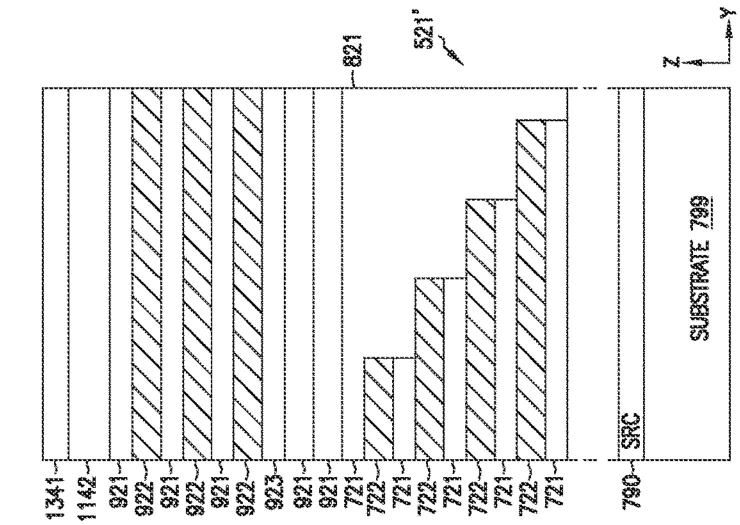

FIG. 14A, FIG. 14B, and FIG. 14C show memory device 700 after openings (e.g., holes) 1441 are formed in dielectric material 1341. Forming openings 1441 can include removing (e.g., etching) portions of dielectric material 1341 over respective conductive contacts 442' to expose conductive contacts 442' at openings 1441.

Figure 15B:
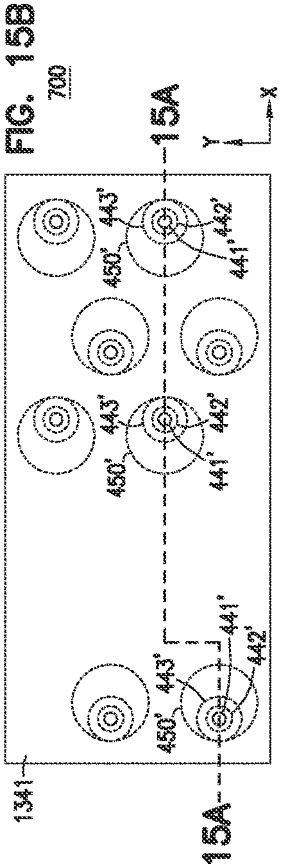
Figure 15C:
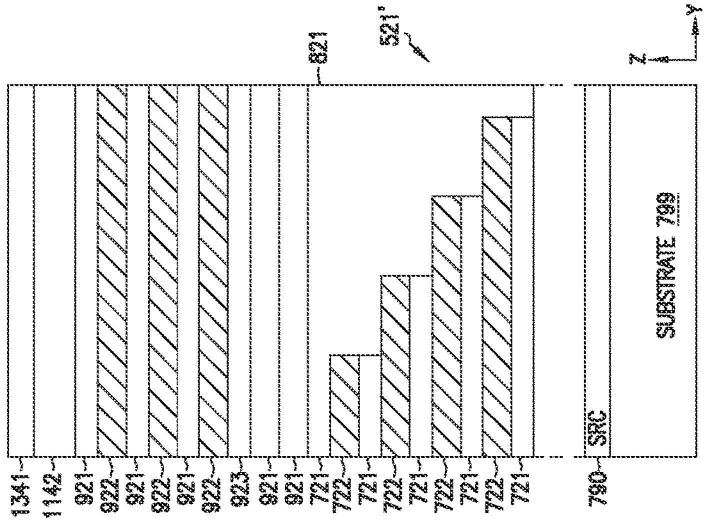
Figure 15A:
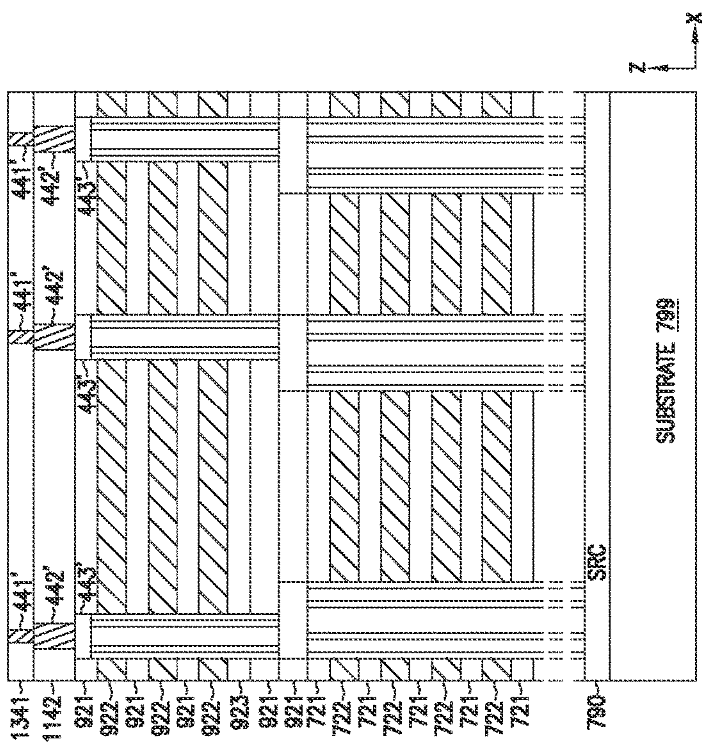

FIG. 15A, FIG. 15B, and FIG. 15C show memory device 700 after conductive contacts 441' are formed in respective openings 1441. Conductive contacts 441' are similar to (e.g., can correspond to) conductive contacts 441 of FIG. 4A. Forming conductive contacts 441' can include depositing conductive materials (e.g., tungsten or other metal) in openings 1441 to form conductive contacts 441' that contact (e.g., can be directly coupled to or electrically coupled to) respective conductive contacts 442'. A CMP process can be used after conductive contacts 441' are formed.

Conductive contacts 441' and 442' can widths W1 and W2, respectively, like conductive contacts 441 and 442 shown in FIG. 4C. Thus, the width (in the X-direction) of each of conductive contacts 441' (FIG. 15A) can be less that the width (in the X-direction) of each of conductive contacts.

As shown in FIG. 15A, the entire structure (e.g., material) of each of conductive contacts 441' can be formed in the level of dielectric material (e.g., silicon dioxide) 1341, such that the height (e.g., thickness in the Z-direction) of each of each of conductive contacts 441' can be the same as the height (e.g., thickness in the Z-direction) of the level of dielectric material 1341. The entire structures (e.g., material) of each of conductive contacts 442' can be formed in the level of dielectric material (e.g., silicon dioxide) 1142, such that the height (e.g., thickness in the Z-direction)) of each of each of conductive contacts 442' can be the same as the height (e.g., thickness in the Z-direction) of the level of dielectric material 1142.

Thus, as described above, since conductive contacts 441' (FIG. 15A) can be formed in openings 1441 (FIG. 14A) that are directly aligned (e.g., vertically aligned) with respective conductive contacts 442', conductive contacts 441' can be viewed as self-aligned with respective conductive contacts 442'. Therefore, misalignments in the connections between conductive contacts 441' and 442' may be mitigated (e.g., may not occur).

Figures 16A, 16B, 16C:
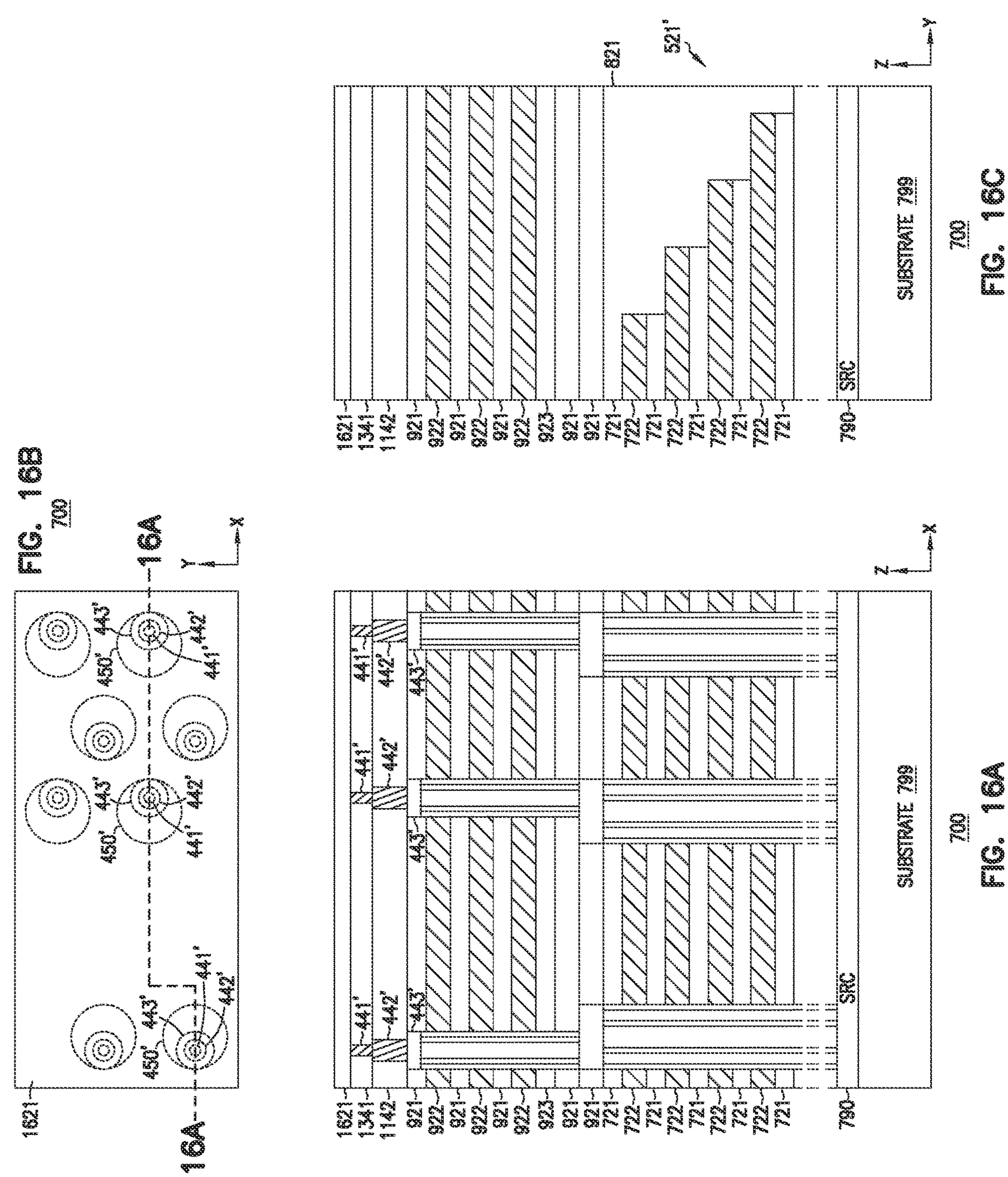

FIG. 16A, FIG. 16B, and FIG. 16C show memory device 700 after a dielectric material (e.g., silicon dioxide) 1621 is formed over other elements of memory device 700.

Figures 17A, 17B, 17C:
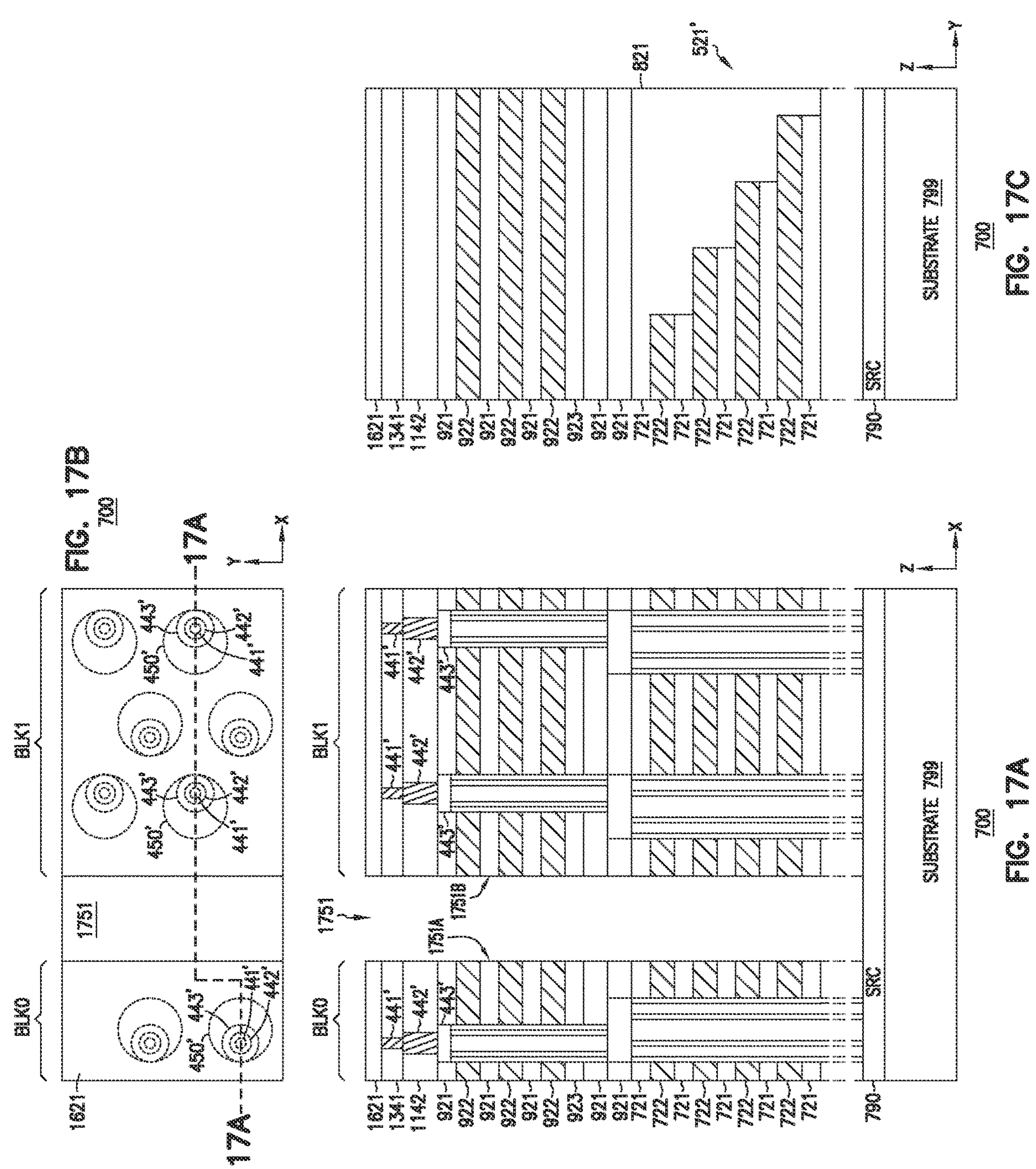

FIG. 17A, FIG. 17B, and FIG. 17C show memory device 700 after a slit (e.g., an opening, a trench, or a cut) 1751 is formed. Slit 1751 can include sidewalls 1751A and 1751B opposite from each other in the X-direction. Slit 1751 can be formed such that it can extend through the levels of dielectric materials 921 and 922, the levels of dielectric materials 721 and 722, and other elements of memory device 700, as shown in FIG. 17A and FIG. 17B.

Slit 1751 can be formed to divide (e.g., separate) elements (e.g., respective memory cell strings and other elements) of memory device 700 into portions that are part of respective blocks (e.g., blocks BLK0 and BLK1) of memory device 700. For example, slit 1751 can separate conductive contacts 441' and 442' into respective portions in blocks BLK0 and BLK1. Slit 1751 can separate dielectric materials 921 and 922 into respective portions in blocks BLK0 and BLK1. Slit 1751 can separate dielectric materials 721 and 722 into respective portions in blocks BLK0 and BLK1. Slit 1751 can separate pillars 450' of respective memory cell strings of memory device 700 into respective portions in blocks BLK0 and BLK1.

Thus, in the processes associated with FIG. 12A through FIG. 17C, conductive contacts 442' (FIG. 12A) can be formed, then conductive contact 441' (FIG. 15A) can be formed after conductive contacts 442' are formed. Slit 1751 (FIG. 17A) can be formed after conductive contacts 442' and 441' are formed.

The following description (associated with FIG. 18A through FIG. 19C) involve subsequent processes that include removing (FIG. 18A) then replacing (FIG. 19A) the levels of dielectric materials 722 in FIG. 17A with respective levels of conductive materials. The levels of conductive materials can form control gates in respective tiers of memory device 700. The same processes used to remove dielectric materials 722 in FIG. 17A can also include removing (FIG. 18A) then replacing (FIG. 19A) the levels of dielectric materials 922 in FIG. 17A with respective levels of conductive materials. The conductive materials (which replace dielectric materials 922) can form respective select lines (e.g., drain select lines) of select circuits of memory device 700.

Figures 18A, 18B, 18C:
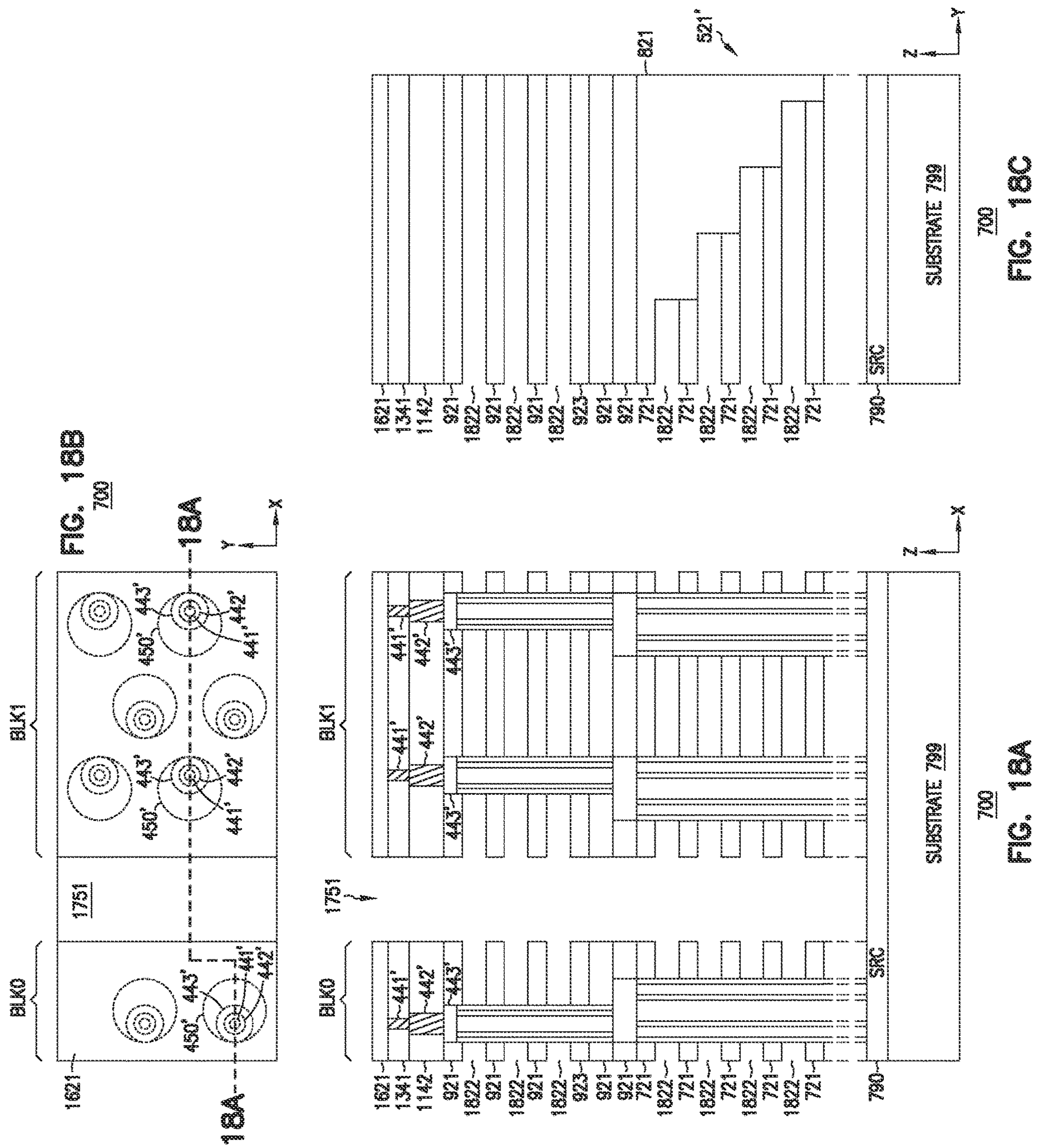

FIG. 18A, FIG. 18B, and FIG. 18C show memory device 700 after dielectric materials (e.g., silicon nitride) 722 and 922 are removed (e.g., exhumed) from locations 1822. Locations 1822 are empty spaces after dielectric materials 722 and 922 are removed. In subsequent processes, a conductive material (or conductive materials) can be formed in locations 1822 to form respective control gates and select gates (e.g., drain select gates) of memory device 700.

Figures 19A, 19B, 19C:
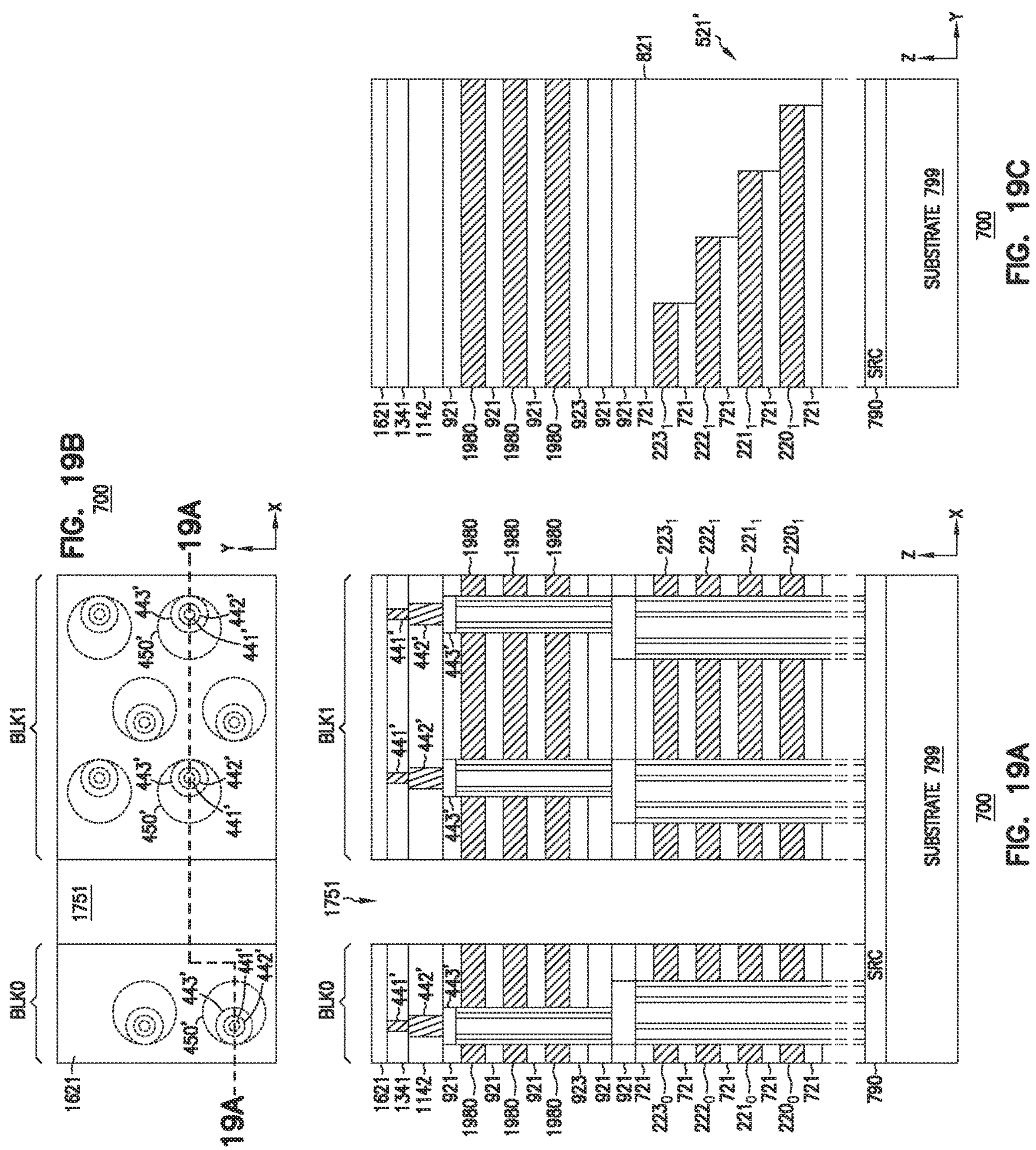

FIG. 19A, FIG. 19B, and FIG. 19C show memory device 700 after formation of control gates $\mathbf{220_0}$, $\mathbf{221_0}$, $\mathbf{222_0}$, and $\mathbf{223_0}$ in block BLK0, control gates $\mathbf{220_1}$, $\mathbf{221_1}$, $\mathbf{222_1}$, and $\mathbf{223_1}$ in block BLK1, and conductive regions (e.g., levels of conductive materials) 1980. Control gates $\mathbf{220_0}$, $\mathbf{221_0}$, $\mathbf{222_0}$, and $\mathbf{223_0}$ in block BLK0 are similar to (e.g., can correspond to) $\mathbf{220_0}$, $\mathbf{221_0}$, $\mathbf{222_0}$, and $\mathbf{223_0}$, respectively, of FIG. 4A. Control gates $\mathbf{220_1}$, $\mathbf{221_1}$, $\mathbf{222_1}$, and $\mathbf{223_1}$ in block BLK1 are similar to (e.g., can correspond to) $\mathbf{220_1}$, $\mathbf{221_1}$, $\mathbf{222_1}$, and $\mathbf{223_1}$, respectively, of FIG. 4A. In subsequent processes (FIG. 23), conductive regions 1980 are divided into separate portions to form select lines (e.g., drain select lines) of respective sub-blocks of memory device 700.

The process of forming control gates $\mathbf{220_0}$, $\mathbf{221_0}$, $\mathbf{222_0}$, and $\mathbf{223_0}$ in block BLK0, control gates $\mathbf{220_1}$, $\mathbf{221_1}$, $\mathbf{222_1}$, and $\mathbf{223_1}$ in block BLK1, and conductive regions 1980 can include depositing a single conductive material (e.g., tungsten or other metal) in locations 1822 (FIG. 18A). Alternatively, the processes associated with FIG. 19A, FIG. 19B, and FIG. 19C can include forming (e.g., depositing) multiple materials (one at a time) in locations 1822. For example, processes can include depositing aluminum oxide on sidewalls of locations 1822, depositing titanium nitride conformal to the aluminum oxide, and then depositing tungsten (or other suitable conductive material) conformal to the titanium nitride.

Thus, as shown in FIG. 19A, control gates $\mathbf{220_0}$, $\mathbf{221_0}$, $\mathbf{222_0}$, and $\mathbf{223_0}$ in block BLK0 can be formed in respective tiers (the locations of dielectric materials 722 in block BLK0 that were removed) of memory device 700 to control the memory cells in respective tiers in block BLK0. Control gates $\mathbf{220_1}$, $\mathbf{221_1}$, $\mathbf{222_1}$, and $\mathbf{223_1}$ in block BLK1 can be formed in respective tiers (the locations of dielectric materials 722 in block BLK1 that were removed) of memory device 700 to control the memory cells in respective tiers in block BLK1.

Figures 20A, 20B, 20C:
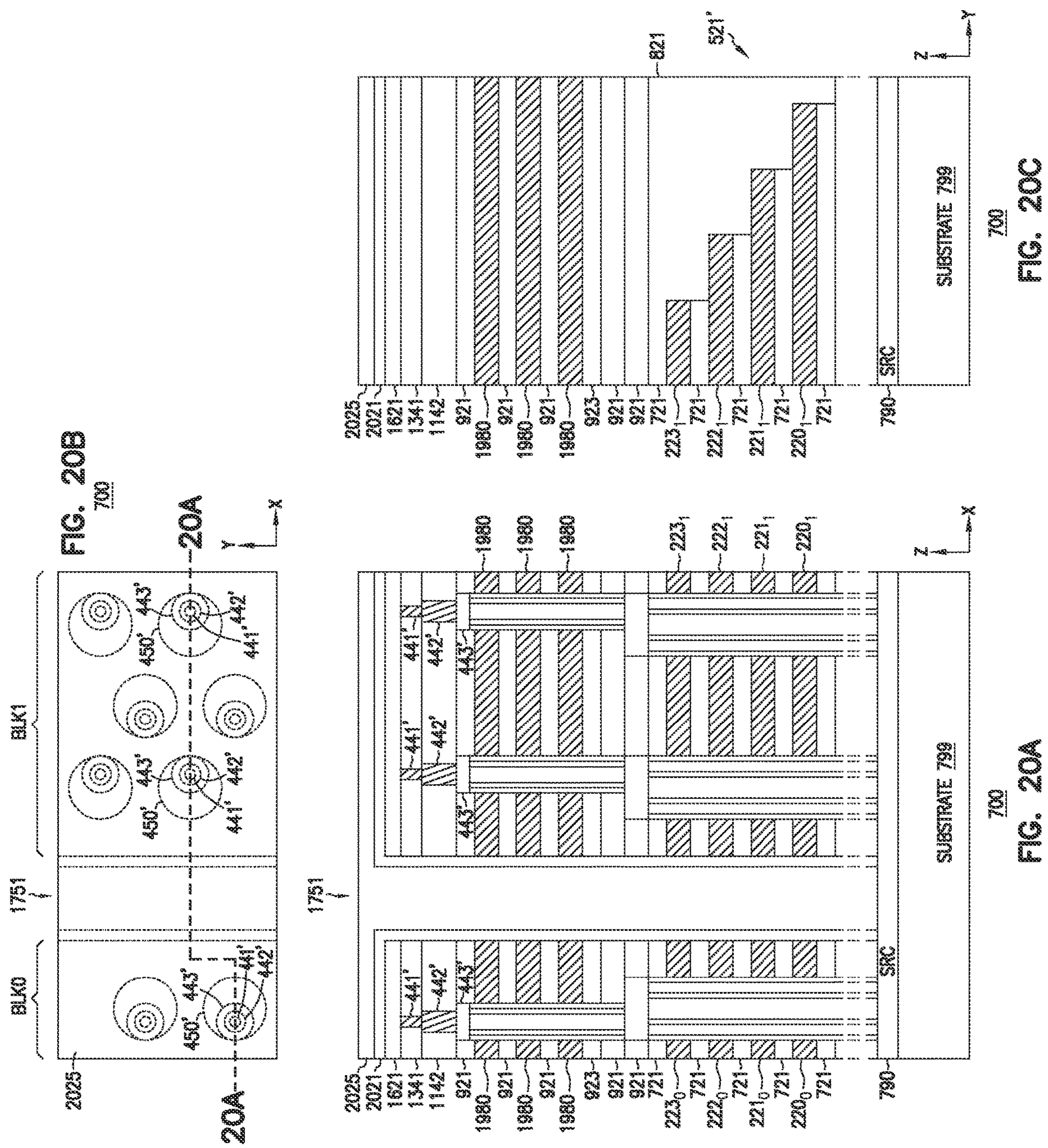

FIG. 20A, FIG. 20B, and FIG. 20C show memory device 700 after a dielectric material (e.g., silicon dioxide) 2021 and a material 2025 are formed in slit 1751 and over other elements of memory device 700. Material 2025 can include polysilicon. Alternatively, material 2025 can include a dielectric material. As shown in FIG. 20A and FIG. 20B, portions of dielectric material 2021 can be formed on opposite sidewalls (not labeled) of slit 1750. A portion of material 2025 can be formed between the portions of dielectric material 2021 that are formed on opposite sidewalls of slit 1750.

Figure 21C:
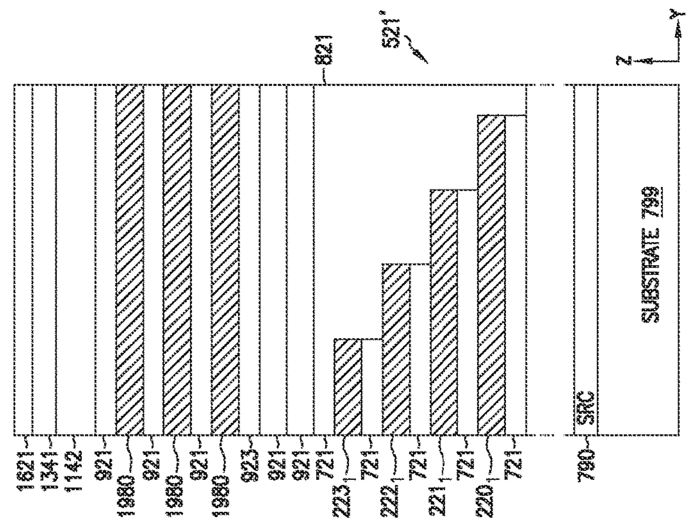
Figure 21B:
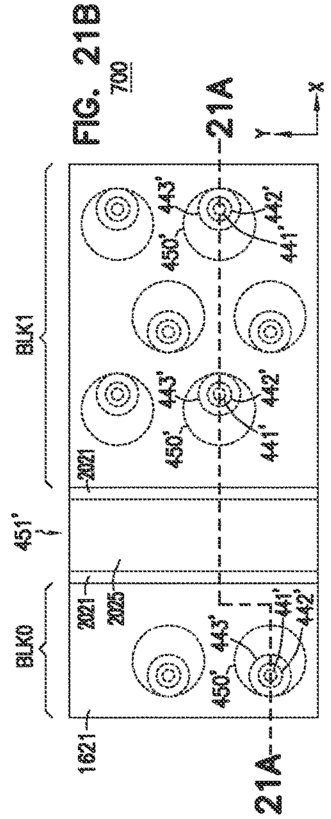
Figure 21A:
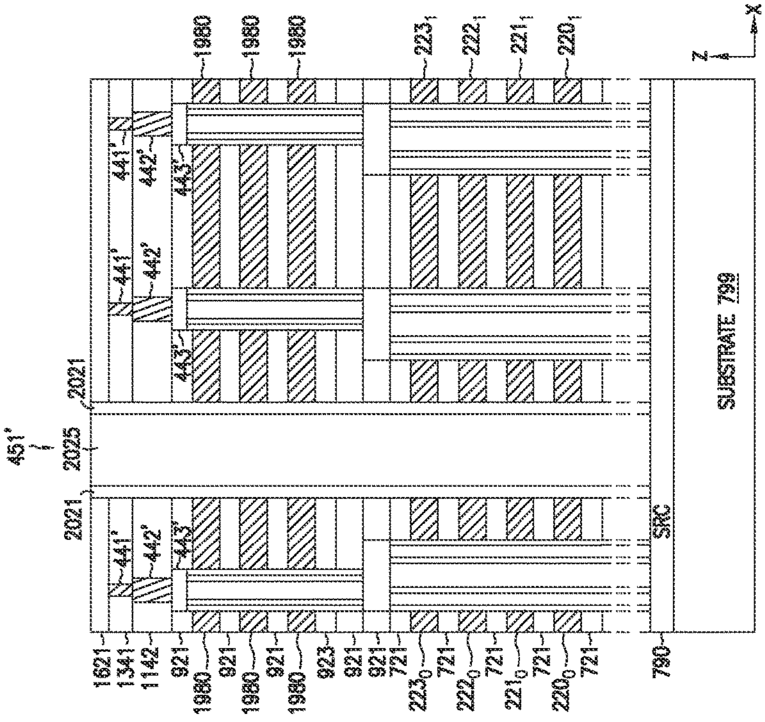

FIG. 21A, FIG. 21B, and FIG. 21C show memory device 700 after a dielectric structure 451' is formed. Dielectric structure 451' is similar to (e.g., can correspond to) dielectric structure 451 of FIG. 4A. Forming dielectric structure 451 can include performing a CMP process to remove a portion (top portion shown in FIG. 20A) of each of dielectric materials 2021 and material 2025. The remaining portion of dielectric materials 2021 and material 2025 forms dielectric structure 451'.

As shown in FIGS. 21A and 21B, dielectric structure 451' can separate (e.g., divide) the elements of memory device 700 into portions that can be part of respective blocks (e.g., blocks BLK0 and BLK1) of memory device 700. For example, dielectric structure 451' can separate conductive contacts 441' and 442' into respective portions in blocks BLK0 and BLK1. Dielectric structure 451' can separate the conductive materials that form respective conductive regions 1980 into respective portions in blocks BLK0 and BLK1. Dielectric structure 451' can separate the conductive materials that form respective control gates $\mathbf{220}_0$, $\mathbf{221}_0$, $\mathbf{222}_0$, and $\mathbf{223}_0$ (in block BLK0) and respective control gates $\mathbf{220}_1$, $\mathbf{221}_1$, $\mathbf{222}_1$, and $\mathbf{223}_1$ (in block BLK0) into respective portions in blocks BLK0 and BLK1. Dielectric structure 451' can separate pillars 450' of respective memory cell strings of memory device 700 into respective portions in blocks BLK0 and BLK1.

Figure 22B:
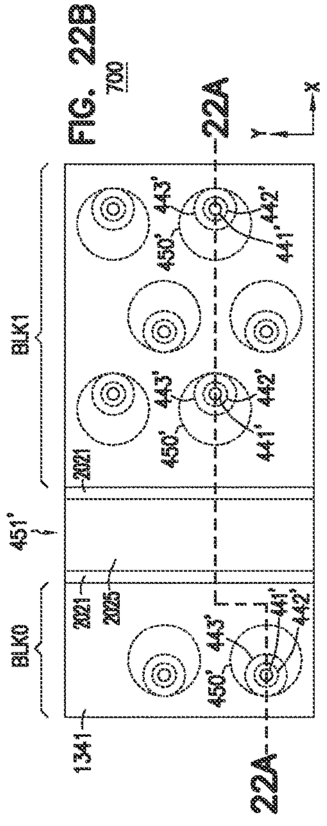
Figure 22A:
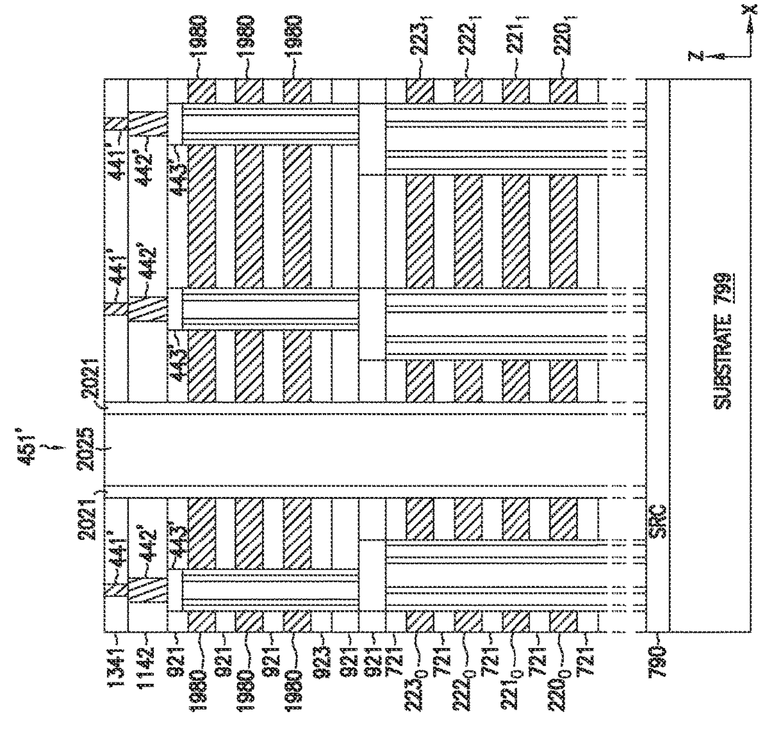
Figure 22C:
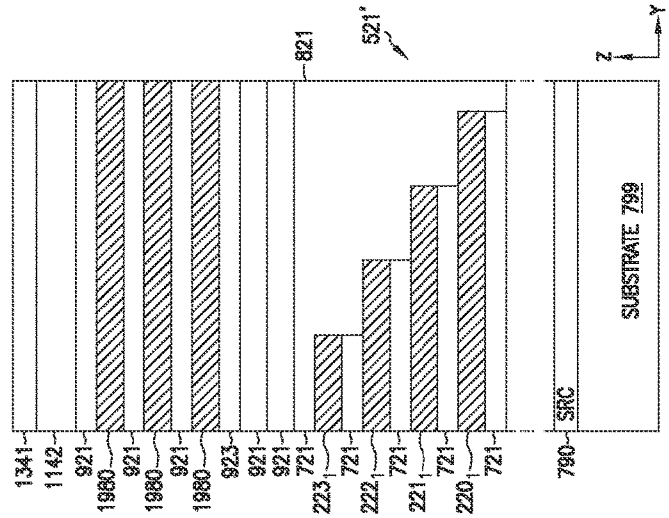

FIG. 22A, FIG. 22B, and FIG. 22C show memory device 700 after dielectric material 1621 (FIG. 21A) is removed. A CMP process can be used to remove dielectric material 1621. As shown in FIG. 22A, the process associated with FIG. 22A, FIG. 22B, and FIG. 22C can expose conductive contacts 441'.

Figure 23B:
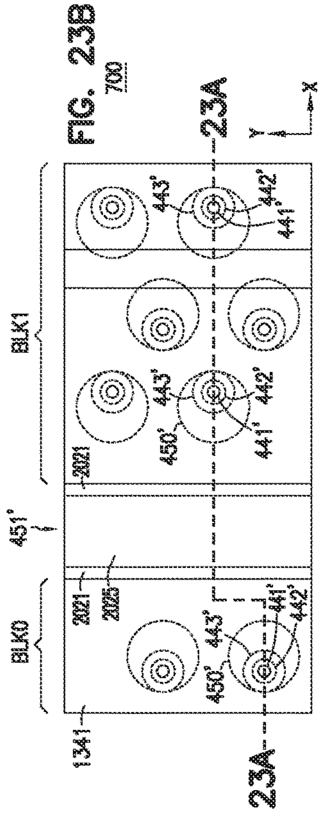
Figure 23A:
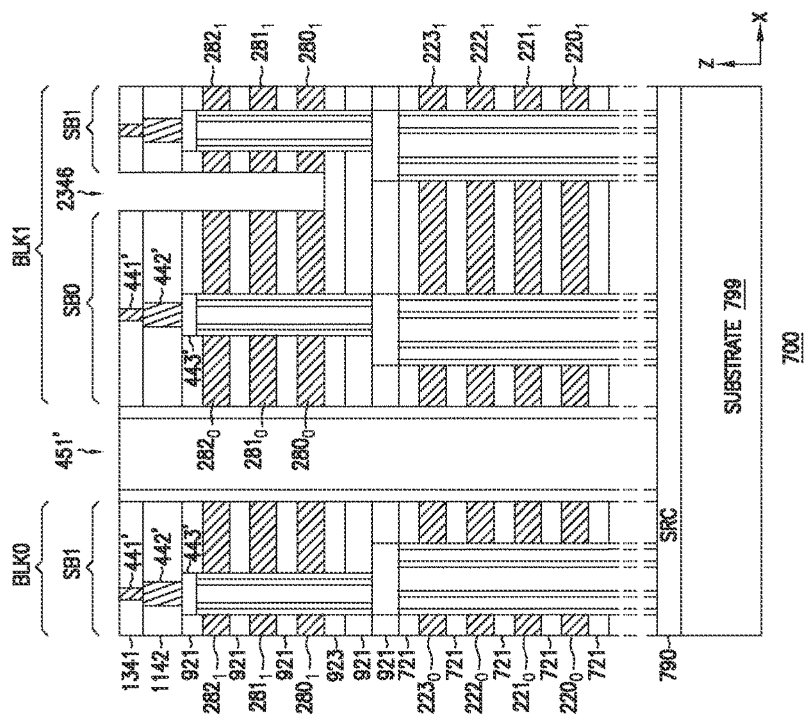
Figure 23C:
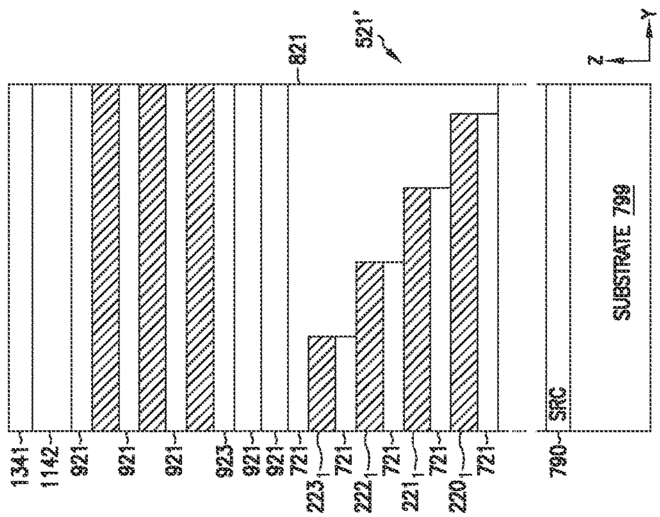

FIG. 23A, FIG. 23B, and FIG. 23C show memory device 700 after a trench (e.g., opening) 2346 is formed. As shown in FIG. 23A, trench 2346 can be formed such that it has a bottom at dielectric material 923 (e.g., carbon nitride) 923. An etch process can be used to remove (e.g., etch) the materials at the location at trench 2346 and stop at dielectric material 923.

As shown in FIG. 23A, trench 2346 can divide (e.g., separate) conductive regions 1980 (FIG. 22A) into separate portions (that are electrically separated from each other) to form select lines (e.g., drain select lines) of respective sub-blocks of block BLK0 and BLK1. For example, trench 2346 can divide conductive regions 1980 (labeled in FIG. 22A) in block BLK1 into separate portions to form select lines $\mathbf{280}_0$, $\mathbf{281}_0$, and $\mathbf{282}_0$ (FIG. 23A) of sub-block SB0 of block BLK1, and select lines $\mathbf{280}_1$, $\mathbf{281}_1$, and $\mathbf{282}_1$ of sub-block SB1 of block BLK1. Select lines $\mathbf{280}_0$, $\mathbf{281}_0$, and $\mathbf{282}_0$ in block BLK1 are similar to (e.g., can correspond to) select lines $\mathbf{280}_0$, $\mathbf{281}_0$, and $\mathbf{282}_0$, respectively, in block BLK1 of FIG. 4A. Select lines $\mathbf{280}_1$, $\mathbf{281}_1$, and $\mathbf{282}_1$ in block BLK1 are similar to (e.g., can correspond to) select lines $\mathbf{280}_1$, $\mathbf{281}_1$, and $\mathbf{282}_1$, respectively, in block BLK1 of FIG. 4A.

The processes associated FIG. 23A, FIG. 23B, and FIG. 23C can also form a trench (not shown) in block BLK0 to divide conductive regions 1980 (labeled in FIG. 22A) in BLK0 into separate portions to form select lines $\mathbf{280}_1$, $\mathbf{281}_1$, and $\mathbf{282}_1$ (FIG. 23A) of sub-block SB1 of block BLK0, and select lines (not shown) of other sub-blocks (not shown) of block BLK0. Select lines $\mathbf{280}_1$, $\mathbf{281}_1$, and $\mathbf{282}_1$ in block BLK0 are similar to (e.g., can correspond to) select lines $\mathbf{280}_1$, $\mathbf{281}_1$, and $\mathbf{282}_1$, respectively, in block BLK0 of FIG. 4A.

Figures 24A, 24B, 24C:
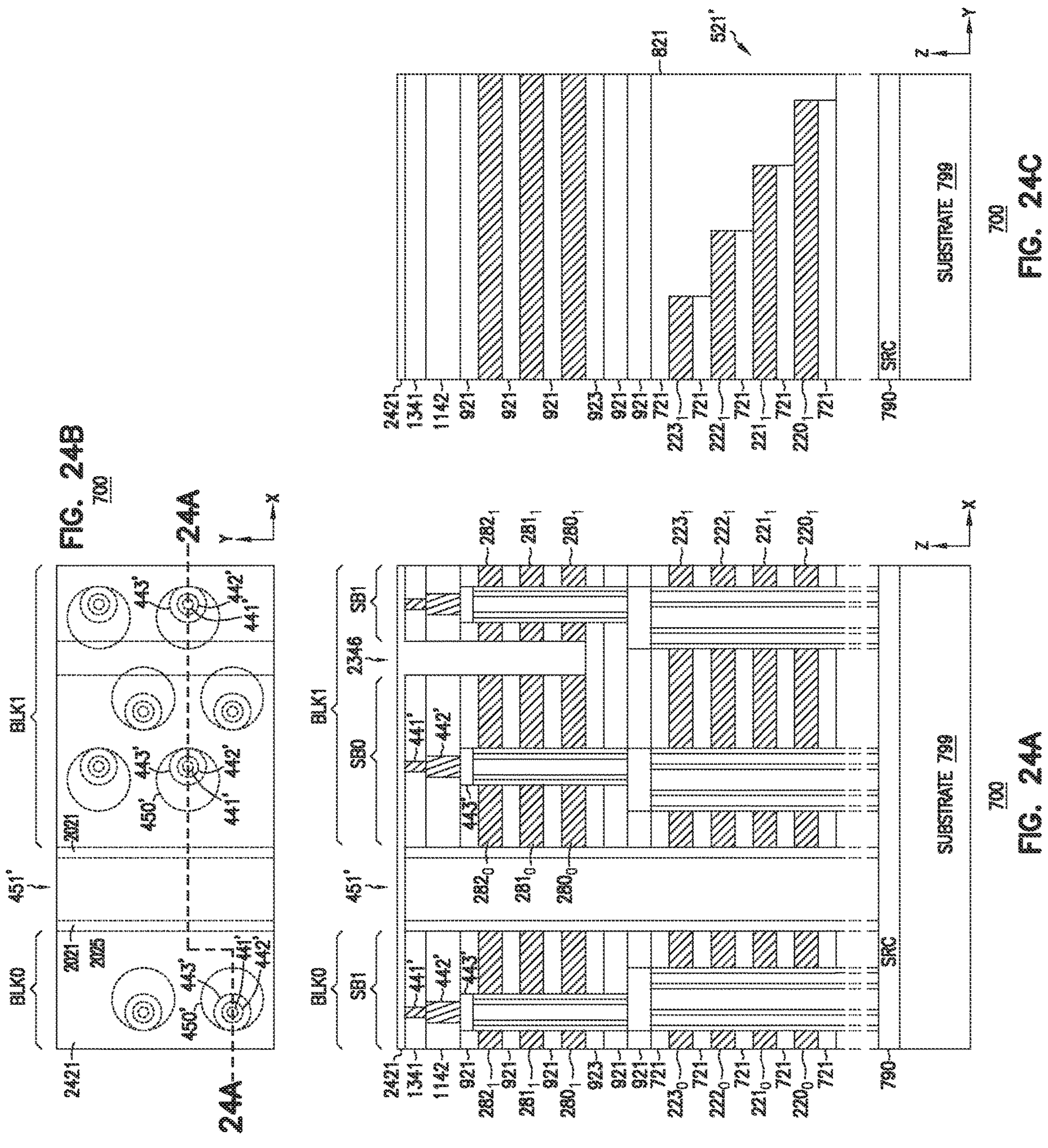

FIG. 24A, FIG. 24B, and FIG. 24C show memory device 700 after a dielectric material (e.g., silicon dioxide) 2421 is formed in trench 2346 and over other elements of memory device 700.

Figures 25A, 25B, 25C:
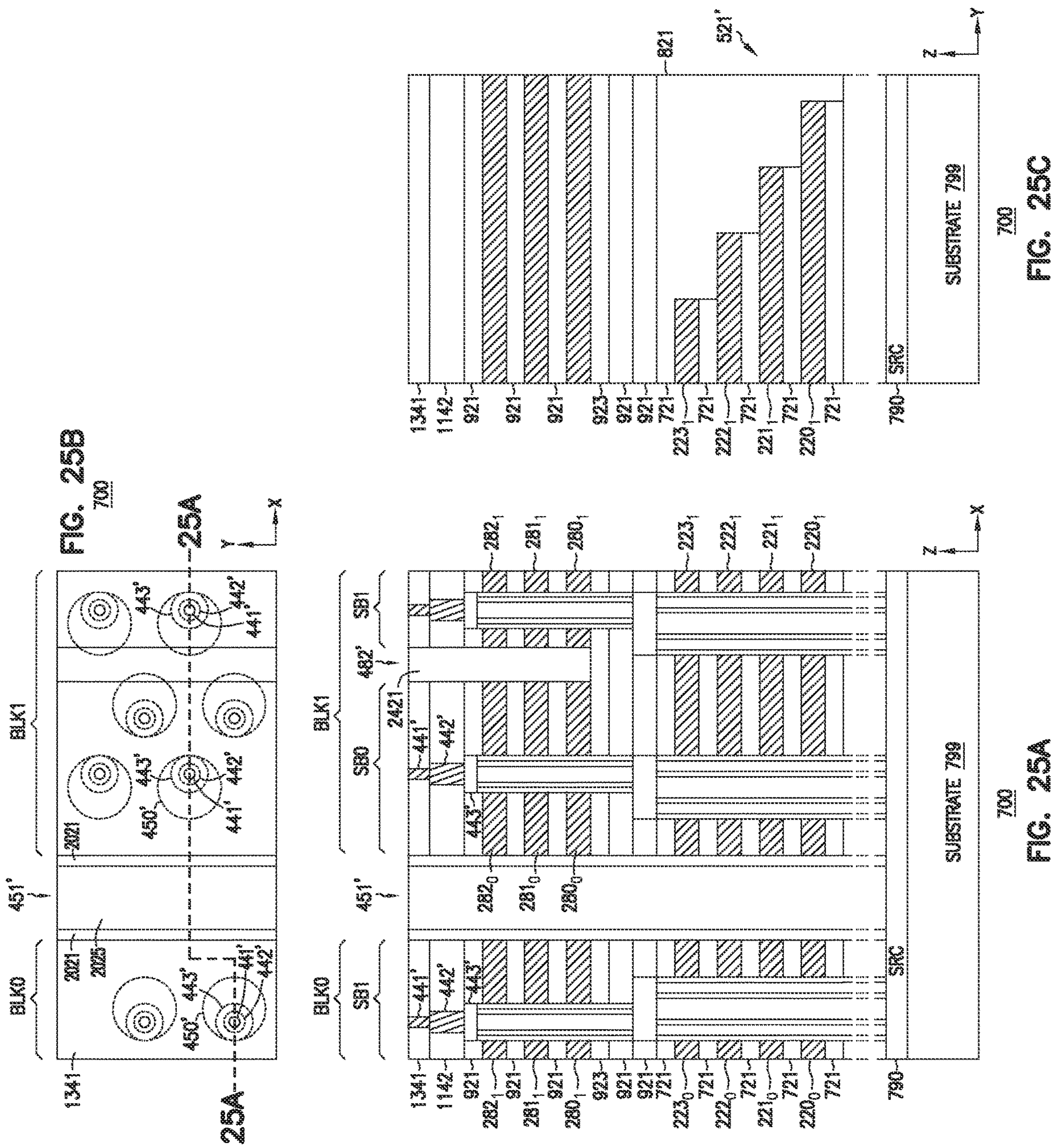

FIG. 25A, FIG. 25B, and FIG. 25C show memory device 700 after a dielectric structure 482' is formed. Dielectric structure 482' is similar to (e.g., can correspond to) dielectric structure 482 of FIG. 4A. Forming dielectric structure 482' can include performing a CMP process to remove a portion (top portion shown in FIG. 24A) of dielectric material 2421. The remaining portion of dielectric material 2421 forms dielectric structure 482' that separates select lines $\mathbf{280}_0$, $\mathbf{281}_0$, and $\mathbf{282}_0$ of sub-block SB0 of block BLK1 from select lines $\mathbf{280}_1$, $\mathbf{281}_1$, and $\mathbf{282}_1$ of sub-block SB1 of block BLK1.

Figures 26A, 26B, 26C:
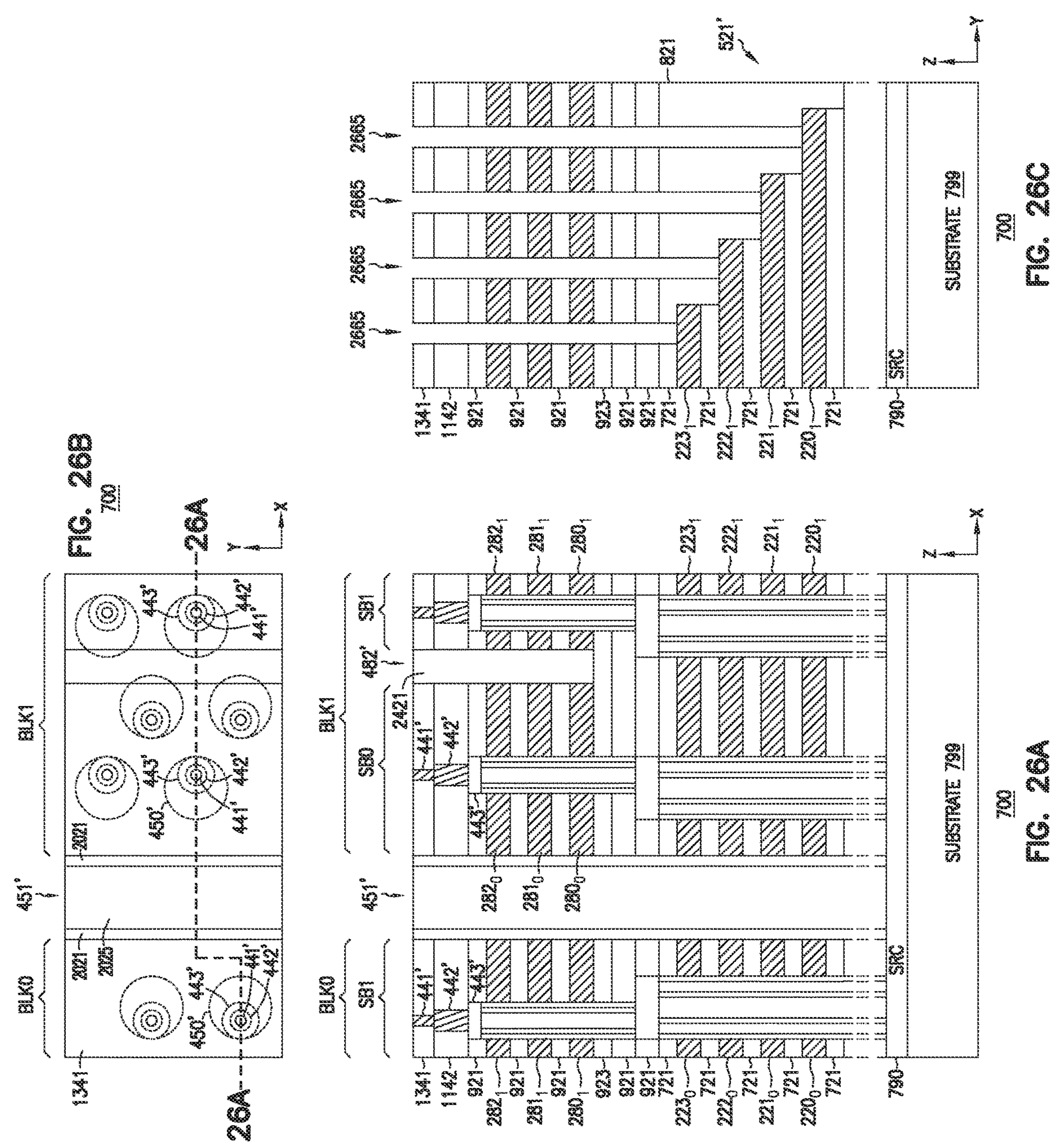

FIG. 26A, FIG. 26B, and FIG. 26C show memory device 700 after openings (e.g., holes) 2665 are formed in staircase structure 521'. Forming openings 2665 can include removing (e.g., etching) portions of the materials at staircase structure 521' (as shown in FIG. 25C), such that respective portions of control gates $\mathbf{220}_1$, $\mathbf{221}_1$, $\mathbf{222}_1$, and $\mathbf{223}_1$ at staircase structure 521' can be exposed at respective openings 2665.

Figures 27A, 27B, 27C:
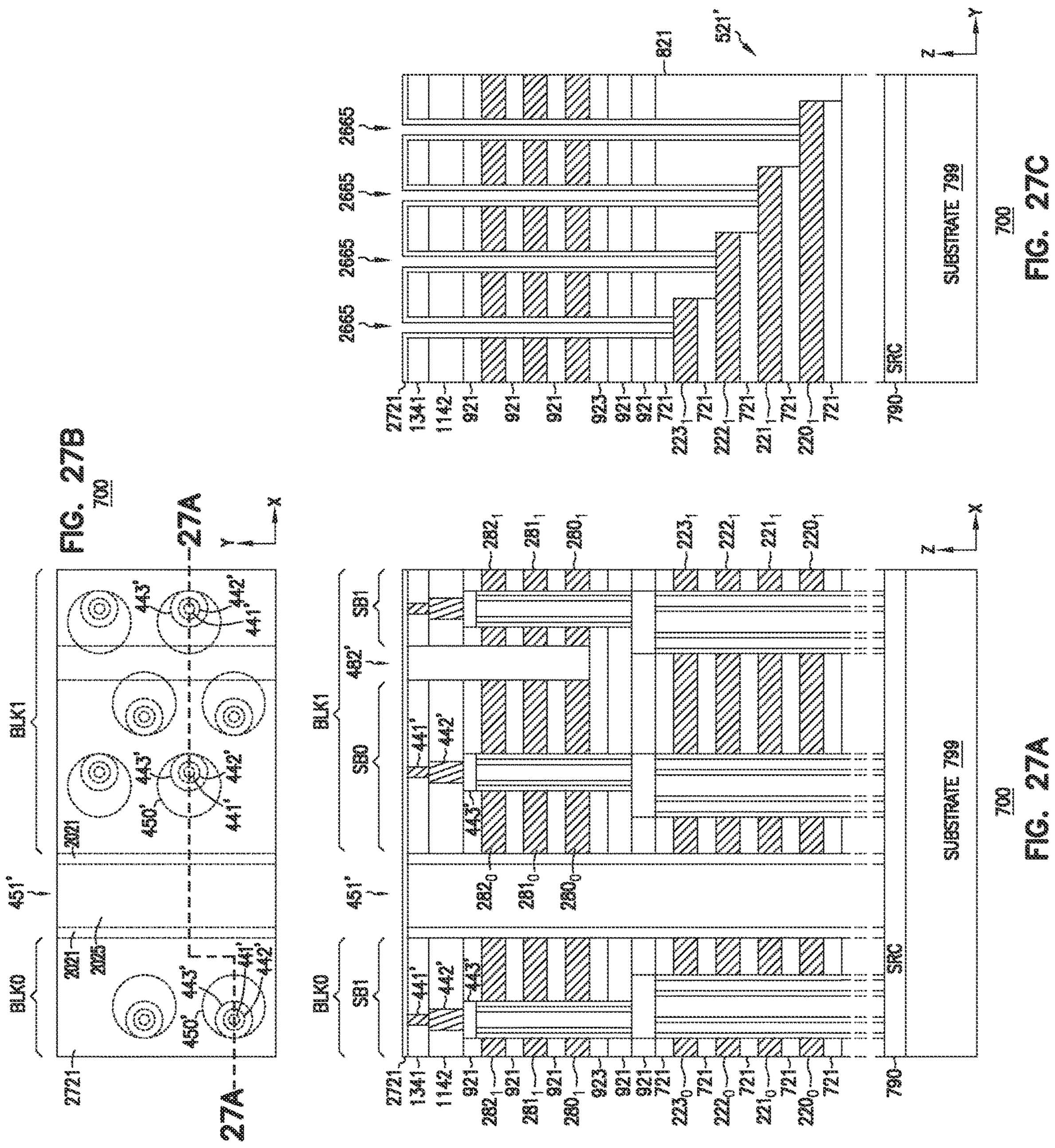

FIG. 27A, FIG. 27B, and FIG. 27C show memory device 700 after a dielectric material (e.g., liner material) 2721 is formed on sidewalls (not labeled) of openings 2665. Forming dielectric material 2721 can include forming a dielectric material (e.g., silicon dioxide) in openings 2665 (e.g., on sidewalls and on the bottom of openings 2665) then removing (e.g., punching) a bottom portion of the dielectric material 2721 at openings 2665 to expose respective portions of control gates $\mathbf{220}_1$, $\mathbf{221}_1$, $\mathbf{222}_1$, and $\mathbf{223}_1$ at openings 2665, as shown in FIG. 27C.

Figures 28A, 28B, 28C:
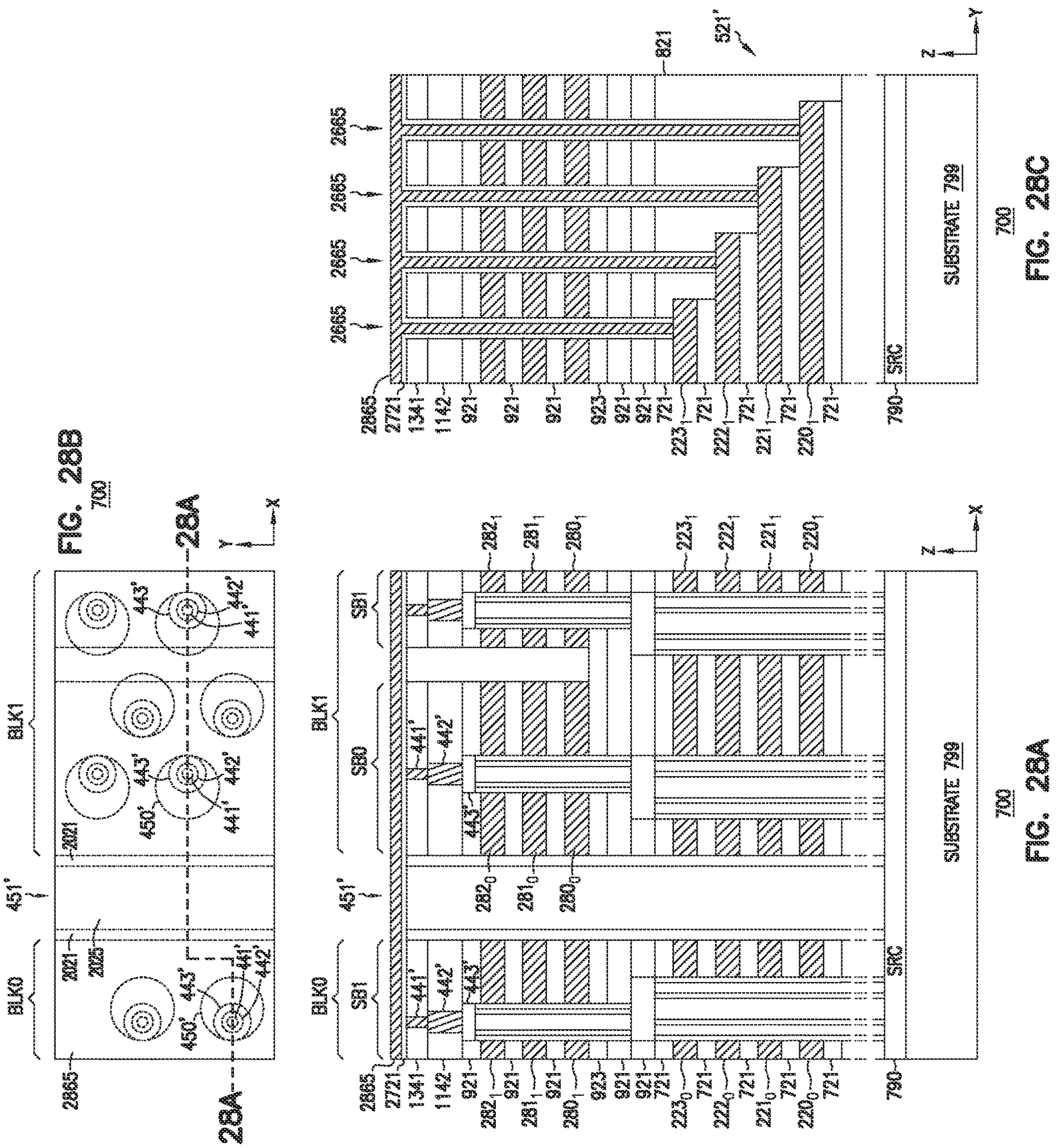

FIG. 28A, FIG. 28B, and FIG. 28C show memory device 700 after a conductive material 2865 is formed in openings 2665 (between dielectric material 2721 on sidewalls of openings 2665) and over dielectric material 2721. Conductive material 2865 can contact (e.g., can be directly coupled to or electrically coupled to) respective portions of control gates $\mathbf{220}_1$, $\mathbf{221}_1$, $\mathbf{222}_1$, and $\mathbf{223}_1$ at staircase structure 521'. Conductive material 2865 can include metal (e.g., tungsten) or other conductive materials.

Figures 29A, 29B, 29C:
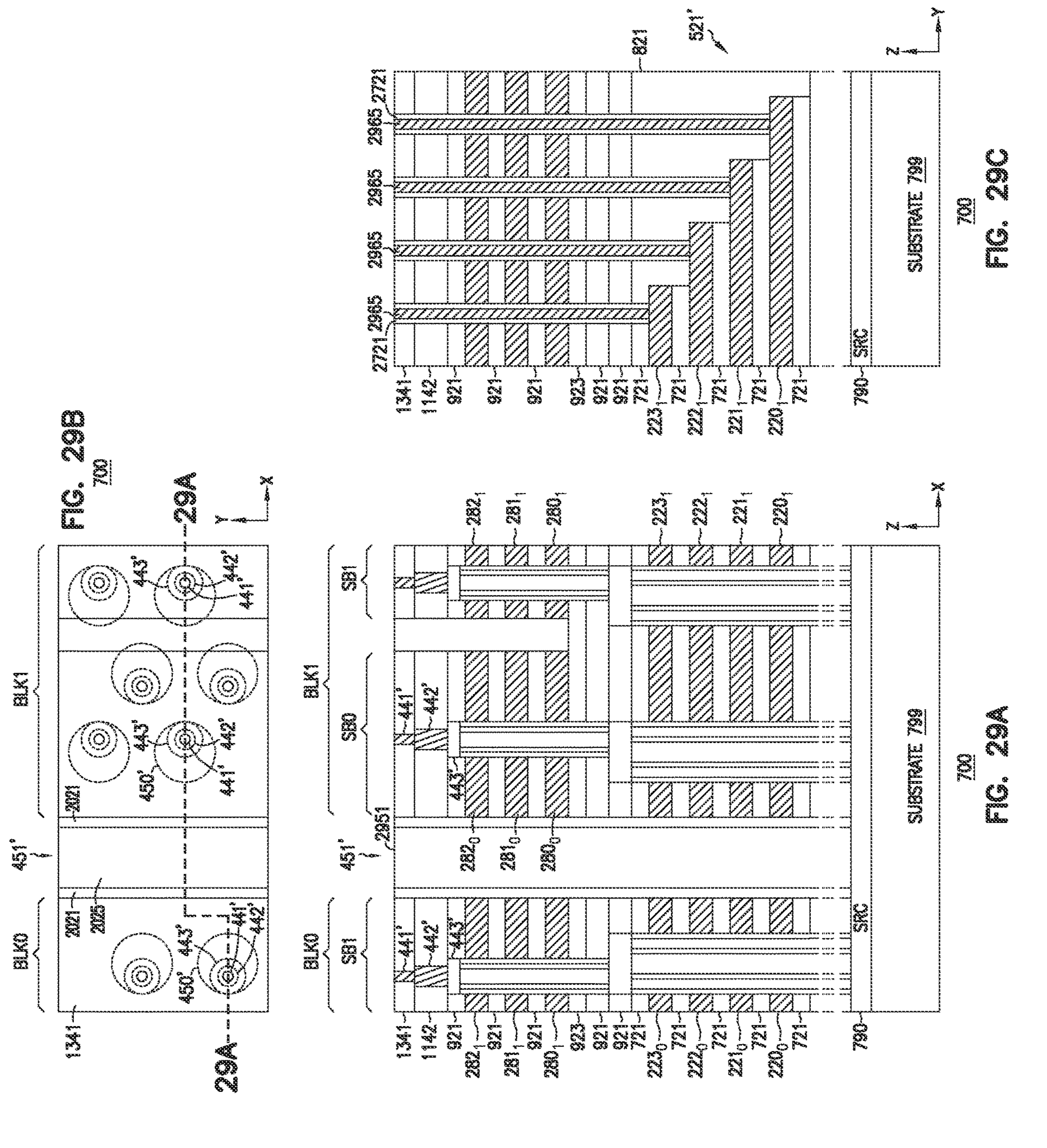

FIG. 29A, FIG. 29B, and FIG. 29C show memory device 700 after conductive contacts (e.g., word line contacts) 2965 are formed. Conductive contacts 2965 can contact (e.g., can be directly coupled to or electrically coupled to) respective portions of control gates $\mathbf{220}_1$, $\mathbf{221}_1$, $\mathbf{222}_1$, and $\mathbf{223}_1$ at staircase structure 521' and electrically separated from control gates $\mathbf{220}_1$, $\mathbf{221}_1$, $\mathbf{222}_1$, and $\mathbf{223}_1$ by dielectric material 2721. Forming conductive contacts 2965 can include performing a CMP process to remove a portion (top portion shown in FIG. 28A) of each of conductive material 2865 and dielectric material 2721. The remaining portion of conductive material 2865 forms conductive contacts 2965. As shown in FIG. 29A, conductive contacts 441', conductive contacts 2965, and dielectric structure 451' can have respective portions (e.g., top regions, top surfaces, or top areas) that are exposed after the CMP process is performed. For example, dielectric structure 451' can have a portion (e.g., top region, top surface, or top area) 2951 that is exposed after the processes associated with FIG. 29A, FIG. 29B, and FIG. 29C.

In subsequent processes, conductive lines (e.g., data lines) can be formed on conductive contacts 441', conductive contacts 2965, and dielectric structure 451', such that the conductive lines can contact (e.g., directly coupled to) conductive contacts 441', conductive contacts 2965, and dielectric structure 451', at respective exposed portions of conductive contacts 441', conductive contacts 2965, and dielectric structure 451', As shown in FIG. 29A and FIG. 29C, the exposed portions of conductive contacts 441', conductive contacts 2965, and dielectric structure 451' can be at the same level in the Z-direction (e.g., same as the level of portion 2951 of dielectric structure 451'). Thus, the conductive lines (e.g., data lines), which will be formed on conductive contacts 441', conductive contacts 2965, and dielectric structure 451', can contact conductive contacts 441', conductive contacts 2965, and dielectric structure 451' at portions (e.g., exposed portions shown in FIG. 29A) that are located on the same level (e.g., the level of portion 2951 of dielectric structure 451').

Figure 30B:
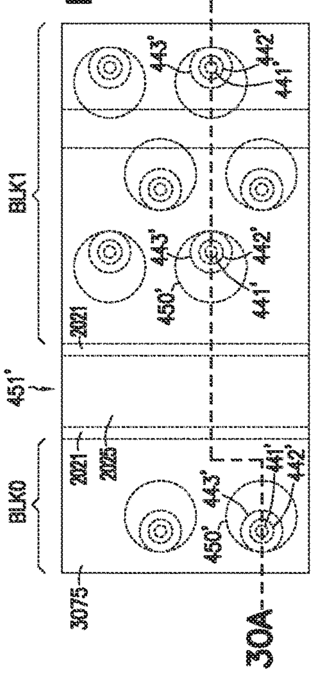
Figure 30A:
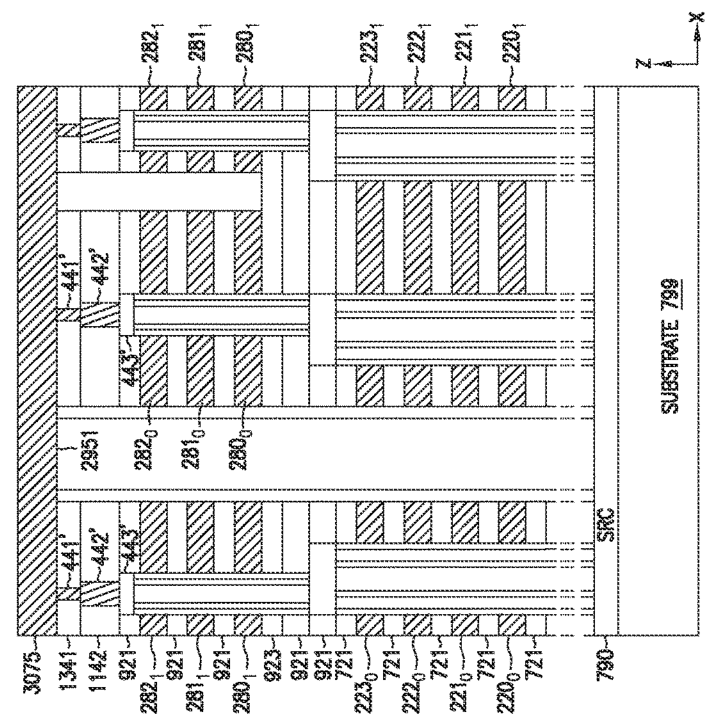
Figure 30C:
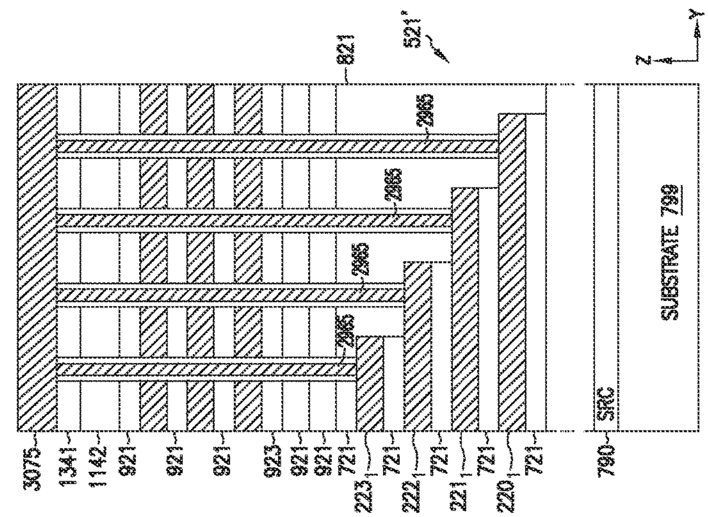

FIG. 30A, FIG. 30B, and FIG. 30C show memory device 700 after a conductive material 3075 is formed. Conductive material 3075 can contact (e.g., can be directly coupled to or electrically coupled to) conductive contacts 441' and conductive contacts 2965 and contact (e.g., directly coupled to) dielectric structure 451'. Conductive material 3075 can include metal or other conductive materials. As shown in FIG. 30A, conductive material 3075 can contact conductive contacts 441', conductive contacts 2965, and dielectric structure 451' at the same level as the level of portion 2951 of dielectric structure 451'.

Figure 31B:
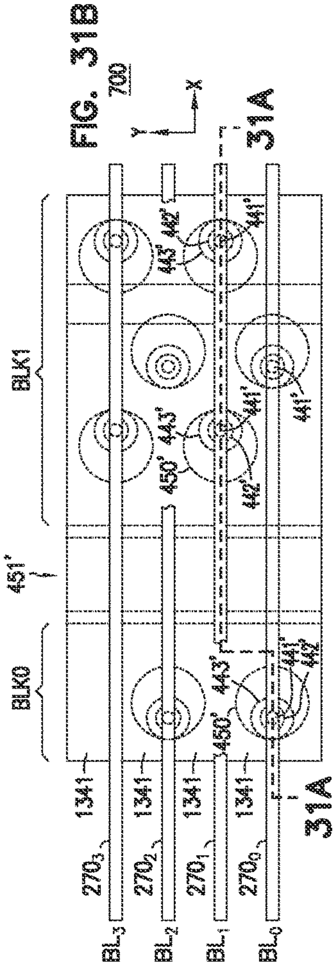
Figure 31A:
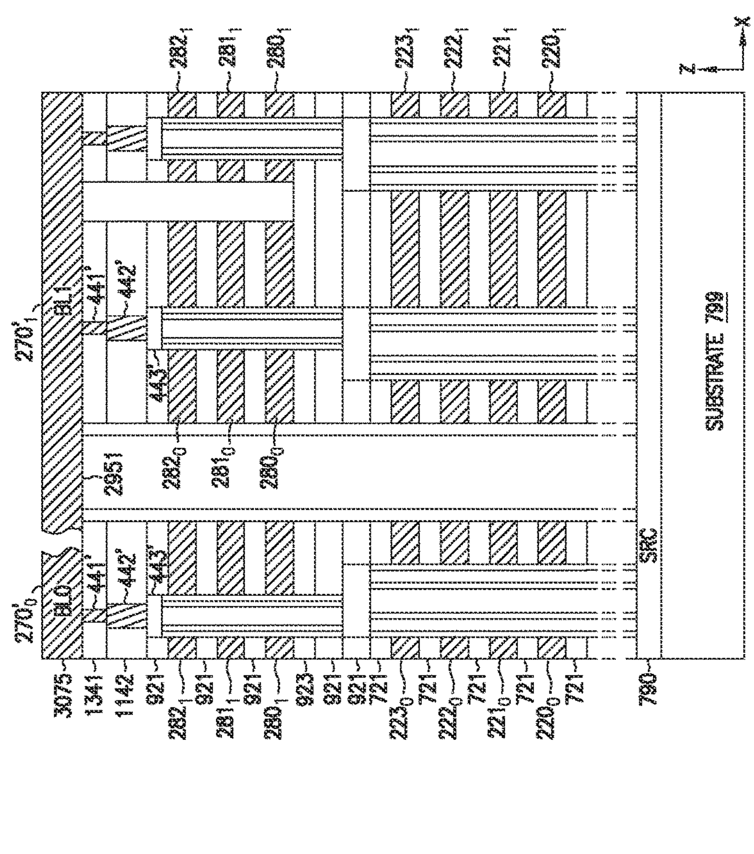
Figure 31C:
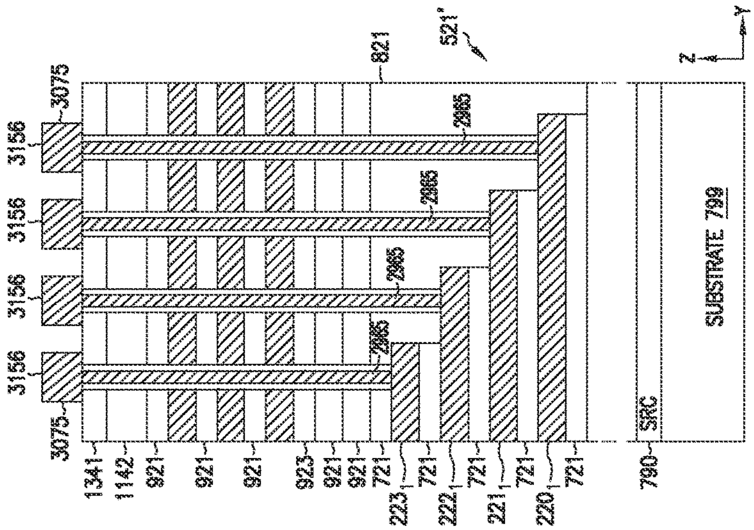

FIG. 31A, FIG. 31B, and FIG. 31C show memory device 700 after data lines $\mathbf{270}_0$, $\mathbf{270}_1$, $\mathbf{270}_2$, and $\mathbf{270}_3$, and conductive lines 3156 are formed. Data lines $\mathbf{270}_0$, $\mathbf{270}_1$, $\mathbf{270}_2$, and $\mathbf{270}_3$ are similar to the data lines (e.g., data lines $\mathbf{270}_0$ through $\mathbf{270}_N$) of memory device 200 in FIG. 5. Conductive lines 3156 are similar to conductive lines 556 of memory device 200 of FIG. 6.

Figure 32B:
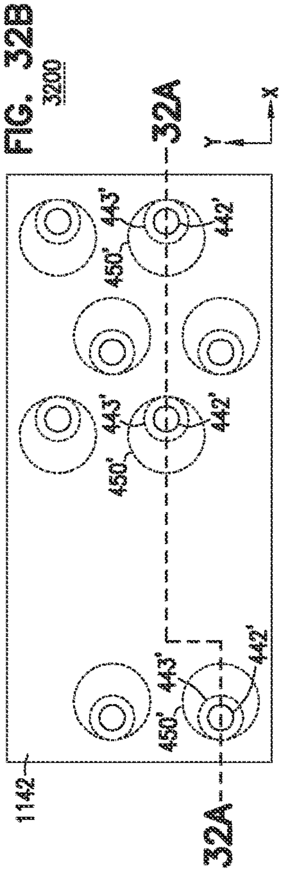

For simplicity and for ease of viewing the elements of memory device 700 from a side view (FIG. 31A) and from a top view (FIG. 30B), some of the data lines (which are conductive lines) $\mathbf{270}_0$, $\mathbf{270}_1$, $\mathbf{270}_2$, and $\mathbf{270}_3$ are partially shown in FIG. 31A and FIG. 32B. However, data lines $\mathbf{270}_0$, $\mathbf{270}_1$, $\mathbf{270}_2$, and $\mathbf{270}_3$ can be located over (in the Z-direction) and fully extend across (in the X-direction) the blocks (e.g., blocks BLK0 and BLK1) of memory device 700, such that each of data lines $\mathbf{270}_0$, $\mathbf{270}_1$, $\mathbf{270}_2$, and $\mathbf{270}_3$ can contact (e.g., can be directly coupled to) dielectric structure 451', contact (e.g., can be directly coupled to or electrically coupled to) at least one conductive structure 441' in block BLK0, and contact (e.g., can be directly coupled to or electrically coupled to) at least one conductive structure 441' in block BLK1.

As shown in FIG. 31A and FIG. 31B, each of data lines $\mathbf{270}_0$, $\mathbf{270}_1$, $\mathbf{270}_2$, and $\mathbf{270}_3$ can contact (e.g., directly coupled to) dielectric structure 451' at portion 2951 of dielectric structure 451' and contact (e.g., can be directly coupled to or electrically coupled to) respective conductive contacts 441' in blocks BLK0 and BLK1. For example, as shown in FIG. 31B, data line $\mathbf{270}_0$ can contact dielectric structure 451' and conductive contacts 441' in blocks BLK0 and BLK1.

Forming data lines $\mathbf{270}_0$, $\mathbf{270}_1$, $\mathbf{270}_2$, and $\mathbf{270}_3$ can include removing part of conductive material 3075 (e.g., patterning conductive material 3075) in memory array region 701 (FIG. 7B), such that the remaining part of conductive material 3075 at memory array region 701 can be separated into conductive lines that form respective data lines $\mathbf{270}_0$, $\mathbf{270}_1$, $\mathbf{270}_2$, and $\mathbf{270}_3$. Data lines $\mathbf{270}_0$, $\mathbf{270}_1$, $\mathbf{270}_2$, and $\mathbf{270}_3$ can be formed over (in the Z-direction) and shared by the blocks (e.g., block BL0 and BLK1) of memory device 700.

Forming conductive lines 3156 of block BLK1 can include removing part of conductive material 3075 (e.g., patterning conductive material 3075) over staircase structure 521' (FIG. 31C), such that the remaining part of conductive material 3075 at staircase structure 521' can be separated into remaining portions that form conductive lines 3156 of block BLK1. Conductive lines 3156 of block BLK1 can be electrically separated from (e.g., not shared by) conductive lines (not shown) of other blocks (e.g., block BLK) that can be formed (from conductive material 3075) concurrently with conductive lines 3156 of block BLK1.

Conductive lines 3156 of block BLK1 can be part of conductive routings that can be coupled to peripheral circuitry (e.g., word line drivers in substrate 799) of memory device 700. Conductive lines 3156 of block BK1 can be structured to provide signals (e.g., word line signals) to respective control gates $\mathbf{220}_1$, $\mathbf{221}_1$, $\mathbf{222}_1$, and $\mathbf{223}_1$ (through respective conductive contacts 2965) of block BLK1.

As shown in FIG. 31C, conductive contacts 2965 can have a relatively straight sidewall (without the presence of a notch or necking on the sidewall) throughout the respective lengths of conductive contacts 2965 between conductive lines 3156 and respective control gates $\mathbf{220}_1$, $\mathbf{221}_1$, $\mathbf{222}_1$, and $\mathbf{223}_1$. The relatively straight sidewalls of conductive contacts 2965 can be a result of forming the structure (e.g., the entire vertical structure in the Z-direction) of conductive contacts 2965 in the same process (e.g., formed concurrently in the same process associated with FIG. 29C) and after conductive contacts 441' and 442' are formed. A notch may be present on the sidewall of a respective conductive contacts 2965 if a portion (e.g., a top portion between the levels of dielectric materials 1341 and 1142) of conductive contacts 2965 is formed with the same process that forms conductive contacts 441'. Forming conductive contacts 2965 in processes different from the processes of forming conductive contacts 441 may avoid poor structure of conductive contacts 2965 and maintain proper connection between conductive contacts 2965 and respective conductive lines 3156.

The description of forming memory device 700 with reference to FIG. 7A through FIG. 31C can include other processes to form a complete memory device (e.g., memory device 700). Such processes are omitted from the above description so as to not obscure the subject matter described herein.

Benefits and improvement of the processes described herein can mitigate misalignment between elements of memory device 700 that may be caused by block bending error. For example, the processes associated with the formation of slit 1751 and the control gates (FIG. 17A, FIG. 18A, and FIG. 19A) may cause block-bending error. However, since the connection between conductive contacts 441' and 442' (e.g., FIG. 15A) is already formed before the formation of slit 1751 and the control gates (FIG. 17A, FIG. 18A, and FIG. 19A), a potential block-bending error may have minimal or no impact (e.g., may not cause misalignment) to the already-formed connection between conductive contacts 441' and 442'. Thus, memory device 700 formed by the processed described above can have a proper connection between conductive contacts 441' and 442'. Therefore, reliability of memory device 700 can be improved or maintained, and improved yield may also be achieved.

FIG. 32A, FIG. 32B, and FIG. 32C through FIG. 55A, FIG. 55B, and FIG. 55C show different views of elements during processes of forming a memory device 3200, according to some embodiments described herein.

Figure 32A:
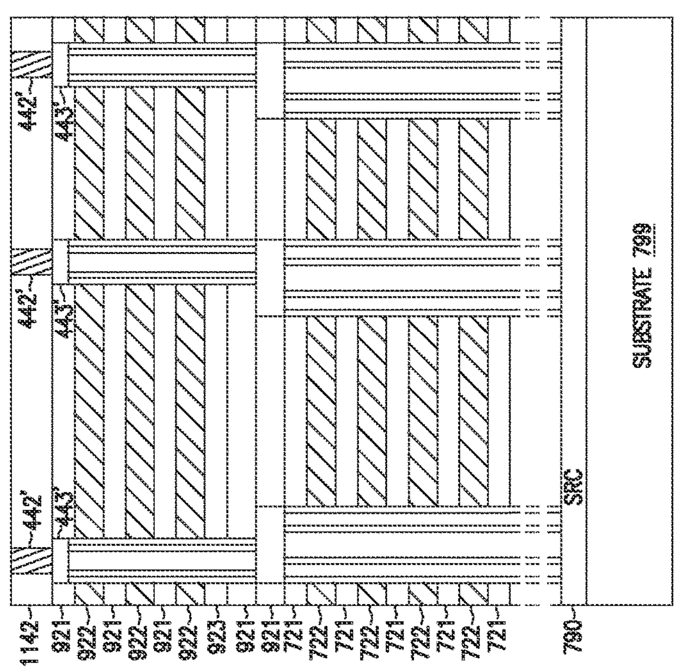
Figure 32C:
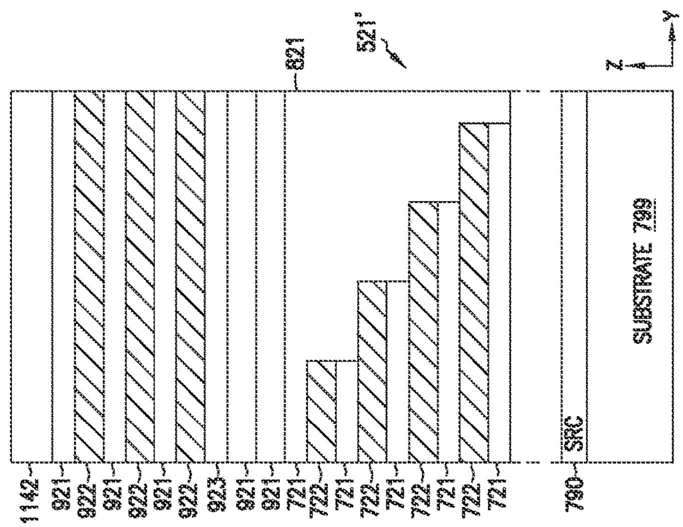

FIG. 32A, FIG. 32B, and FIG. 32C show memory device 3200 after some elements of memory device 3200 are formed. These elements can be the same as the elements of memory device 700 shown in FIG. 12A, FIG. 12B, and FIG. 12C. Thus, the processes of forming memory device 700 from FIG. 7A to FIG. 12C can be used to form the elements of memory device 3200 shown in FIG. 32A, FIG. 32B, and FIG. 32C. For simplicity, such processes are not repeated.

Figures 33A, 33B, 33C:
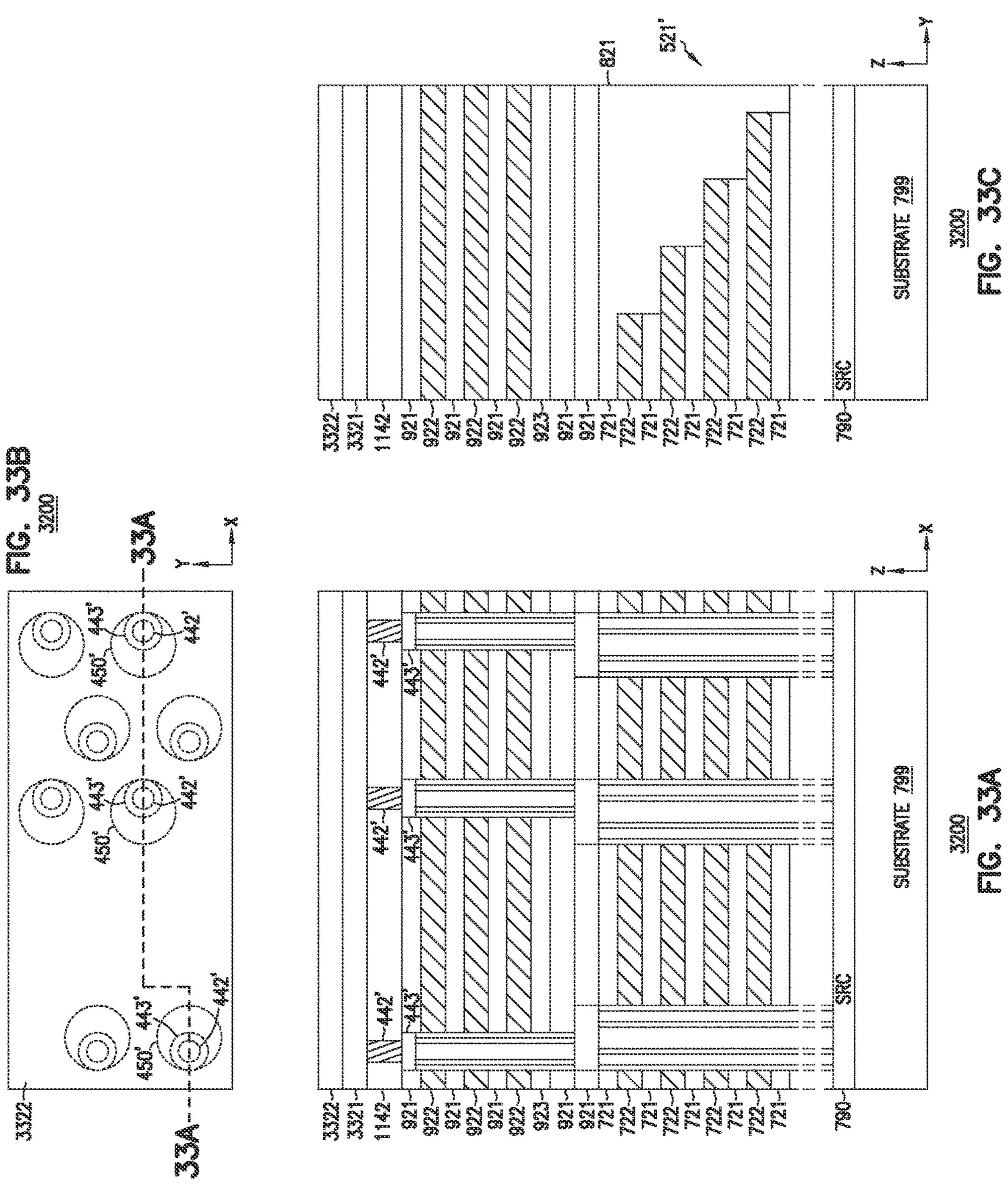

FIG. 33A, FIG. 33B, and FIG. 33C show memory device 3200 after different dielectric material (e.g., silicon dioxide) 3321 and a dielectric material 3322 (e.g., silicon nitride) are formed.

Figure 34C:
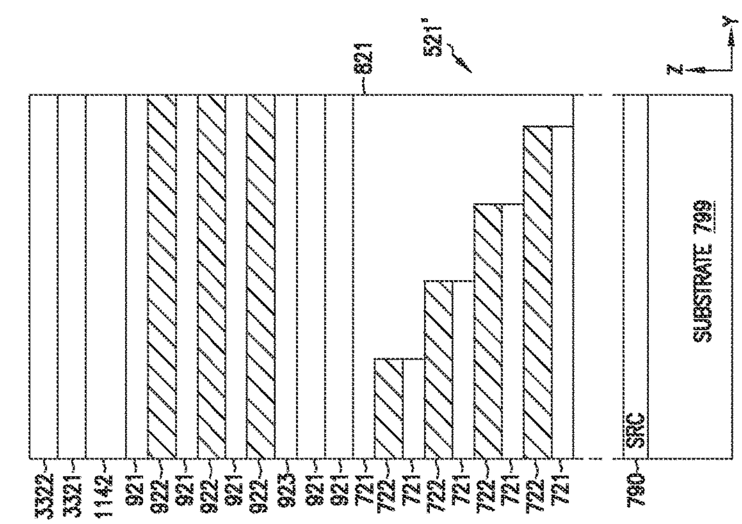
Figure 34B:
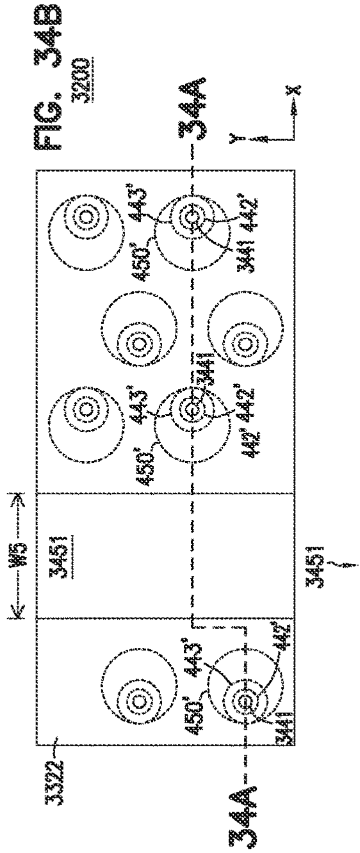
Figure 34A:
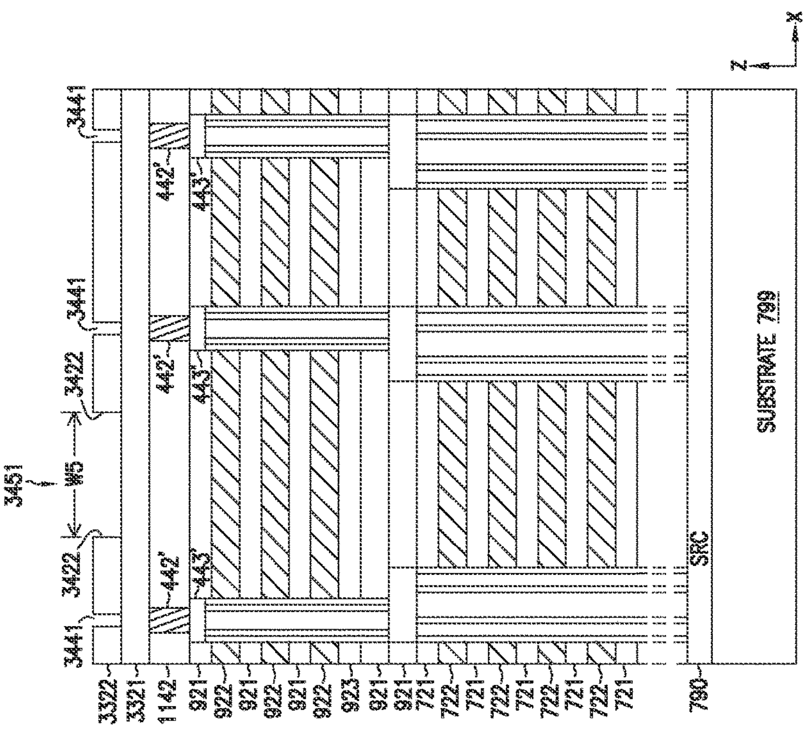

FIG. 34A, FIG. 34B, and FIG. 34C show memory device 3200 after formation of a trench (e.g., opening) 3451 and openings (e.g., holes) 3441 are formed in dielectric material 3322. Trench 3451 can be formed to have a width W5 in the X-direction between sidewalls 3422 of dielectric material 3322. As shown in FIG. 34A, openings 3441 can be formed in (e.g., formed only in) dielectric material 3322 and may not be formed in dielectric material 3321.

Openings 3441 can be formed over (e.g., directly over) respective conductive contacts 442', such that openings 3441 can be aligned (e.g., vertically aligned in the Z-direction) with respective conductive contacts 442'. In subsequent processes, conductive contacts 442' of FIG. 34A can be exposed through openings 5441 (FIG. 54A) at the same locations of respective openings 3441. Then, conductive contacts 441' can be formed on the exposed conductive contacts 442.

Figure 35B:
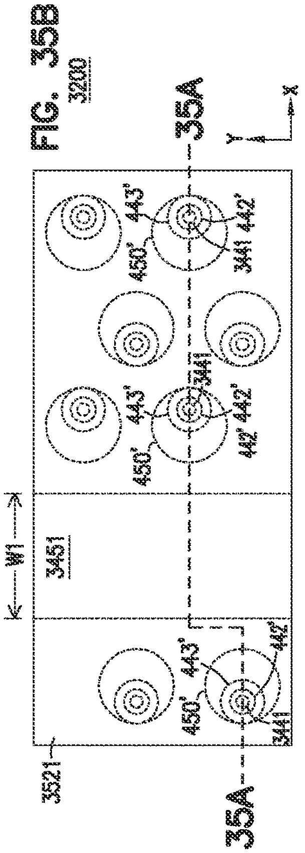
Figure 35C:
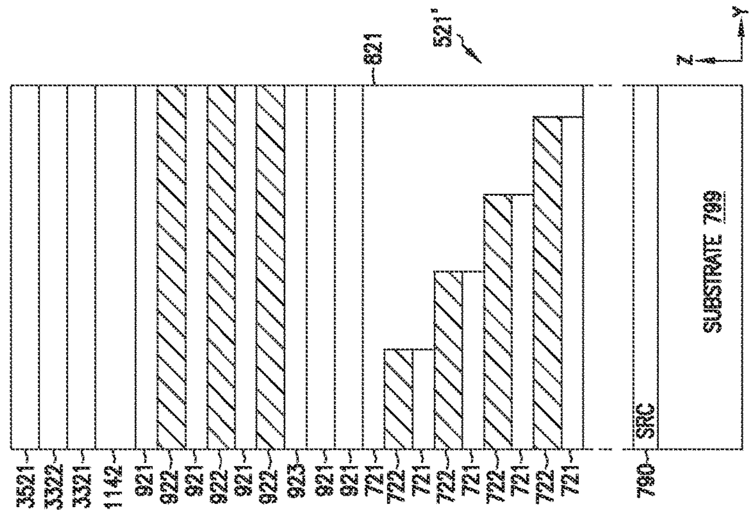
Figure 35A:
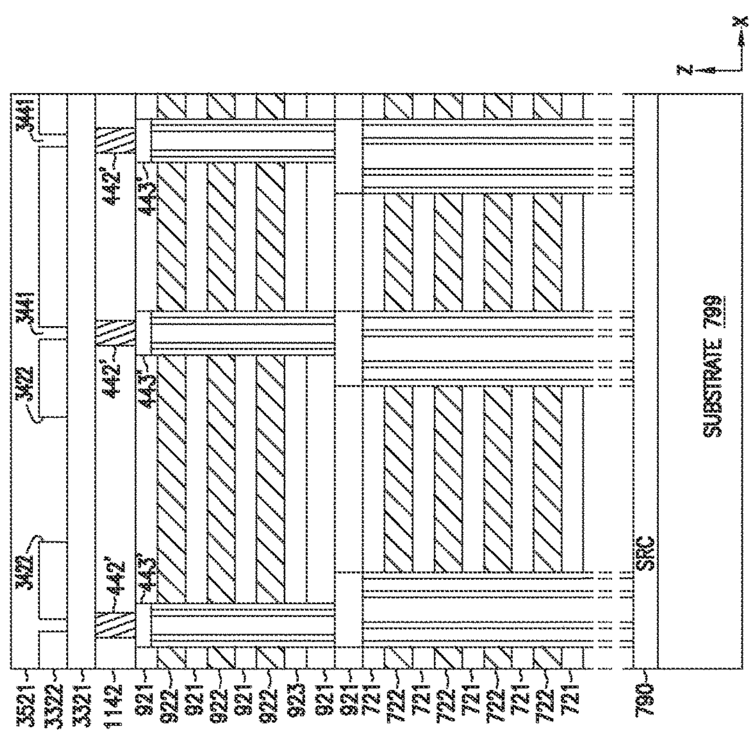

FIG. 35A, FIG. 35B, and FIG. 35C show memory device 3200 after a dielectric material 3521 (e.g., silicon dioxide) is formed in trench 3451 and in openings 3441 and over other elements of memory device 3200.

Figures 36A, 36B, 36C:
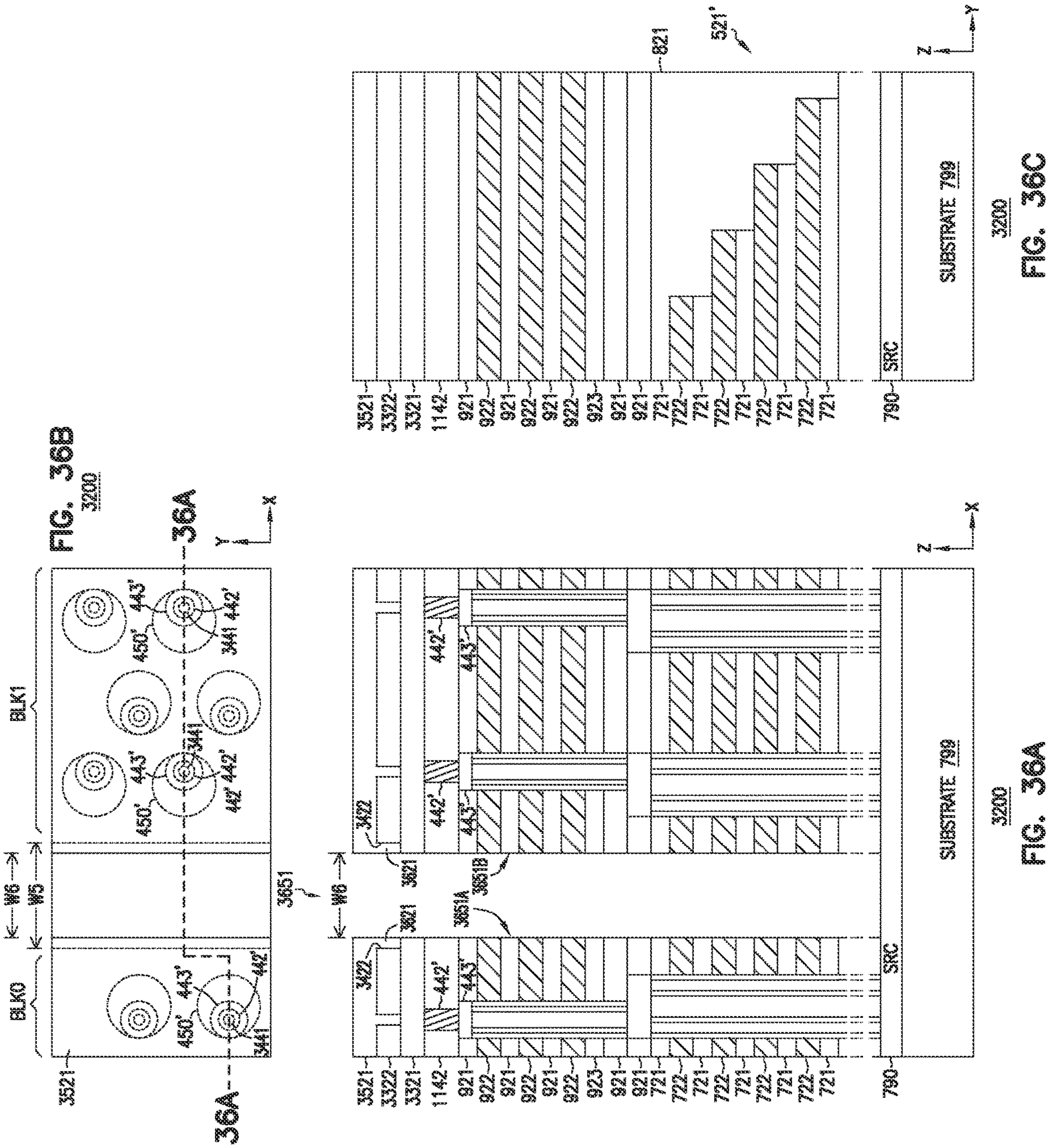

FIG. 36A, FIG. 36B, and FIG. 36C show memory device 3200 after a slit (e.g., an opening, a trench, or a cut) 3651 is formed to separate (e.g., divide) elements of memory device 3200 into portions that are part of respective blocks, such as block BLK0 and BLK1, of memory device 3200.

As shown in FIG. 36A and FIG. 36B, slit 3651 can have a width W6 in the X-direction. Width W6 is less than width W5. Thus, as shown in FIG. 36A and FIG. 36B, sidewalls 3651A and 3651B of slit 3651 can be separated from respective sidewalls 3422 of dielectric material 3322 by respective spacers 3612.

Figure 37B:
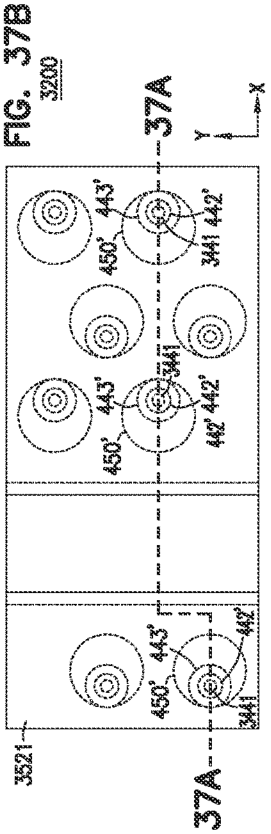
Figure 37A:
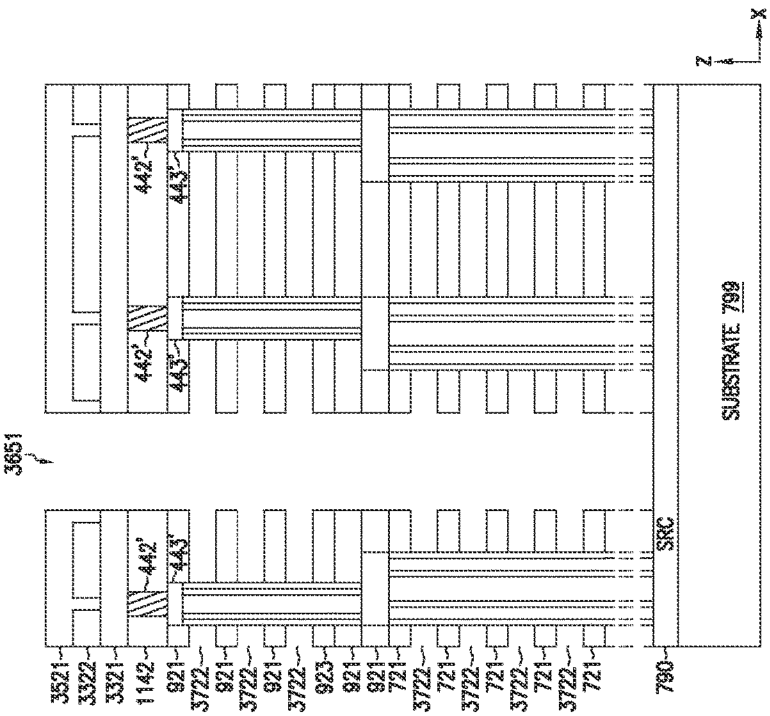
Figure 37C:
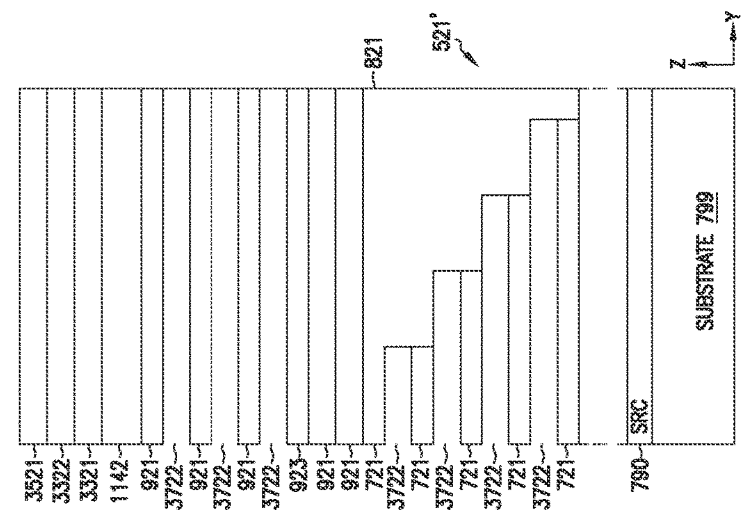

FIG. 37A, FIG. 37B, and FIG. 37C show memory device 3200 after dielectric materials (e.g., silicon nitride) 922 and 722 are removed (e.g., exhumed) from locations 3722. Locations 3722 are empty spaces after dielectric materials 722 and 922 are removed. In subsequent processes, a conductive material (or conductive materials) can be formed in locations 3722 to form respective control gates and select gates (e.g., drain select gates) of memory device 3200.

Figure 38B:
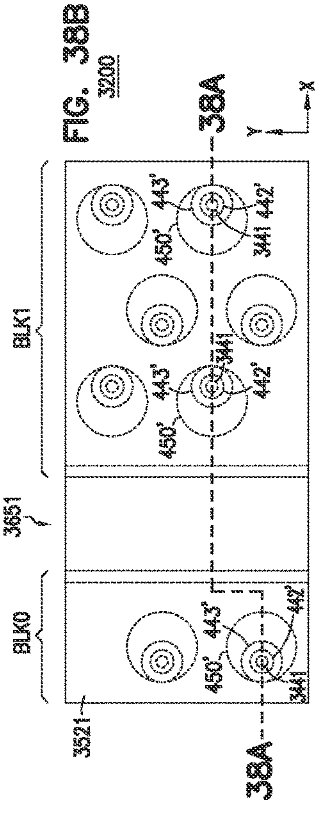
Figure 38A:
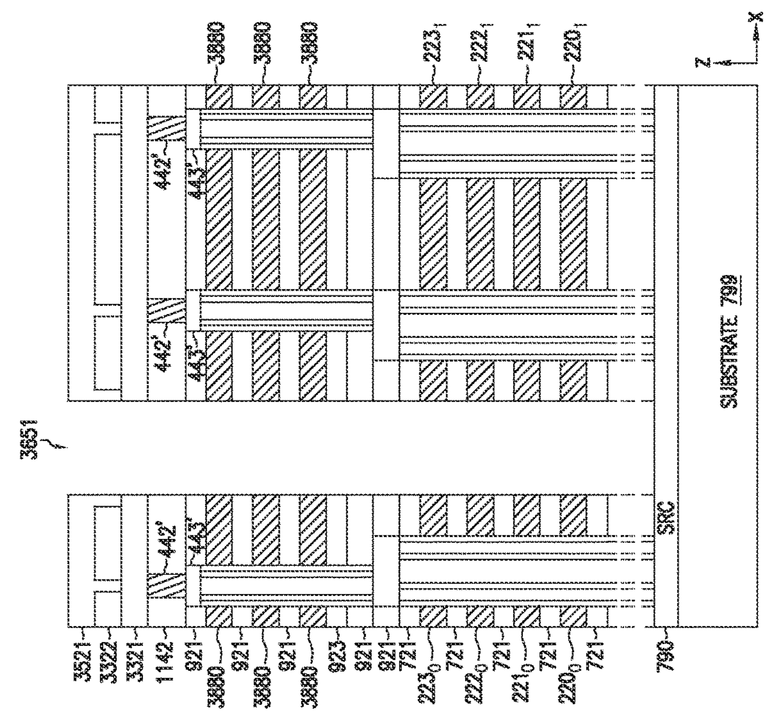
Figure 38C:
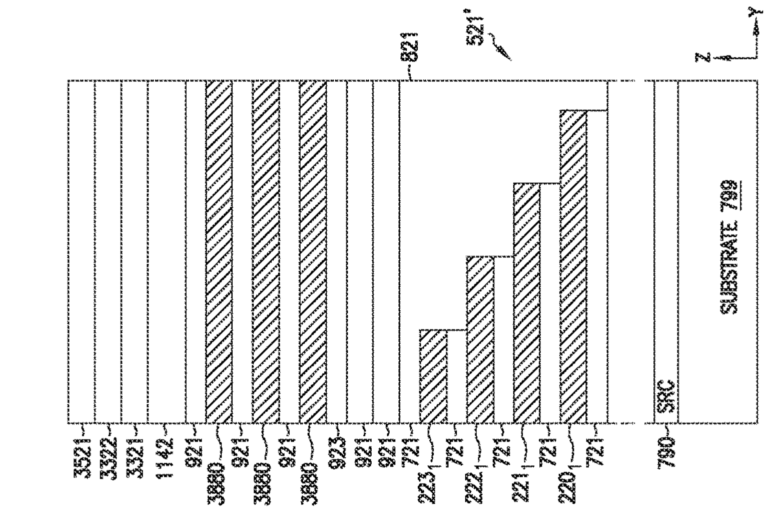

FIG. 38A, FIG. 38B, and FIG. 38C show memory device 3200 after formation of control gates $\mathbf{220_0}$, $\mathbf{221_0}$, $\mathbf{222_0}$, and $\mathbf{223_0}$ in block BLK0, control gates $\mathbf{220_1}$, $\mathbf{221_1}$, $\mathbf{222_1}$, and $\mathbf{223_1}$ in block BLK1, and conductive regions (e.g., levels of conductive materials) 3880.

Control gates $\mathbf{220_0}$, $\mathbf{221_0}$, $\mathbf{222_0}$, and $\mathbf{223_0}$ in block BLK0 are similar to (e.g., can correspond to) control gates $\mathbf{220_0}$, $\mathbf{221_0}$, $\mathbf{222_0}$, and $\mathbf{223_0}$, respectively, of FIG. 4A. Control gates $\mathbf{220_1}$, $\mathbf{221_1}$, $\mathbf{222_1}$, and $\mathbf{223_1}$ in block BLK1 are similar to (e.g., can correspond to) $\mathbf{220_1}$, $\mathbf{221_1}$, $\mathbf{222_1}$, and $\mathbf{223_1}$, respectively, of FIG. 4A. In subsequent processes (FIG. 42A), conductive regions 3880 are divided into separate portions to form select lines (e.g., drain select lines) of respective sub-blocks of memory device 3200.

The process of forming control gates $\mathbf{220_0}$, $\mathbf{221_0}$, $\mathbf{222_0}$, and $\mathbf{223_0}$ in block BLK0, control gates $\mathbf{220_1}$, $\mathbf{221_1}$, $\mathbf{222_1}$, and $\mathbf{223_1}$ in block BLK1, and conductive regions 3880 can include depositing a single conductive material (e.g., tungsten or other metal) in locations 3722 (FIG. 37A). Alternatively, the processes associated with FIG. 38A, FIG. 38B, and FIG. 38C can include forming (e.g., depositing) multiple materials (one at a time) in locations 3722 (FIG. 37A). For example, processes can include depositing aluminum oxide on sidewalls of locations 3722 (FIG. 37A), depositing titanium nitride conformal to the aluminum oxide, and then depositing tungsten (or other suitable conductive material) conformal to the titanium nitride.

Figure 39B:
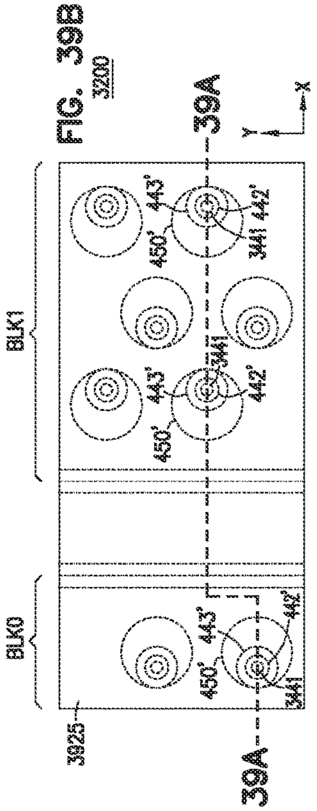
Figure 39A:
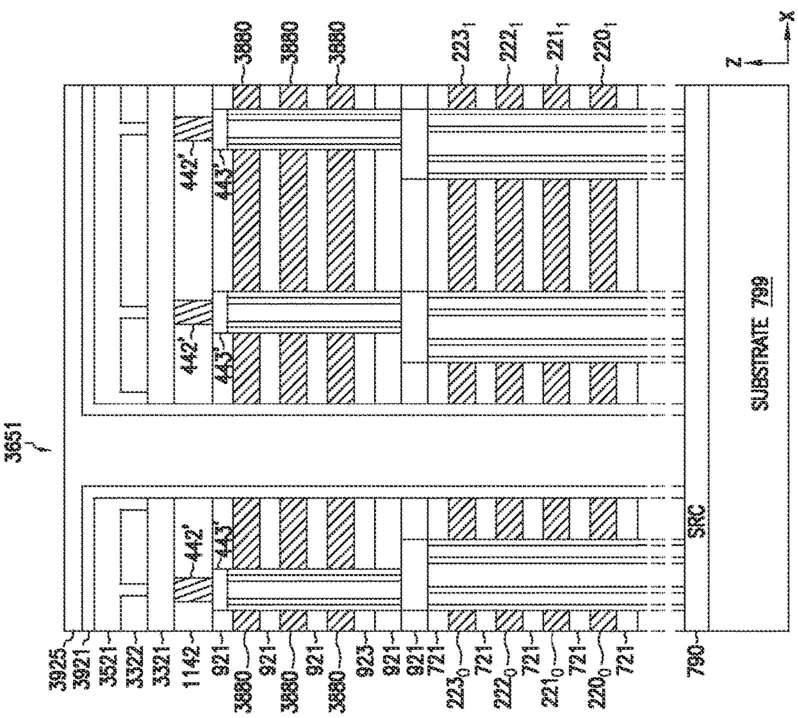
Figure 39C:
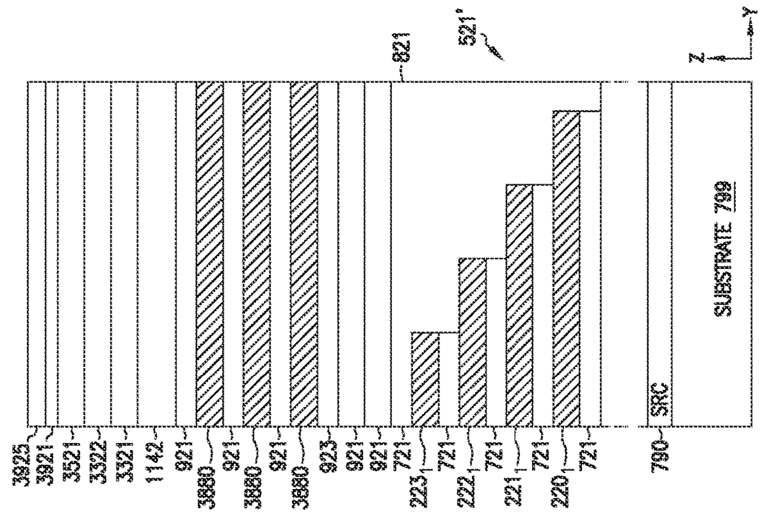

FIG. 39A, FIG. 39B, and FIG. 39C show memory device 3200 after a dielectric material 3921 and a material 3925 are formed in slit 3651 and over other elements of memory device 3200. Dielectric material 3921 can include silicon dioxide or other dielectric materials. Material 3925 can include polysilicon. Alternatively, material 3925 can include a dielectric material.

Figure 40B:
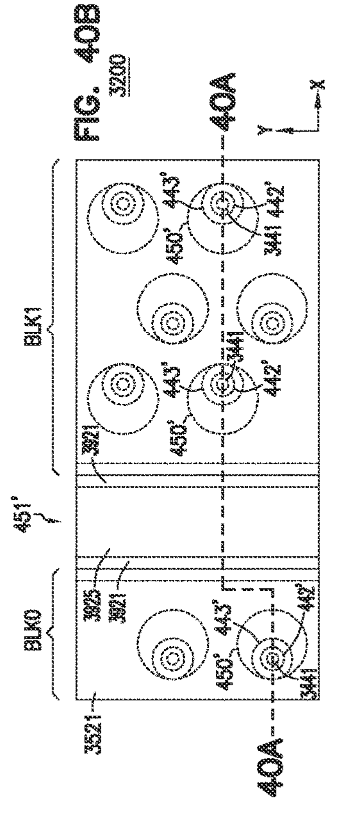
Figure 40A:
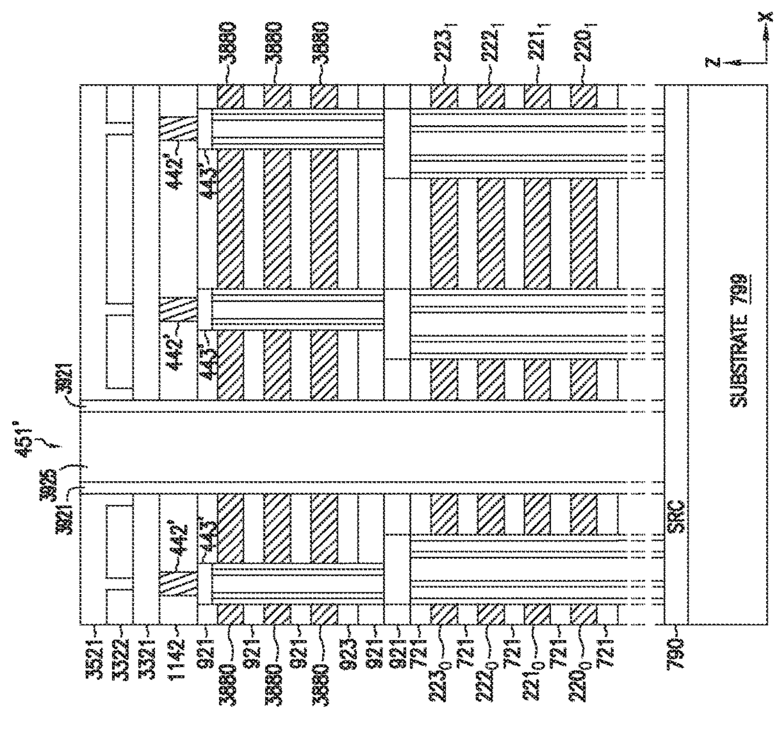
Figure 40C:
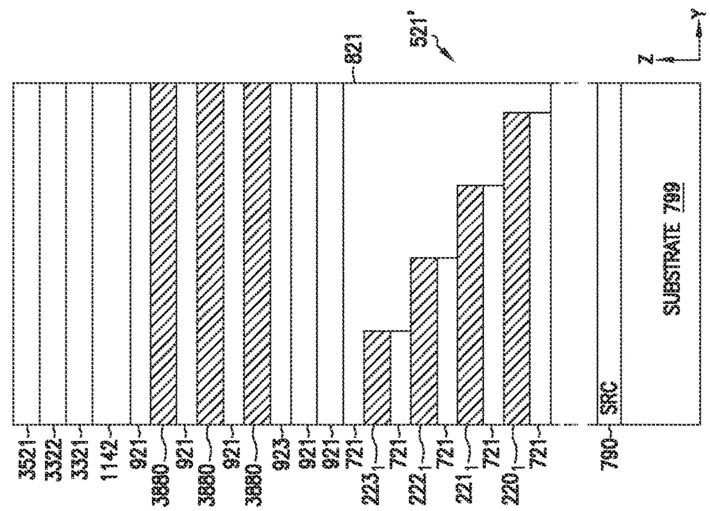

FIG. 40A, FIG. 40B, and FIG. 40C show memory device 3200 after a dielectric structure 451' is formed. Dielectric structure 451' is similar to (e.g., can correspond to) dielectric structure 451 of FIG. 4A. Forming dielectric structure 451' can include performing a CMP process to remove a portion (top portion shown in FIG. 39A) of each of dielectric materials 3921 and material 3925. The remaining portion of dielectric materials 3921 and material 3925 forms dielectric structure 451'.

Figure 41B:
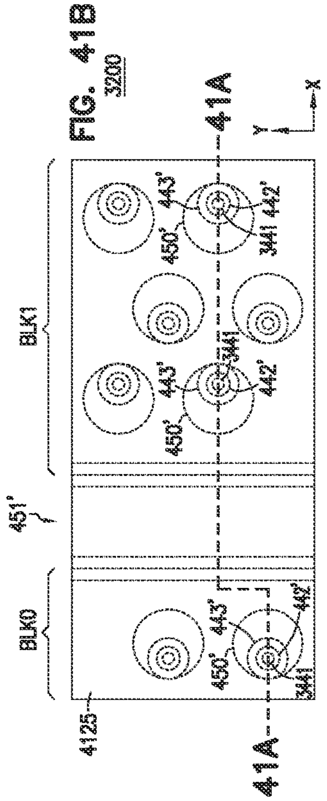
Figure 41A:
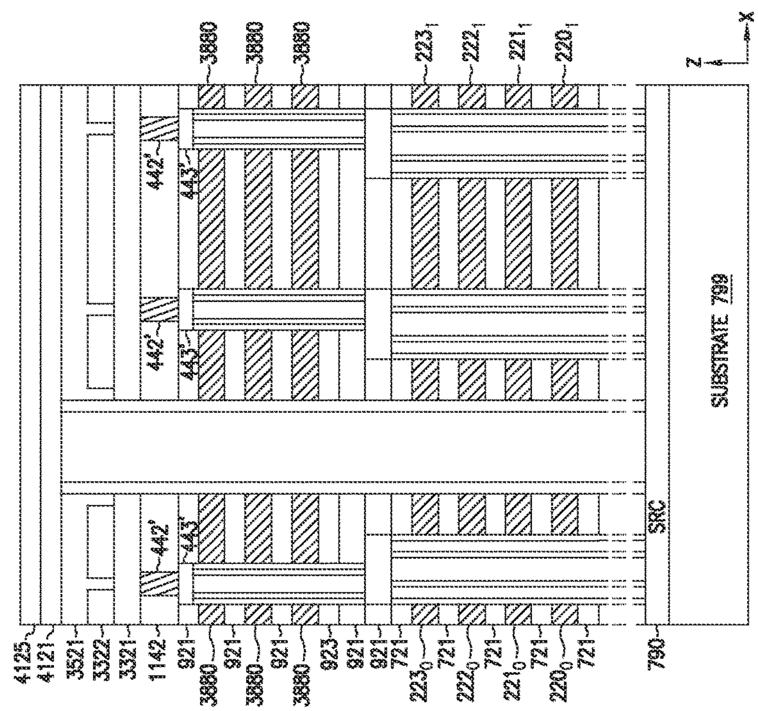
Figure 41C:
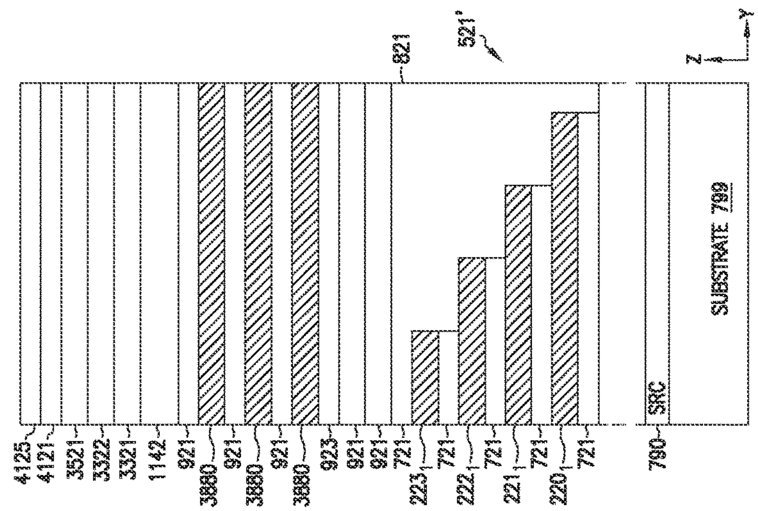

FIG. 41A, FIG. 41B, and FIG. 41C show memory device 3200 after a dielectric material (e.g., silicon dioxide) 4121 and a material 4125 are formed. Material 4125 can include polysilicon.

Figure 42B:
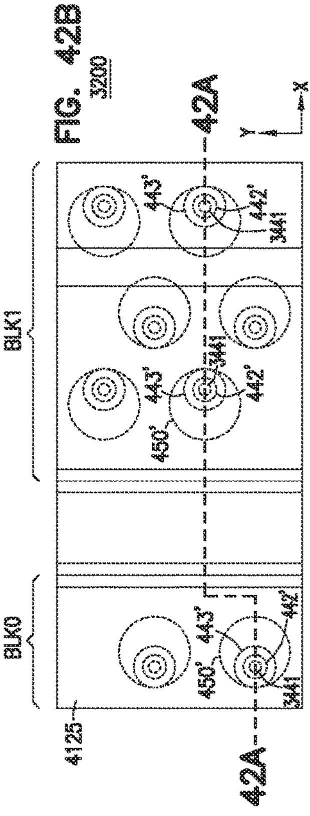
Figure 42A:
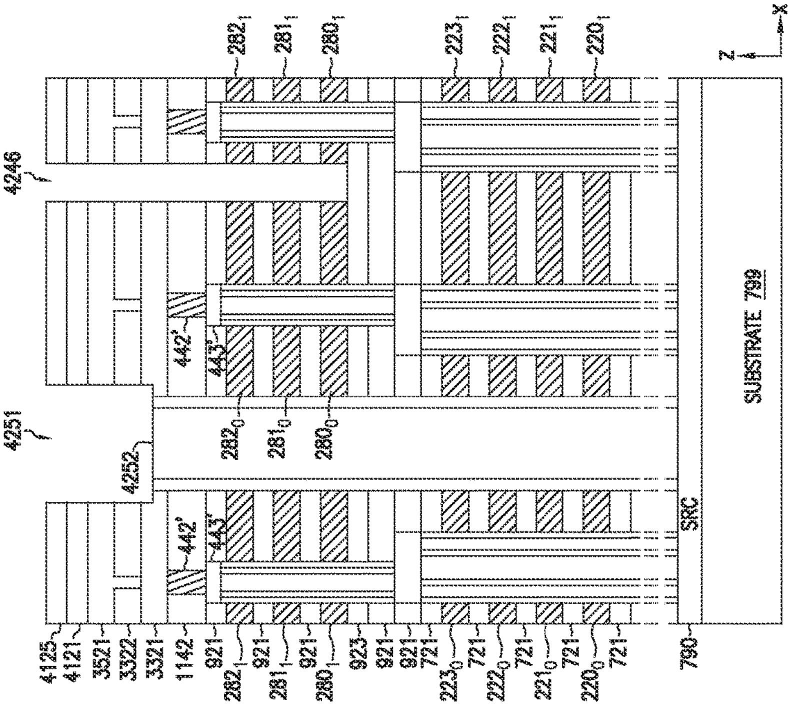
Figure 42C:
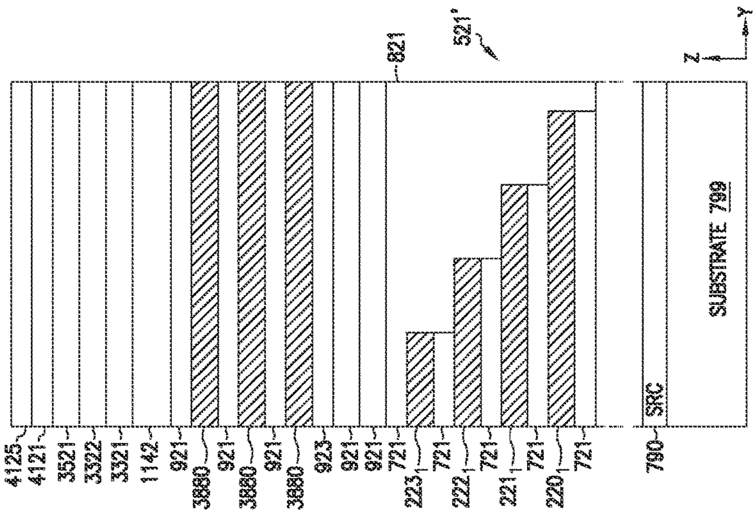

FIG. 42A, FIG. 42B, and FIG. 42C show memory device 3200 after a trench (e.g., opening) 4251 and a trench (e.g., opening) 4246 are formed. Trench 4251 can be formed by removing the materials at the location of trench 4251 (including the top portion of material 4125 and dielectric material 4121 and a top of dielectric structure 451'). The remaining portion of dielectric structure 451' can have a surface (e.g., top surface) 4252. As shown in FIG. 42A, surface 4252 can be at a level (in the Z-direction) below the level of dielectric material 3521 formed in openings 3441 (labeled in FIG. 35A).

Trench 4246 can be formed, such that it has a bottom at dielectric material 923 (e.g., carbon nitride). An etch process can be used to remove (e.g., etch) the materials at the location at trench 4246 and stop at dielectric material 923. Trench 4246 can divide (e.g., separate) conductive regions 3880 (FIG. 41A) into separate portions (that are electrically separated from each other) to form select lines (e.g., drain select lines) of respective sub-blocks of block BLK0 and BLK1. For example, trench 4246 can divide conductive regions 3880 (labeled in FIG. 38A) in block BLK1 into separate portions to form select lines $\mathbf{280_0}$, $\mathbf{281_0}$, and $\mathbf{282_0}$ (FIG. 42A) of sub-block SB0 of block BLK1, and select lines $\mathbf{280_1}$, $\mathbf{281_1}$, and $\mathbf{282_1}$ of sub-block SB1 of block BLK1. Select lines $\mathbf{280_0}$, $\mathbf{281_0}$, and $\mathbf{282_0}$ in block BLK1 are similar to (e.g., can correspond to) select lines $\mathbf{280_0}$, $\mathbf{281_0}$, and $\mathbf{282_0}$, respectively, in block BLK1 of FIG. 4A. Select lines $\mathbf{280_1}$, $\mathbf{281_1}$, and $\mathbf{282_1}$ in block BLK1 are similar to (e.g., can correspond to) select lines $\mathbf{280_1}$, $\mathbf{281_1}$, and $\mathbf{282_1}$, respectively, in block BLK1 of FIG. 4A.

The processes associated with FIG. 42A, FIG. 42B, and FIG. 42C can also form a trench (not shown) in block BLK0 to divide conductive regions 3880 (labeled in FIG. 38A) in BLK0 into separate portions to form select lines $\mathbf{280_1}$, $\mathbf{281_1}$, and $\mathbf{282_1}$ (FIG. 42A) of sub-block SB1 of block BLK0, and select lines (not shown) of other sub-blocks (not shown) of block BLK0. Select lines $\mathbf{280_1}$, $\mathbf{281_1}$, and $\mathbf{282_1}$ in block BLK0 are similar to (e.g., can correspond to) select lines $\mathbf{280_1}$, $\mathbf{281_1}$, and $\mathbf{282_1}$, respectively, in block BLK0 of FIG. 4A.

Figure 43B:
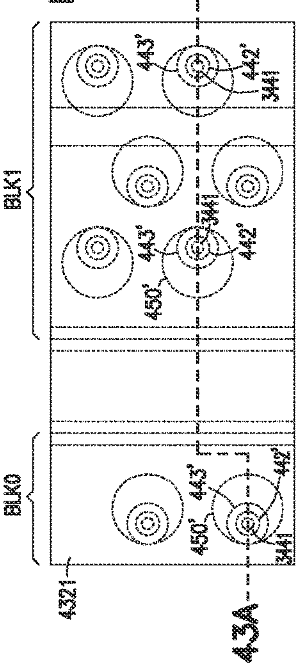
Figure 43A:
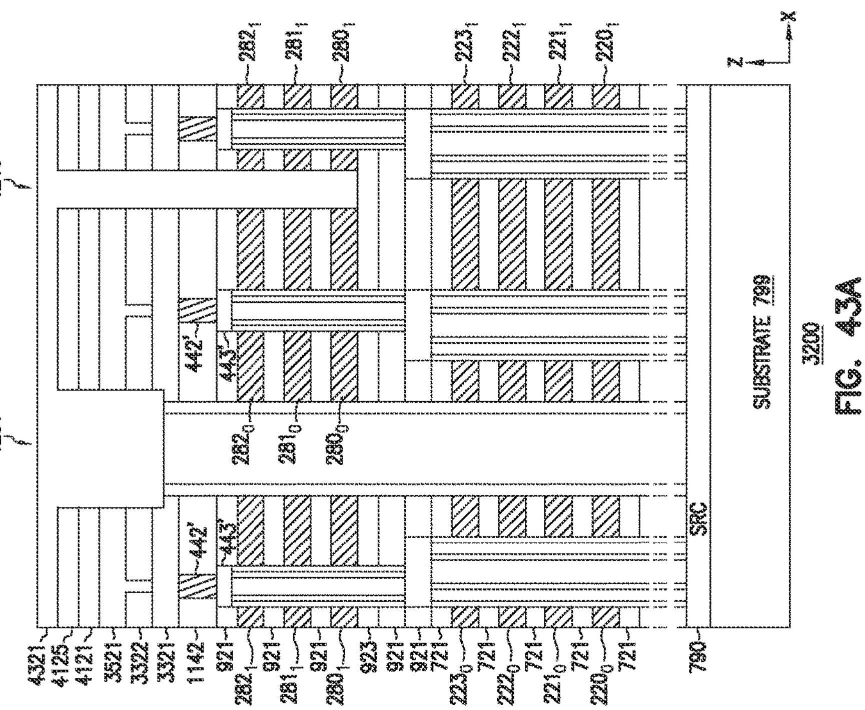
Figure 43C:
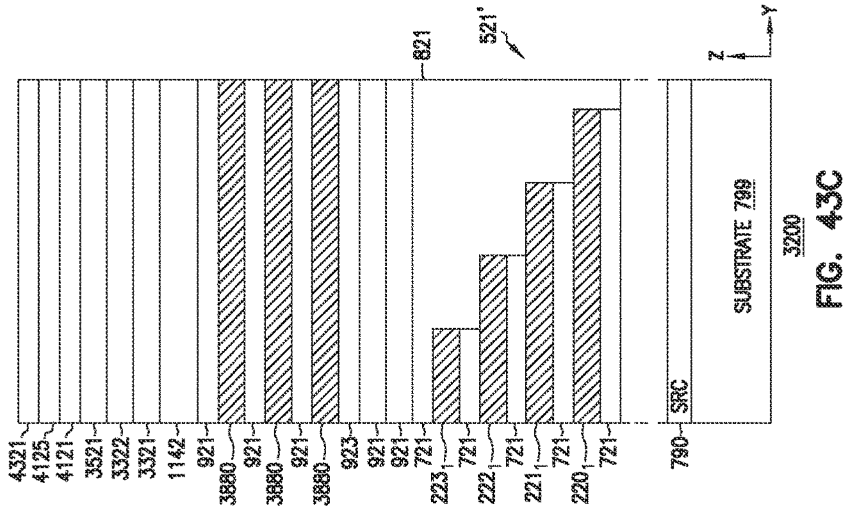

FIG. 43A, FIG. 43B, and FIG. 43C show memory device 3200 after a dielectric material (e.g., silicon dioxide) 4321 is formed in trenches 4251 and 4246 and over other elements of memory device 3200.

Figure 44B:
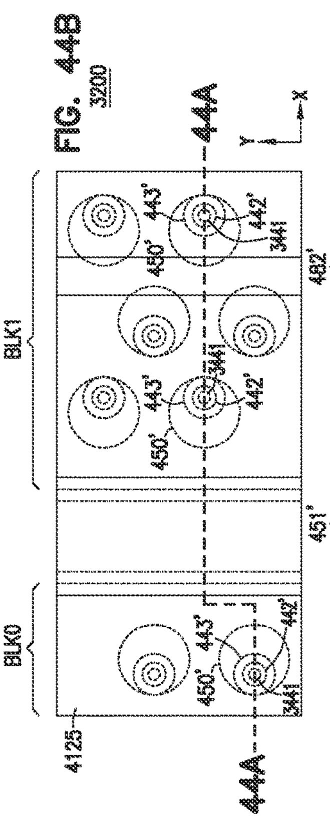
Figure 44A:
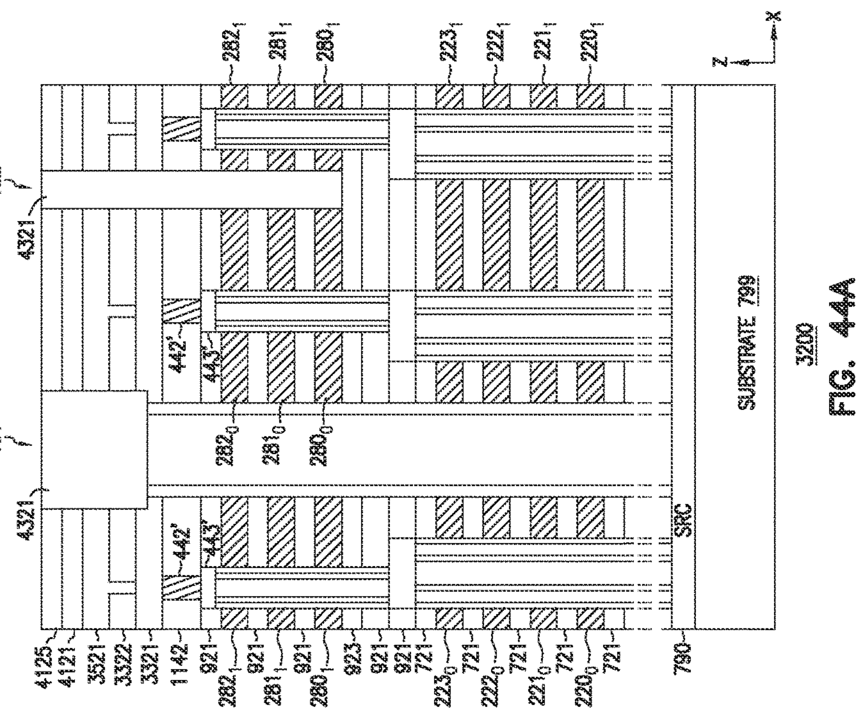
Figure 44C:
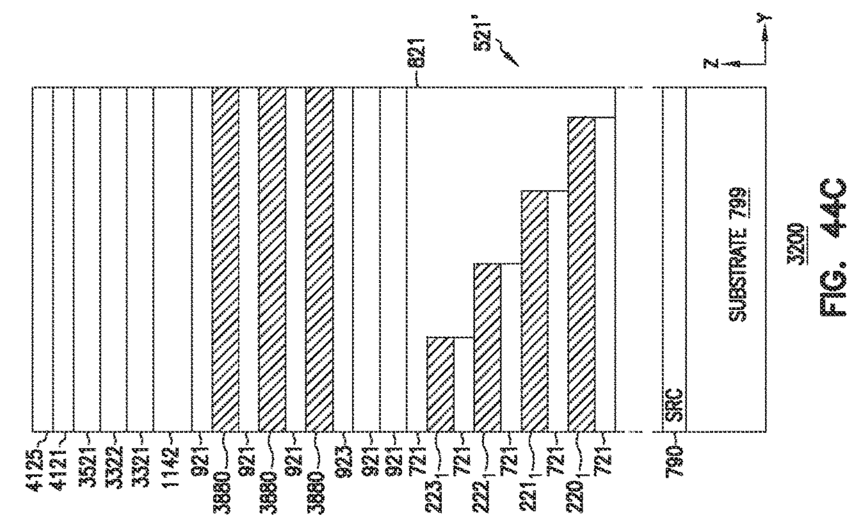

FIG. 44A, FIG. 44B, and FIG. 44C show memory device 3200 after a dielectric structure 482' is formed. Dielectric structure 482' is similar to (e.g., can correspond to) dielectric structure 482 of FIG. 4A. Forming dielectric structure 482' can include performing a CMP process to remove a portion (top portion shown in FIG. 24A) of dielectric material 4321. The remaining portion of dielectric material in trench 4251 (labeled in FIG. 43A) can be part of dielectric structure 451'. The remaining portion of dielectric material 4321 in trench 4246 (labeled in FIG. 43A) forms dielectric structure 482' that can electrically separate select lines $\mathbf{280}_0$, $\mathbf{281}_0$, and $\mathbf{282}_0$ of sub-block SB of block BLK1 from select lines $\mathbf{280}_1$, $\mathbf{281}_1$, and $\mathbf{282}_1$ of sub-block SB1 of block BLK1.

Figure 45B:
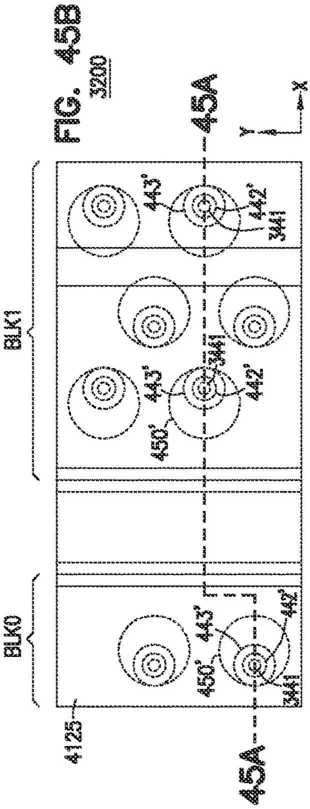
Figure 45A:
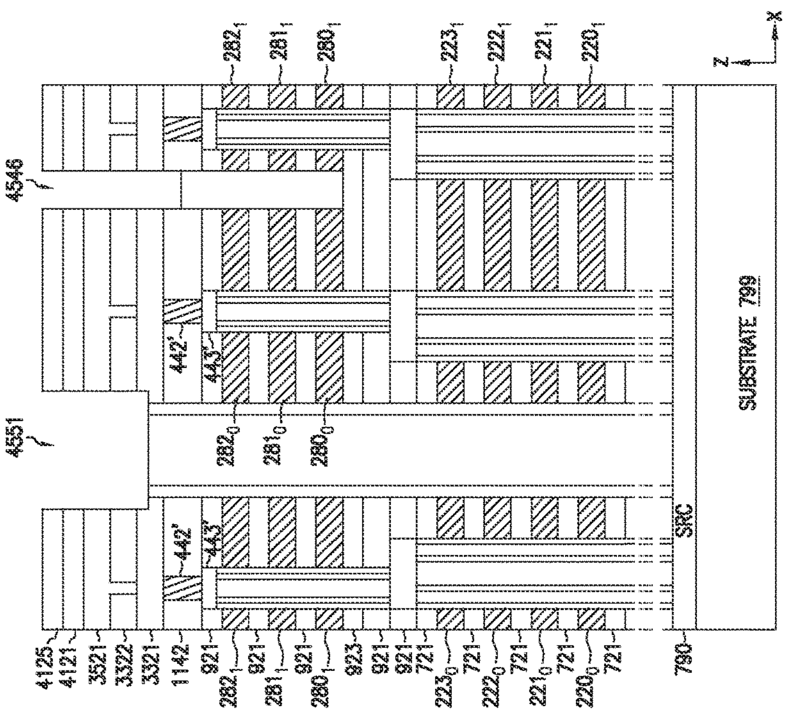
Figure 45C:
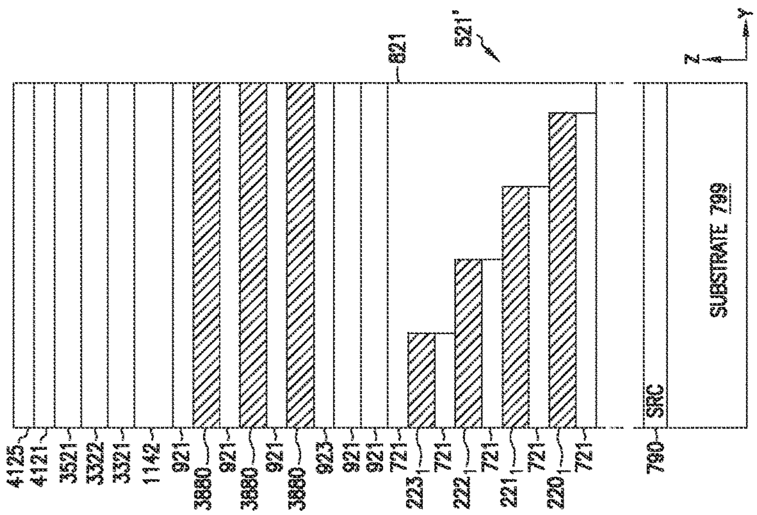

FIG. 45A, FIG. 45B, and FIG. 45C show memory device 3200 after a trench (e.g., opening) 4551 and trench (e.g., opening) 4546 are formed. Trench 4551 can be formed by removing the material (e.g., dielectric material 4321) from a top portion of dielectric structure 451'. Trench 4546 can be formed by removing a top portion of dielectric material 4321 of dielectric structure 482'.

Figures 46A, 46B, 46C:
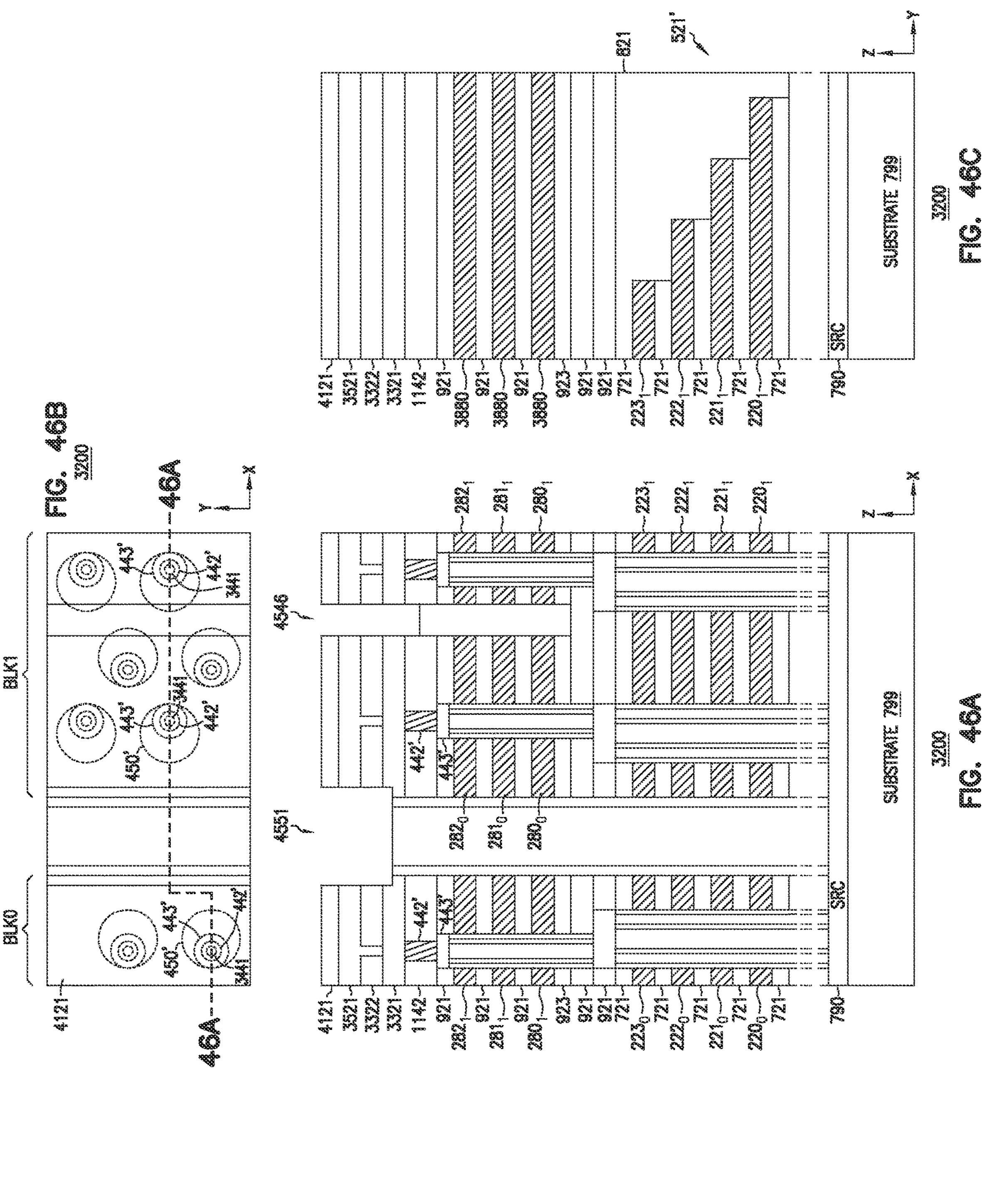

FIG. 46A, FIG. 46B, and FIG. 46C show memory device 3200 after material (e.g., polysilicon) 4125 is removed.

Figure 47B:
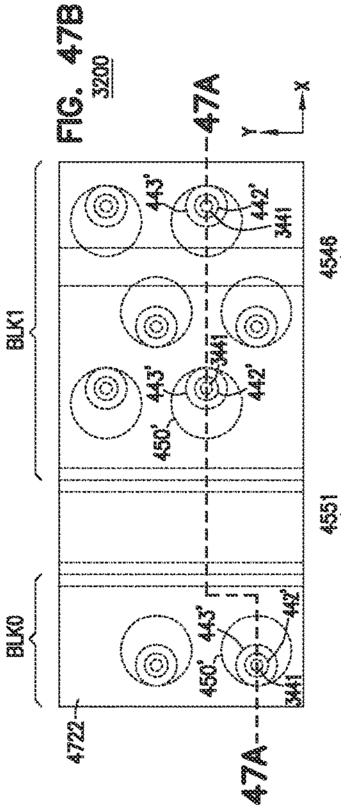
Figure 47A:
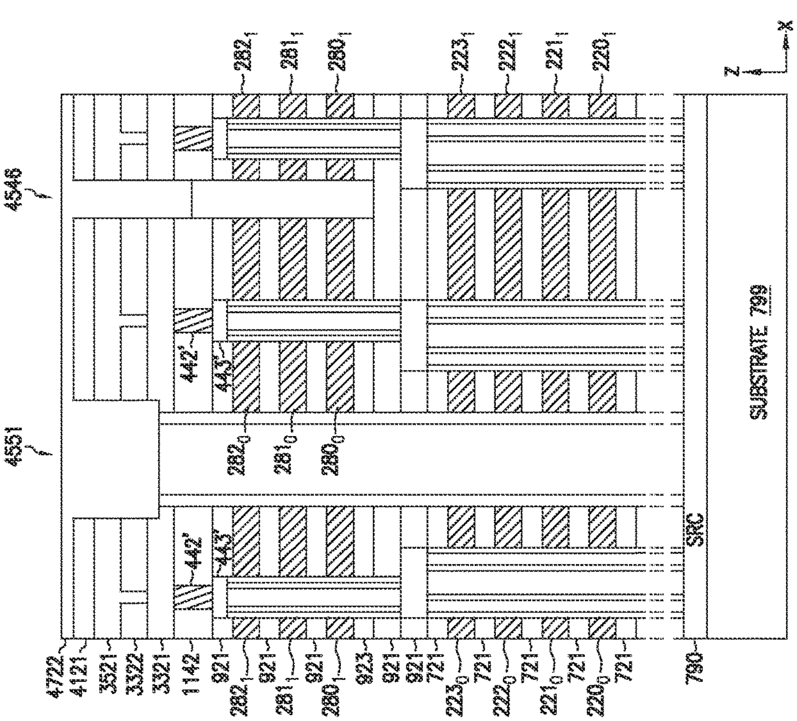
Figure 47C:
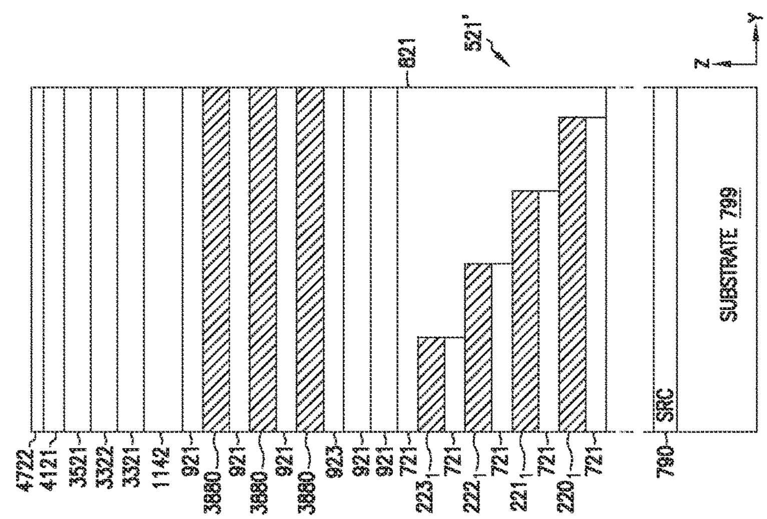

FIG. 47A, FIG. 47B, and FIG. 47C show memory device 3200 after a dielectric material (e.g., silicon nitride) 4722 is formed in trench 4551 and trench 4546 and over other elements of memory device 3200.

Figure 48B:
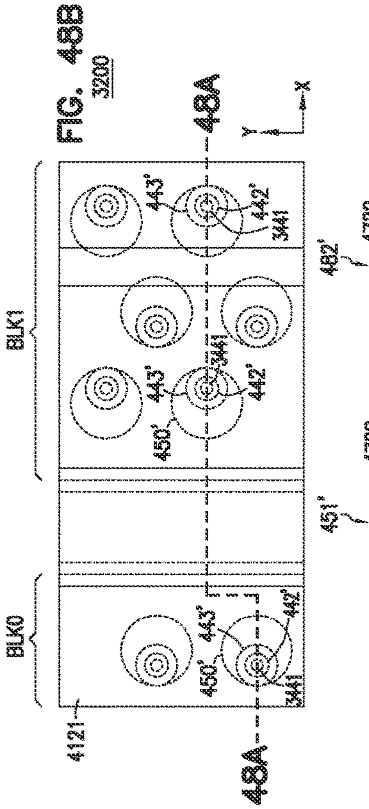
Figure 48A:
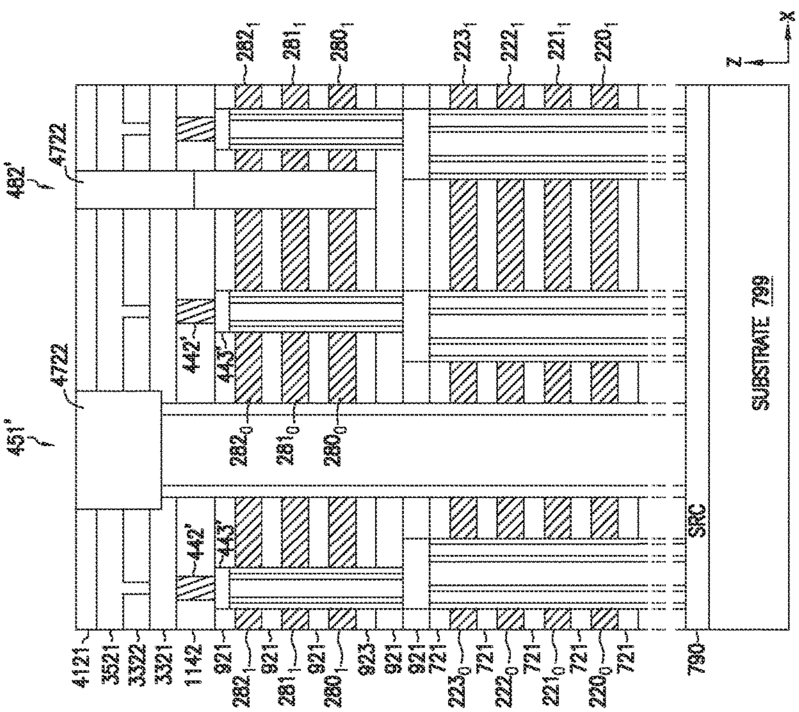
Figure 48C:
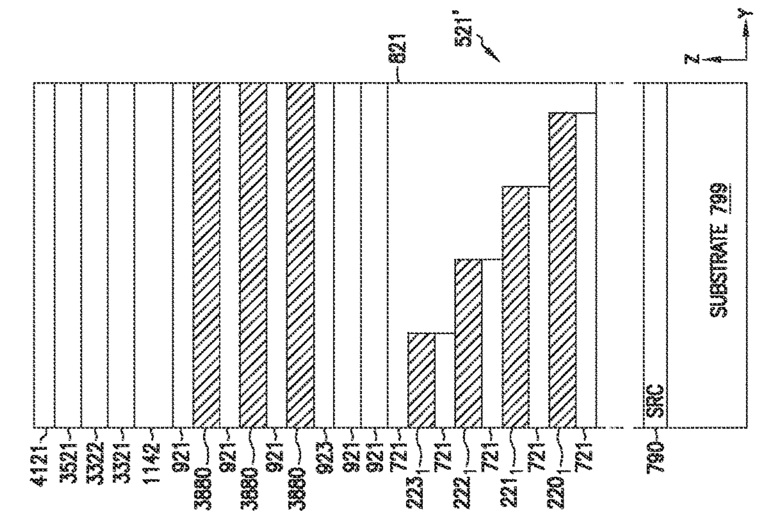

FIG. 48A, FIG. 48B, and FIG. 48C show memory device 3200 after a portion (e.g., top portion) of dielectric material 4722 is removed (e.g., by using a CMP process). The remaining portion of dielectric material 4722 in trench 4551 can be part of dielectric structure 451'. The remaining portion of dielectric material 4722 in trench 4546 can be part of dielectric structure 482'.

Figures 49A, 49B, 49C:
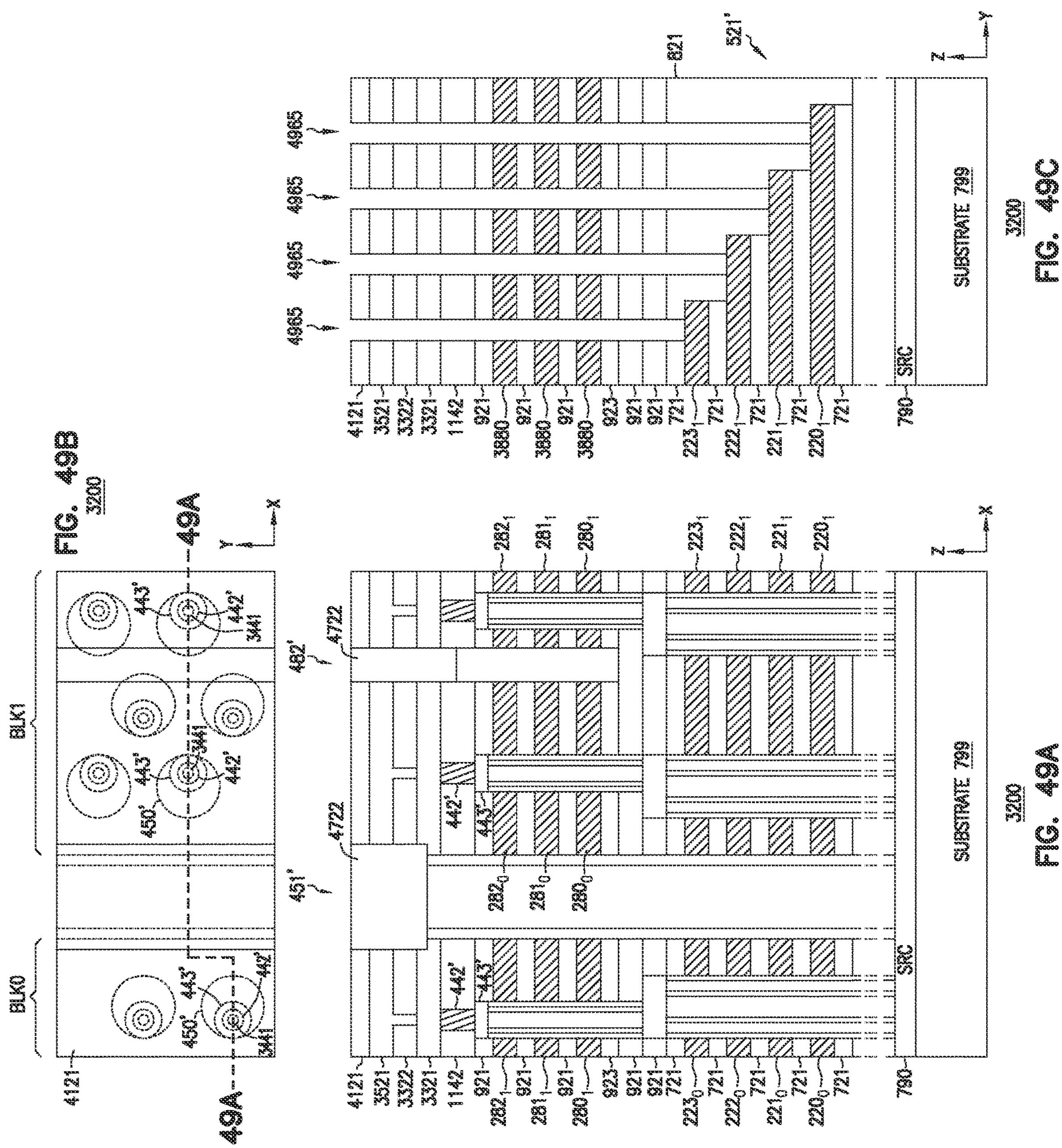

FIG. 49A, FIG. 49B, and FIG. 49C show memory device 3200 after openings (e.g., holes) 4965 are formed at staircase structure 521'. Forming openings 4965 can include removing (e.g., etching) portions of the materials at staircase structure 521' (as shown in FIG. 50C), such that respective portions of control gates $\mathbf{220}_1$, $\mathbf{221}_1$, $\mathbf{222}_1$, and $\mathbf{223}_1$ can be exposed at respective openings 4965.

Figure 50B:
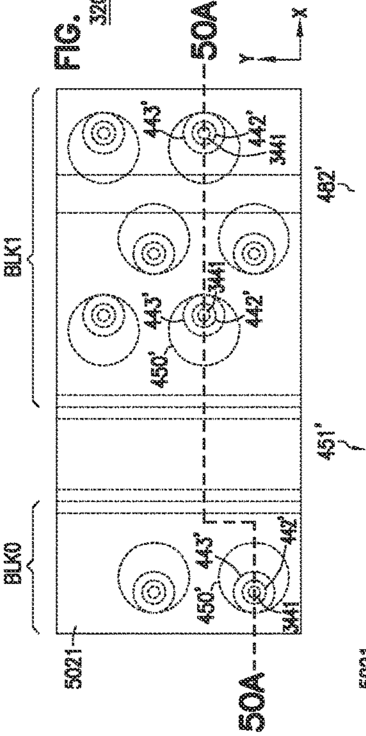
Figure 50A:
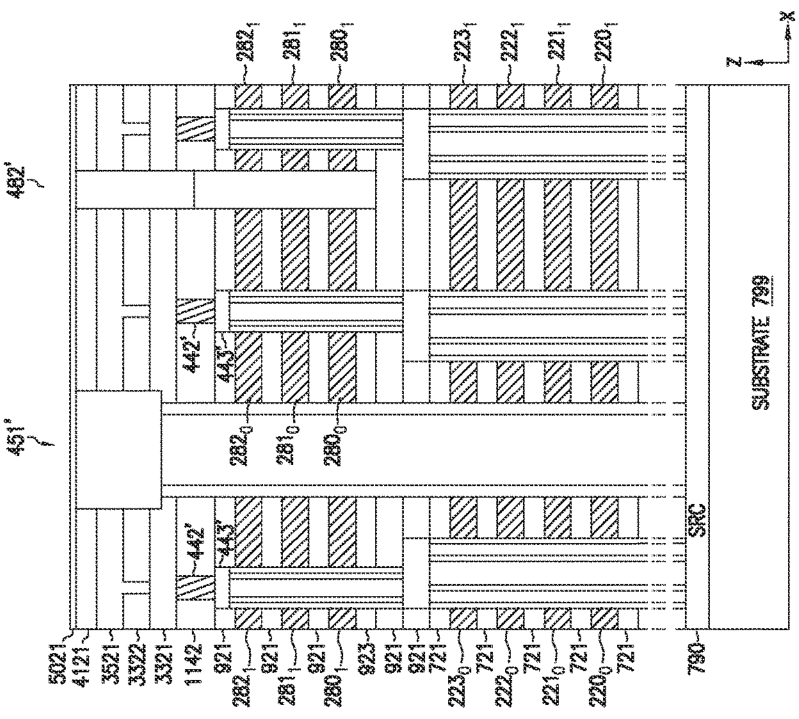
Figure 50C:
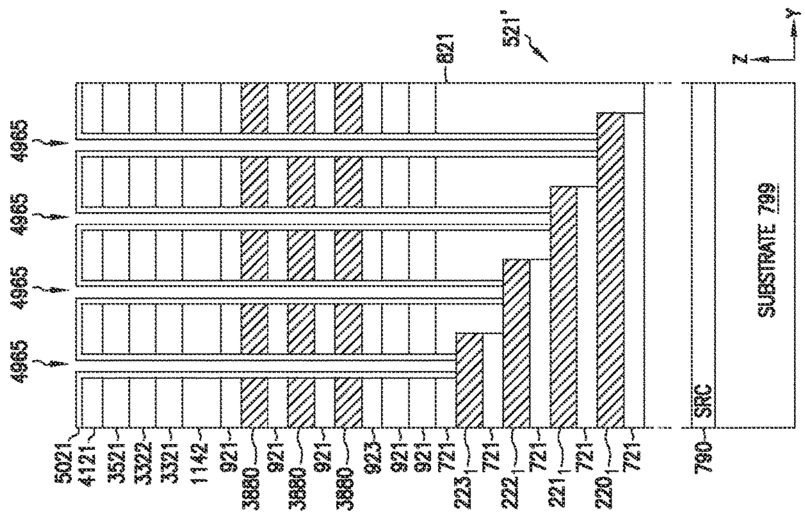

FIG. 50A, FIG. 50B, and FIG. 50C show memory device 3200 after a dielectric material (e.g., liner material) 5021 is formed on sidewalls (not labeled) of openings 4965. Forming dielectric material 5021 can include forming a dielectric material (e.g., silicon dioxide) in openings 4965 (e.g., on sidewalls and on the bottom of openings 4965) then removing (e.g., punching) a bottom portion of dielectric material 5021 at openings 4965 to expose respective portions of control gates $\mathbf{220}_1$, $\mathbf{221}_1$, $\mathbf{222}_1$, and $\mathbf{223}_1$ at openings 4965, as shown in FIG. 50C.

Figure 51B:
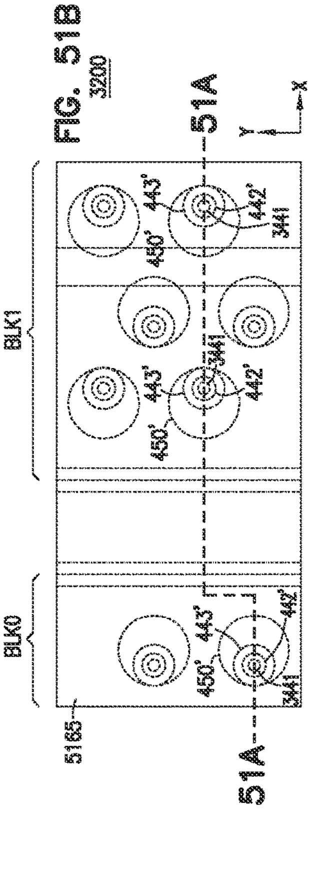
Figure 51A:
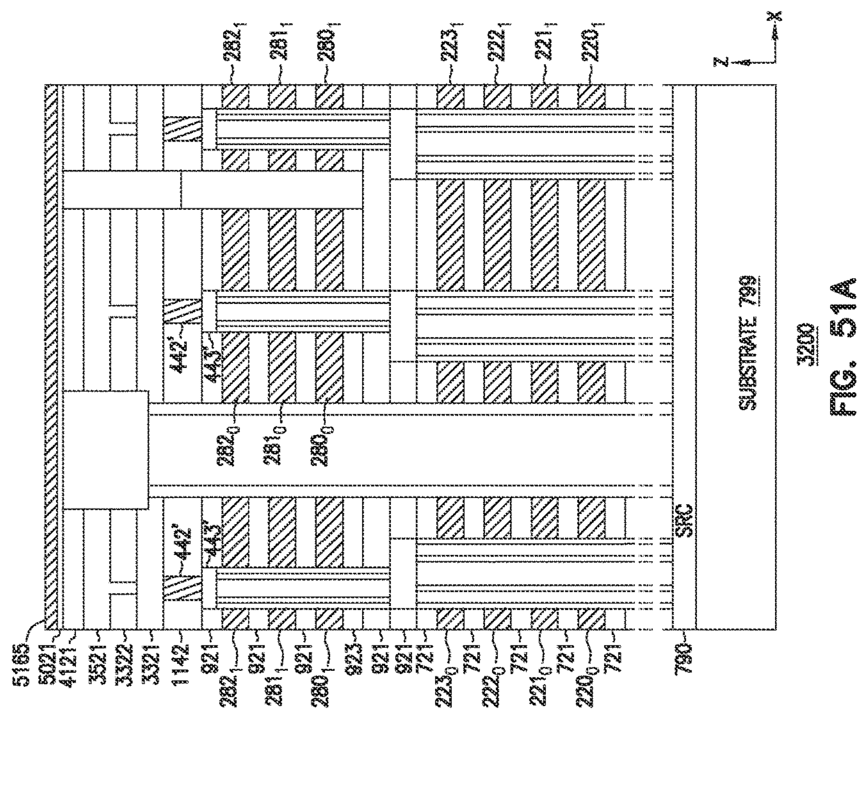
Figure 51C:
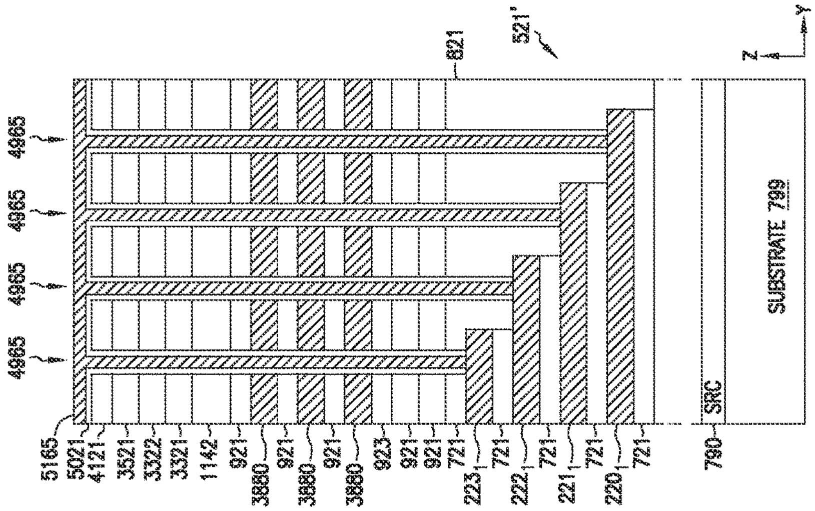

FIG. 51A, FIG. 51B, and FIG. 51C show memory device 3200 after a conductive material 5165 is formed in openings 4965 (between dielectric material 5021 on sidewalls of openings 4965) and over dielectric material 5021. Conductive material 5165 can contact respective portions of control gates $\mathbf{220}_1$, $\mathbf{221}_1$, $\mathbf{222}_1$, and $\mathbf{223}_1$ at staircase structure 521'. Conductive material 5165 can include metal (e.g., tungsten) or other conductive materials.

Figures 52A, 52B, 52C:
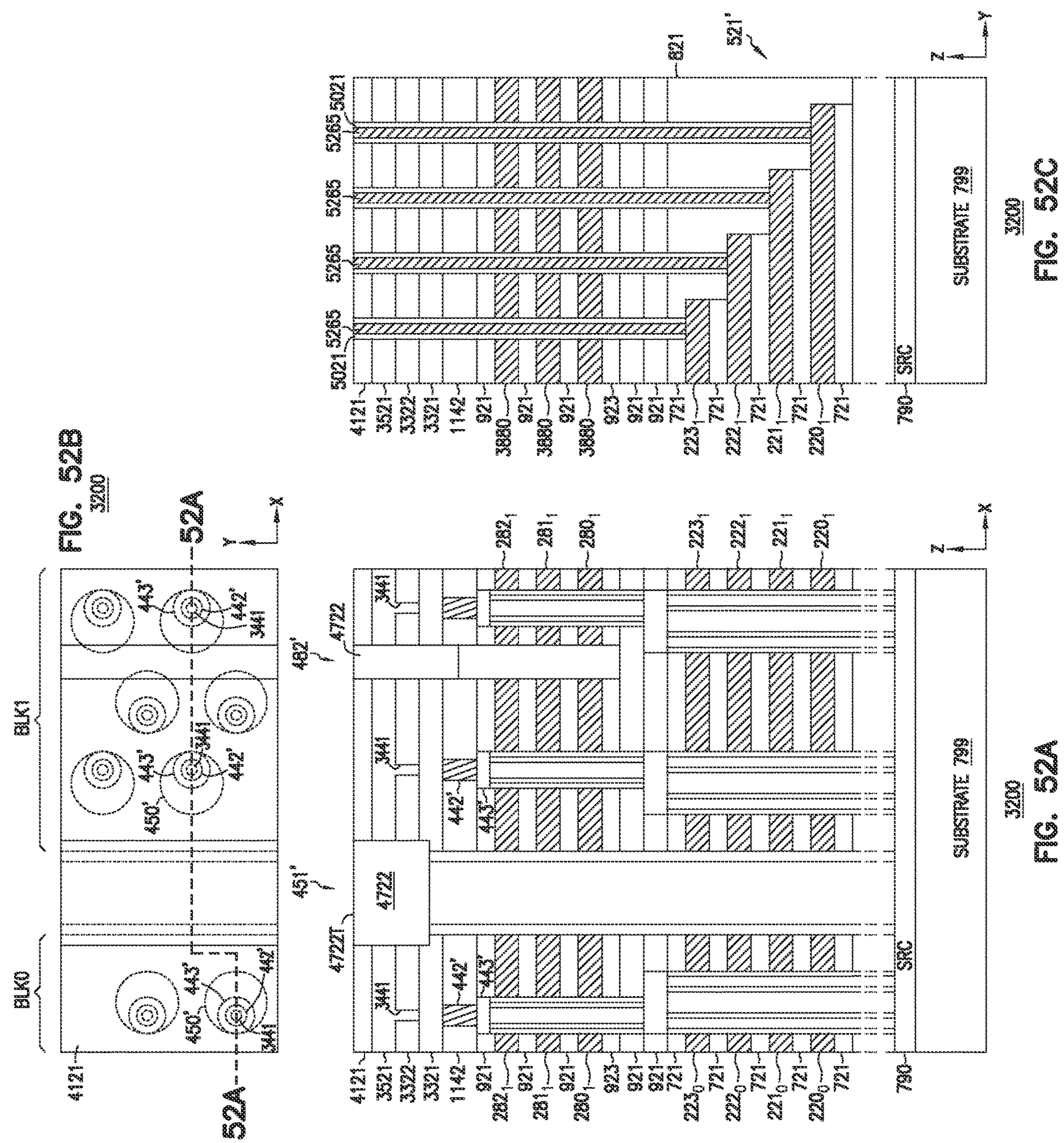

FIG. 52A, FIG. 52B, and FIG. 52C show memory device 3200 after conductive contacts (e.g., word line contacts) 5265 are formed. Conductive contacts 5265 can contact (e.g., can be directly coupled to or electrically coupled to) respective control gates $\mathbf{220}_1$, $\mathbf{221}_1$, $\mathbf{222}_1$, and $\mathbf{223}_1$. Forming conductive contacts 5265 can include performing a CMP process to remove a portion (top portion shown in FIG. 51A) of each of conductive material 5165 and dielectric material 5021. The remaining portion of conductive material 5165 at staircase structure 521' forms conductive contacts 5265. As shown in FIG. 52A, the portion of dielectric material 4722 of dielectric structure 451' can have a surface (e.g., top surface) 4722T above the level of dielectric material 3521 (e.g., silicon dioxide) formed in openings 3441. Like surface 4722T of dielectric material 4722, each of conductive contacts 5265 can have a top surface (not labeled) above the level of dielectric material 3521 (e.g., silicon dioxide) formed in openings 3441.

Figure 53B:
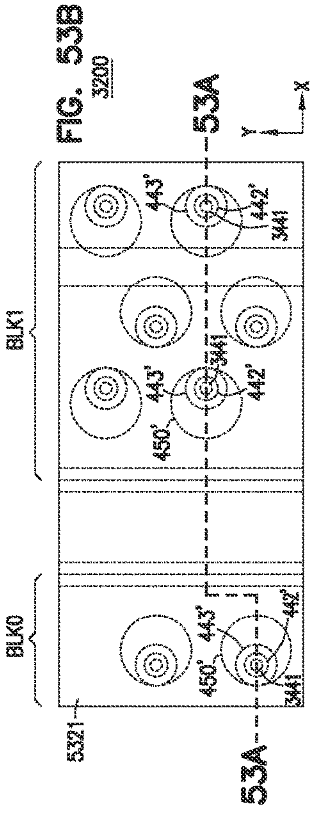
Figure 53A:
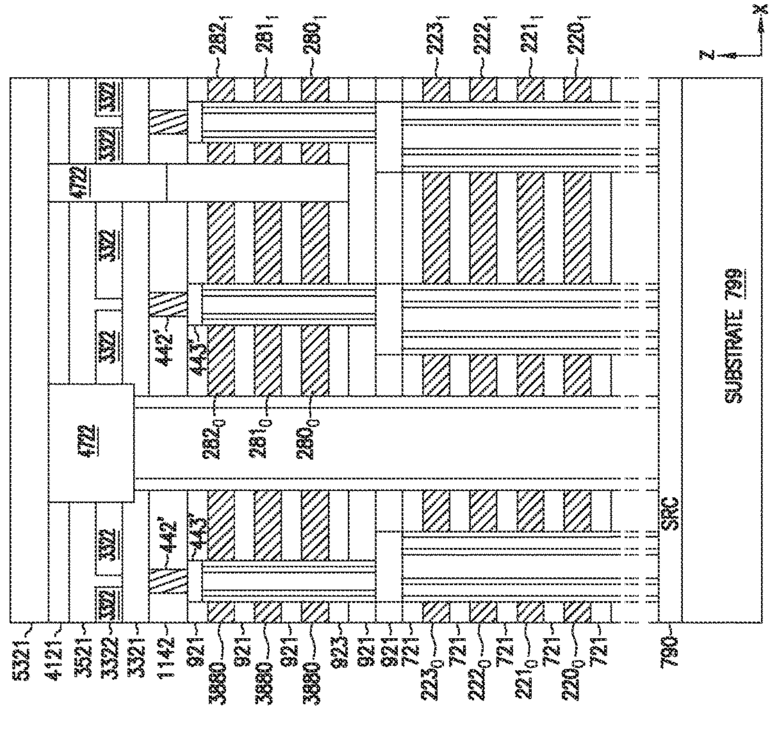
Figure 53C:
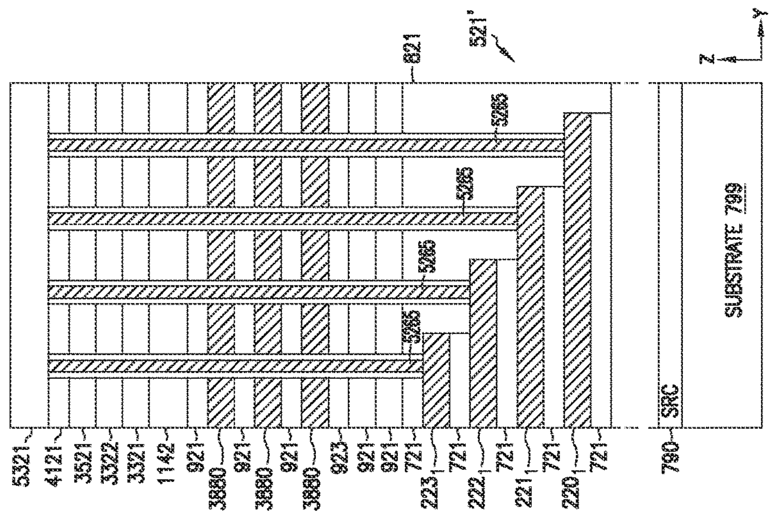

FIG. 53A, FIG. 53B, and FIG. 53C show memory device 3200 after a dielectric material (e.g., silicon dioxide) 5321 is formed over other elements of memory device 3200.

Figures 54A, 54B, 54C:
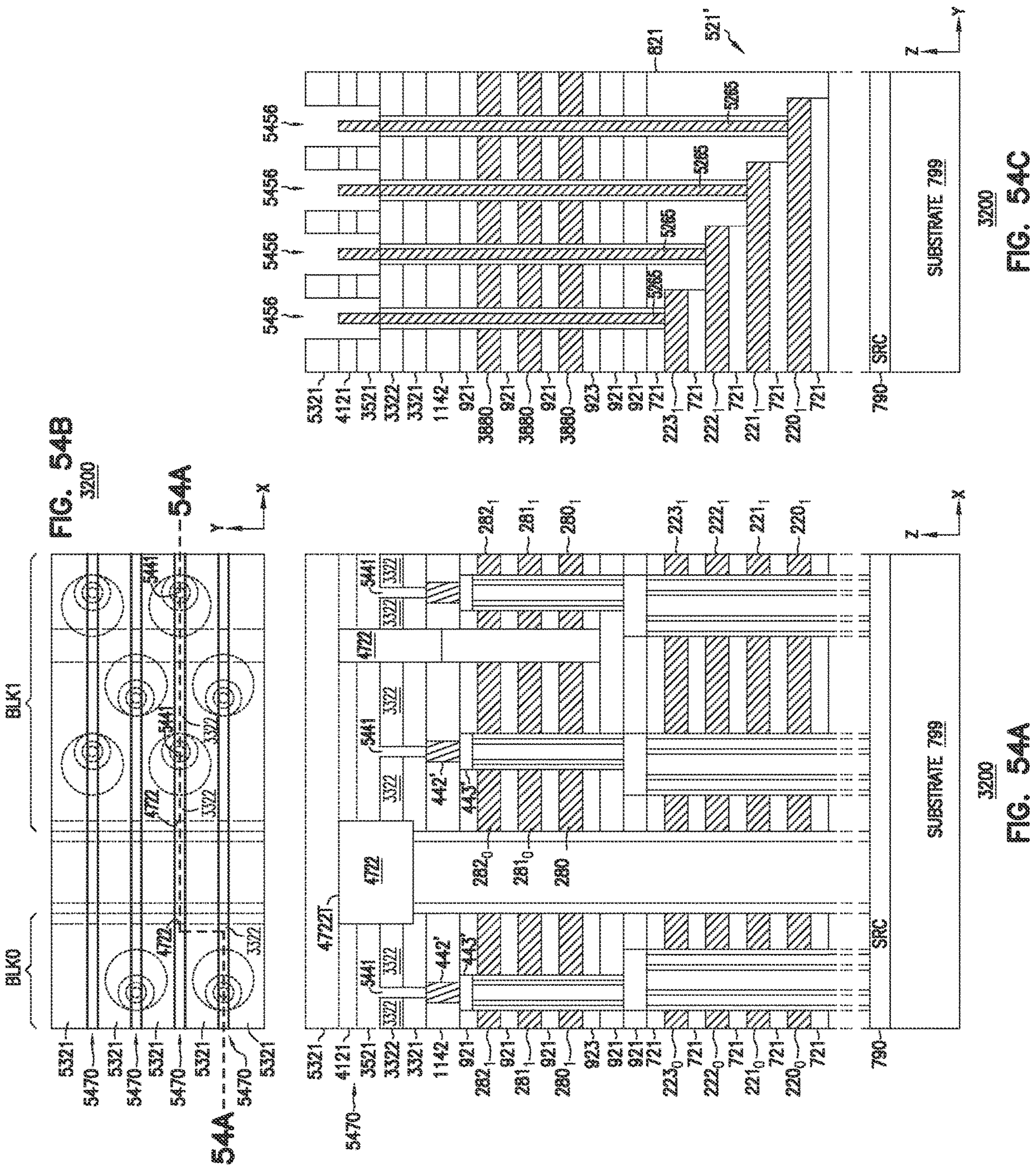

FIG. 54A, FIG. 54B, and FIG. 54C show memory device 3200 after trenches (e.g., openings) 5470 and trenches (e.g., openings) 5456 are formed. Trenches 5470 can have respective widths (e.g., relatively narrow widths) in the Y-direction and respective lengths in the X-direction. Trenches 5456 can have respective widths in the Y-direction and respective lengths in the X-direction. In subsequent processes (described below), a conductive material 5575 (FIG. 55A and FIG. 55C) can be formed (e.g., deposited) in trenches 5470 to form data lines of memory device 3200 and in trenches 5456 to form conductive lines (which can be part of word lines) of memory device 3200.

In FIG. 54A and FIG. 54B, forming trenches 5470 can include removing (e.g., etching) the dielectric materials (e.g., silicon dioxides) 5321, 4121, 3521, and 3321 at the locations of trenches 5470. Dielectric materials (e.g., silicon nitride) 4722 and 3322 can remain (e.g., may not be removed) when trenches 5470 are formed.

As shown in FIG. 54A, surface (e.g., top surface) 4722T of dielectric material 4772 can be exposed through trenches 5470.

The processes associated with FIG. 54A, FIG. 54B, and FIG. 54C can include forming openings 5441. Openings 5441 can be formed when trenches 5470 are formed. The locations of openings 5441 can include the locations of openings 3441 that were formed in the processes associated with FIG. 34A, FIG. 34B, and FIG. 34C. Forming openings 5441 can include removing (e.g., etching) respective portions of dielectric material 3521 (that was formed in openings 3441), and removing (e.g., etching) respective portions of dielectric material 3321 at openings 5441. Since dielectric material 3521 was formed in locations of openings 3441 (FIG. 34A) that were vertically aligned respective conductive contacts 442' (FIG. 34A and FIG. 54A), openings 5441 in FIG. 54A that are formed at the locations of openings 3441 can also be vertically aligned with respective conductive contacts 442' (FIG. 54A). Thus, openings 5441 can expose conductive contacts 442' at respective locations of openings 5441. In subsequent processes, conductive contacts 441' can be formed in openings 5441. Since the locations (e.g., openings 3441 and openings 5441) for the connections between conductive contacts 441' and 422' remain relatively the same from the processes associated with FIG. 34A through the processes associated with FIG. 54A, conductive contacts 441' can be viewed as self-aligned with respective conductive contacts 442. Therefore, misalignments in the connections between conductive contacts 441' and 442 may be mitigated (e.g., may not occur).

Figure 55B:
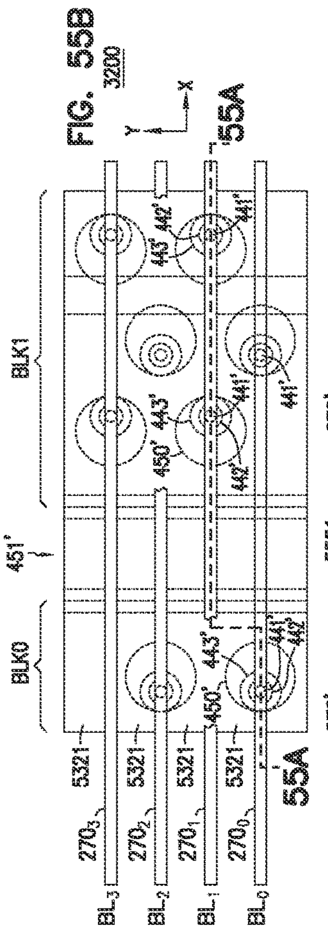
Figure 55A:
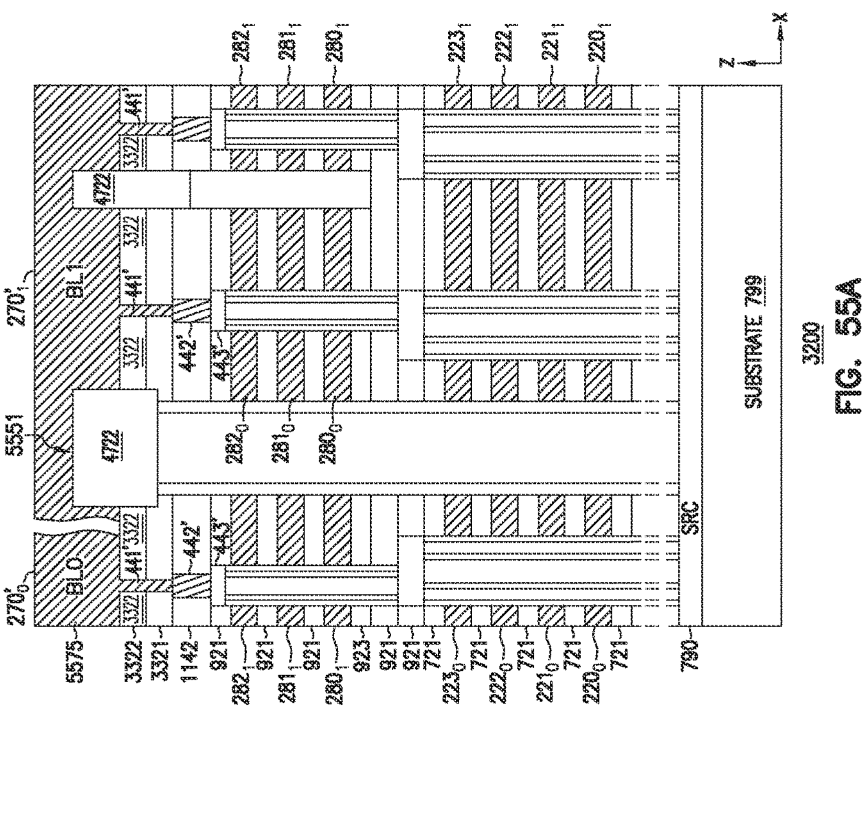
Figure 55C:
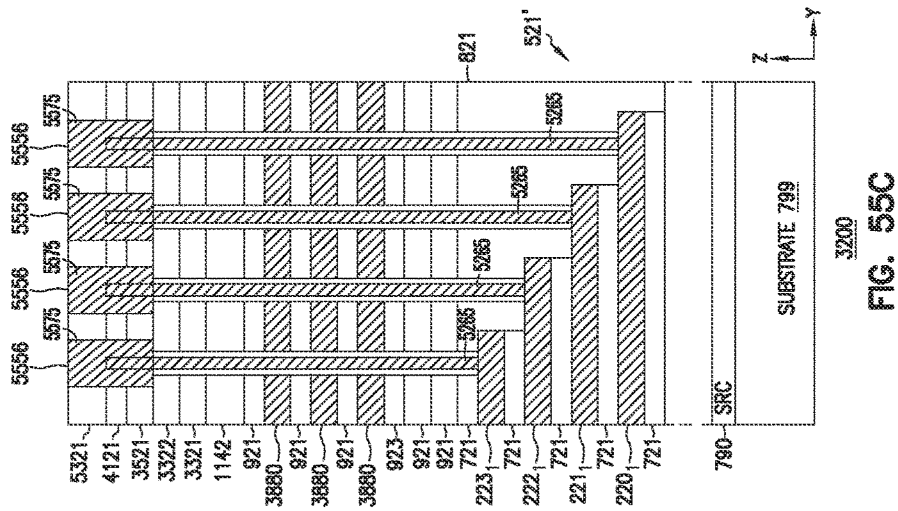

FIG. 55A, FIG. 55B, and FIG. 55C show memory device 3200 after formation of data lines $\mathbf{270}_0$, $\mathbf{270}_1$, $\mathbf{270}_2$, and $\mathbf{270}_3$, conductive contacts 441', and conductive lines 5556.

Data lines $270_0$, $270_1$, $270_2$, and $270_3$ are similar to data lines (e.g., data lines $270_0$ through $270_N$) of memory device 200 in FIG. 5. Conductive contacts 441' are similar to conductive contacts 441 of memory device 200 in FIG. 4A. Conductive lines 5556 are similar to conductive lines 556 of memory device 200 of FIG. 6.

As shown in FIG. 55A, FIG. 55B, and FIG. 55C, a conductive material 5575 can be formed (e.g., deposited) in trenches 5470 and openings 5441 to form respective data lines $270_0$, $270_1$, $270_2$, and $270_3$ and conductive contacts 441'. Conductive material 5575 formed in trenches 5456 at staircase structure 521' can form respective conductive lines 5556. Conductive material 5575 can include metal or other conductive materials.

For simplicity and for ease of viewing the elements of memory device 3200 from a side view (FIG. 55A) and from a top view (FIG. 55B), some of the data lines (which are conductive lines) $270_1$, $270_1$, $270_2$, and $270_3$ are partially shown in FIG. 55A and FIG. 55B. However, data lines $270_0$, $270_1$, $270_2$, and $270_3$ can be located over (in the Z-direction) and fully extend across (in the X-direction) the blocks (e.g., blocks BLK0 and BLK1) of memory device 3200, such that each of data lines $270_0$, $270_1$, $270_2$, and $270_3$ can contact (e.g., directly coupled to) dielectric structure 451', contact at least one conductive structure 441' in block BLK0, and contact at least one conductive structure 441' in block BLK1.

As shown in FIG. 55A and FIG. 55B, data lines $270_0$, $270_1$, $270_2$, and $270_3$ can contact (e.g., can be directly coupled to or electrically coupled to) respective conductive contacts 441' in block BLK0 and BLK1. Data lines $270_0$, $270_1$, $270_2$, and $270_3$ can be formed over (in the Z-direction) and shared by the blocks (e.g., block BL0 and BLK1) of memory device 3200.

As shown in FIG. 55A, data line $270_1$ can contact (e.g., directly coupled to) dielectric structure 451' at an interface 5551 between data line $270_1$ and dielectric structure 451'. Interface 5551 can be at the location of surface 4722T of dielectric material 4772 of dielectric structure 451'. As shown in FIG. 55A, interface 5551 is at a level (in the Z-direction) above the level of the conductive structures (which include respective conductive contacts 441') in blocks BLK0 and BLK1. Other data lines (e.g., data lines $270_1$, $270_2$, and $270_3$ (in FIG. 55B) can contact dielectric structure 451' at an interface similar to interface 5551.

For example, as shown in FIG. 55A and FIG. 55B, data line $270_1$ can contact (e.g., can be directly coupled to or electrically coupled to) dielectric structure 451' at an interface 5551, contact conductive structure 441' in block BLK1, and contact conductive structure 441' (not shown) in block BLK0. In another example, as shown in FIG. 55B, data line $270_0$ can contact (e.g., can be directly coupled to or electrically coupled to) dielectric structure 451' at an interface (similar to interface 5551) between data line data lines $270_0$ and dielectric structure 451', contact conductive structure 441' in block BLK0, and contact conductive structure 441' in block BLK1.

As shown in FIG. 55C, conductive lines 5556 can contact (e.g., directly coupled or electrically coupled to) respective conductive contacts (e.g., word line contacts) 5265. Conductive lines 5556 can be part of conductive routings that can be coupled to peripheral circuitry (e.g., word line drivers in substrate 799) of memory device 700. Conductive lines 5556 can be structured to provide signals (e.g., word line signals) to respective control gates $220_1$, $221_1$, $222_1$, and $223_1$ (through respective conductive contacts 5265). Conductive lines 5556 of one block (e.g., block BLK1) can be formed (e.g., patterned) such that they can be electrically separated from (e.g., not shared by) conductive lines (not shown) of another block (e.g., block BLK0). The conductive lines of other blocks of memory device 3200 can be formed (from conductive material 5575) concurrently with conductive lines 5556 of block BLK1.

As shown in FIG. 55C, conductive contacts 5265 can have a relatively straight sidewall (without the presence of a notch or necking on the sidewall) throughout the respective lengths of conductive contacts 5265 between conductive lines 5556 and respective control gates $220_1$, $221_1$, $222_1$, and $223_1$. The relatively straight sidewalls of conductive contacts 5265 can be a result of forming the structure (e.g., the entire vertical structure in the Z-direction) of conductive contacts 5265 in the same process (e.g., in FIG. 52C) and separate from the process of forming conductive contacts 441'. For example, a notch may be present on the sidewall of a respective conductive contact 5265 if a portion (e.g., a top portion between the levels of dielectric materials 4121 and 3321) of conductive contacts 5265 is formed with the same process that forms conductive contacts 441'. Forming conductive contacts 5265 in processes different from the processes of forming conductive contacts 441 may avoid poor structure of conductive contacts 5265 and maintain proper connection between conductive contacts 5265 and respective conductive lines 5556.

The description of forming memory device 3200 with reference to FIG. 7A through FIG. 55C can include other processes to form a complete memory device (e.g., memory device 3200). Such processes are omitted from the above description so as to not obscure the subject matter described herein.

Benefits and improvement of the processes described herein can mitigate misalignment between elements of memory device 3200 that may be caused by block-bending error. For example, as described above, the locations of conductive contact 441' are pre-defined (e.g., at the locations of openings 3441 in FIG. 34A) and vertically aligned with conductive contacts 442' before formation of slit 3651 and the control gates (processes associated with FIG. 36A, FIG. 37A, and FIG. 38A). A potential block-bending error (e.g., that may be caused by formation of slit 3651 and the control gates) may not cause misalignment between conductive contacts 441' and 442' because the locations (e.g., at openings 5441 in FIG. 54A) for forming conductive contacts 441' (FIG. 54A) over conductive contact 442' remain relatively the same before and after formation of slit 3651 and the control gates. For example, the locations of openings 5441 (for forming conductive contacts 441' over respective conductive contacts 442') are the same as the locations of openings 3441. Thus, memory device 700 can have a proper conductive connection between conductive contacts 441' and 442'. Therefore, reliability of the memory device can be maintained or improved. Improved yield may also be achieved as a result of the processes described above.

The illustrations of apparatuses (e.g., memory devices 100, 200, 700, and 3200) and methods (e.g., processes associated with forming memory devices 700 and 3200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 700, and 3200) or a system (e.g., a computer, a cellular phone, or other electronic systems) that includes a device such as any of memory devices 100, 200, 700, and 3200.

Any of the components described above with reference to FIG. 1 through FIG. 55C can be implemented in a number of ways, including simulation via software. Thus, apparatuses. e.g., memory devices 100, 200, 700, and 3200, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 700, and 3200 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 55C include apparatuses, and methods of forming the apparatuses. One of the apparatuses includes levels of conductive materials interleaved with levels of dielectric materials; memory cell strings including respective pillars extending through the levels of conductive materials and the levels of dielectric materials; a dielectric structure formed in a slit, the slit extending through the levels of conductive materials and the levels of dielectric materials, the dielectric structure separating the levels of conductive materials and the levels of dielectric materials into a first portion and a second portion, the first portion including first memory cell strings of the memory cell strings, the second portion including second memory cell strings of the memory cell strings; first conductive structures located over and coupled to respective pillars of the first memory cell strings; second conductive structures located over and coupled to respective pillars of the second memory cell strings; and a conductive line contacting the dielectric structure, a conductive structure of the first conductive structures, and a conductive structure of the second conductive structures. Other embodiments including additional apparatuses and methods are described.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

levels of conductive materials interleaved with levels of dielectric materials;

memory cell strings including respective pillars extending through the levels of conductive materials and the levels of dielectric materials;

a dielectric structure formed in a slit, the slit extending through the levels of conductive materials and the levels of dielectric materials, the dielectric structure separating the levels of conductive materials and the levels of dielectric materials into a first portion and a second portion, the first portion including first memory cell strings of the memory cell strings, the second portion including second memory cell strings of the memory cell strings;

first conductive structures located over and electrically coupled to respective pillars of the first memory cell strings;

second conductive structures located over and electrically coupled to respective pillars of the second memory cell strings;

a conductive line contacting the dielectric structure, a conductive structure of the first conductive structures, and a conductive structure of the second conductive structures;

a first level of dielectric material; and a second level of dielectric material located on the first level of dielectric material, wherein the conductive structure of the first conductive structures includes a first conductive contact formed in the first level of dielectric material, and a second conductive contact formed in the second level of dielectric material and contacting the first conductive contact.

2. The apparatus of claim 1, wherein the conductive line contacts the dielectric structure at an interface between the conductive line and the dielectric structure, wherein the interface is above the conductive structure of the first conductive structures and the conductive structure of the second conductive structures.

3. The apparatus of claim 1, wherein the first level of dielectric material and the second level of dielectric material include a same dielectric material.

4. An apparatus comprising:
levels of conductive materials interleaved with levels of dielectric materials;
memory cell strings including respective pillars extending through the levels of conductive materials and the levels of dielectric materials;
a dielectric structure formed in a slit, the slit extending through the levels of conductive materials and the levels of dielectric materials, the dielectric structure separating the levels of conductive materials and the levels of dielectric materials into a first portion and a second portion, the first portion including first memory cell strings of the memory cell strings, the second portion including second memory cell strings of the memory cell strings;
first conductive structures located over and electrically coupled to respective pillars of the first memory cell strings;
second conductive structures located over and electrically coupled to respective pillars of the second memory cell strings;
a conductive line contacting the dielectric structure, a conductive structure of the first conductive structures, and a conductive structure of the second conductive structures;
levels of first additional conductive materials interleaved with levels of second additional dielectric materials, the levels of first additional conductive materials and the levels of second additional dielectric materials located over the levels of conductive materials and the levels of dielectric materials, wherein,
each of the first conductive structures includes a channel region extending through the levels of first additional conductive materials and the levels of second additional dielectric materials and separated from the levels of first additional conductive materials and the levels of second additional dielectric materials by a dielectric material.

5. An apparatus comprising:
levels of conductive materials interleaved with levels of dielectric materials;
memory cell strings including respective pillars extending through the levels of conductive materials and the levels of dielectric materials;
a dielectric structure formed in a slit, the slit extending through the levels of conductive materials and the levels of dielectric materials, the dielectric structure separating the levels of conductive materials and the levels of dielectric materials into a first portion and a second portion, the first portion including first memory cell strings of the memory cell strings, the second portion including second memory cell strings of the memory cell strings;
first conductive structures located over and electrically coupled to respective pillars of the first memory cell strings;
second conductive structures located over and electrically coupled to respective pillars of the second memory cell strings;
a conductive line contacting the dielectric structure, a conductive structure of the first conductive structures, and a conductive structure of the second conductive structures;
a staircase structure formed from a portion of the levels of conductive materials in the first portion;
conductive contacts coupled to the levels of conductive materials, respectively, in the first portion at the staircase structure, the conductive contacts having lengths extending in a direction from a first level of the levels of conductive materials to a second level of the levels of conductive materials; and
additional conductive lines contacting the conductive contacts, respectively.

6. An apparatus comprising:
levels of conductive materials interleaved with levels of dielectric materials;
memory cell strings including respective pillars extending through the levels of conductive materials and the levels of dielectric materials;
first conductive contacts electrically coupled to the pillars, respectively;
a level of additional dielectric material located over the first conductive contacts;
second conductive contacts formed in respective locations in the additional dielectric material and coupled to the first conductive contacts, respectively;
a dielectric structure formed in a slit, the slit extending through the levels of conductive materials and the levels of dielectric materials, the dielectric structure separating the levels of conductive materials and the levels of dielectric materials into a first portion and a second portion, the first portion including first memory cell strings of the memory cell strings, the second portion including second memory cell strings of the memory cell strings,
the dielectric structure separating the level of additional dielectric material into a first dielectric portion and a second dielectric portion, the first dielectric portion including a first portion of the second conductive contacts, the second dielectric portion including a second portion of the second conductive contacts; and
a conductive region contacting the dielectric structure, a conductive contact of the second conductive contacts in the first dielectric portion, and a conductive contact of the second conductive contacts in the second dielectric portion.

7. The apparatus of claim 6, wherein the level of additional dielectric material and the levels of dielectric materials have different dielectric materials.

8. The apparatus of claim 7, wherein:
the level of additional dielectric material includes silicon nitride; and
the levels of dielectric materials include silicon dioxide.

9. The apparatus of claim 6, wherein each of the second conductive contacts has a width less than a width of each of the first conductive contacts.

10. The apparatus of claim 6, further comprising:
a staircase structure formed from a portion of the levels of conductive materials in the first portion;
additional conductive contacts coupled to the levels of conductive materials, respectively, in the first portion at the staircase structure, the additional conductive contacts having lengths extending in a direction from a first level of the levels of conductive materials to a second level of the levels of conductive materials; and
conductive lines contacting the additional conductive contacts, respectively.

11. The apparatus of claim 10, further comprising:
levels of first additional conductive materials interleaved with levels of second additional dielectric materials, the levels of first additional conductive materials and the levels of second additional dielectric materials located over the levels of conductive materials and the levels of dielectric materials, wherein, the additional conductive contacts extend through and are electrically separated from the levels of first additional conductive materials and the levels of second additional dielectric materials.

* * * * *